(12) United States Patent
Tsuda et al.

(10) Patent No.: US 12,207,462 B2
(45) Date of Patent: Jan. 21, 2025

(54) SEMICONDUCTOR DEVICE AND ELECTRONIC DEVICE

(71) Applicant: Semiconductor Energy Laboratory Co., Ltd., Atsugi (JP)

(72) Inventors: Kazuki Tsuda, Atsugi (JP); Hiromichi Godo, Isehara (JP); Satoru Ohshita, Atsugi (JP); Hitoshi Kunitake, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 427 days.

(21) Appl. No.: 17/776,342

(22) PCT Filed: Nov. 24, 2020

(86) PCT No.: PCT/IB2020/061059
§ 371 (c)(1),
(2) Date: May 12, 2022

(87) PCT Pub. No.: WO2021/111243
PCT Pub. Date: Jun. 10, 2021

(65) Prior Publication Data
US 2022/0399355 A1     Dec. 15, 2022

(30) Foreign Application Priority Data

Dec. 6, 2019  (JP) ................................. 2019-220945
Apr. 7, 2020  (JP) ................................. 2020-069023

(51) Int. Cl.
*H10B 41/35*  (2023.01)
*H10B 41/10*  (2023.01)
(Continued)

(52) U.S. Cl.
CPC ............. *H10B 41/35* (2023.02); *H10B 41/10* (2023.02); *H10B 41/27* (2023.02); *H10B 43/10* (2023.02); *H10B 43/27* (2023.02); *H10B 43/35* (2023.02)

(58) Field of Classification Search
None
See application file for complete search history.

(56) References Cited

U.S. PATENT DOCUMENTS 10,600,469 B2   3/2020  Kimura et al.
10,665,604 B2   5/2020  Kimura et al.
(Continued)

FOREIGN PATENT DOCUMENTS

CN      110832640 A       2/2020
JP      2018-207038 A    12/2018
(Continued)

OTHER PUBLICATIONS

International Search Report (Application No. PCT/IB2020/061059), dated Mar. 9, 2021.

(Continued)

*Primary Examiner* — Nicholas J Tobergte
(74) *Attorney, Agent, or Firm* — Eric J. Robinson; Robinson Intellectual Property Law Office, P.C.

(57) ABSTRACT

A novel semiconductor device is provided. A structure body extending in a first direction, a first conductor extending in a second direction, and a second conductor extending in the second direction are provided. In a first intersection portion where the structure body and the first conductor intersect with each other, a first insulator, a first semiconductor, a second insulator, a second semiconductor, a third insulator, a fourth insulator, and a fifth insulator are provided concentrically around a third conductor. In a second intersection portion where the structure body and the second conductor (Continued)

intersect with each other, the first insulator, the first semiconductor, the second insulator, a fourth conductor, the second semiconductor, and the third insulator are provided concentrically around the third conductor.

14 Claims, 50 Drawing Sheets

(51) Int. Cl.
*H10B 41/27* (2023.01)
*H10B 43/10* (2023.01)
*H10B 43/27* (2023.01)
*H10B 43/35* (2023.01)

(56) References Cited

U.S. PATENT DOCUMENTS

| | | | |
|---|---|---|---|
| 10,839,883 B2 | 11/2020 | Kimura et al. | |
| 10,886,292 B2 | 1/2021 | Kimura et al. | |
| 11,329,065 B2 | 5/2022 | Kimura et al. | |
| 11,335,812 B2* | 5/2022 | Yamazaki | H01L 29/78642 |
| 2004/0094794 A1* | 5/2004 | Wu | H10B 41/35 |
| | | | 257/E27.103 |
| 2008/0128778 A1* | 6/2008 | Yang | H10B 41/35 |
| | | | 438/258 |
| 2015/0249092 A1* | 9/2015 | Sakui | H01L 29/7889 |
| | | | 438/268 |
| 2016/0225754 A1* | 8/2016 | Jang | G11C 16/0483 |
| 2016/0351576 A1 | 12/2016 | Yamazaki et al. | |
| 2019/0027493 A1 | 1/2019 | Kimura et al. | |
| 2020/0203339 A1 | 6/2020 | Yamazaki et al. | |
| 2021/0074346 A1 | 3/2021 | Kimura et al. | |
| 2021/0242220 A1 | 8/2021 | Yamazaki et al. | |
| 2024/0105855 A1* | 3/2024 | Yamazaki | H01L 29/7869 |
| 2024/0298448 A1* | 9/2024 | Kimura | H10B 41/27 |

FOREIGN PATENT DOCUMENTS

| | | |
|---|---|---|
| JP | 2018-207039 A | 12/2018 |
| JP | 2019-024087 A | 2/2019 |
| KR | 2020-0019149 A | 2/2020 |
| WO | WO-2019/003060 | 1/2019 |

OTHER PUBLICATIONS

Written Opinion (Application No. PCT/IB2020/061059), dated Mar. 9, 2021.

* cited by examiner

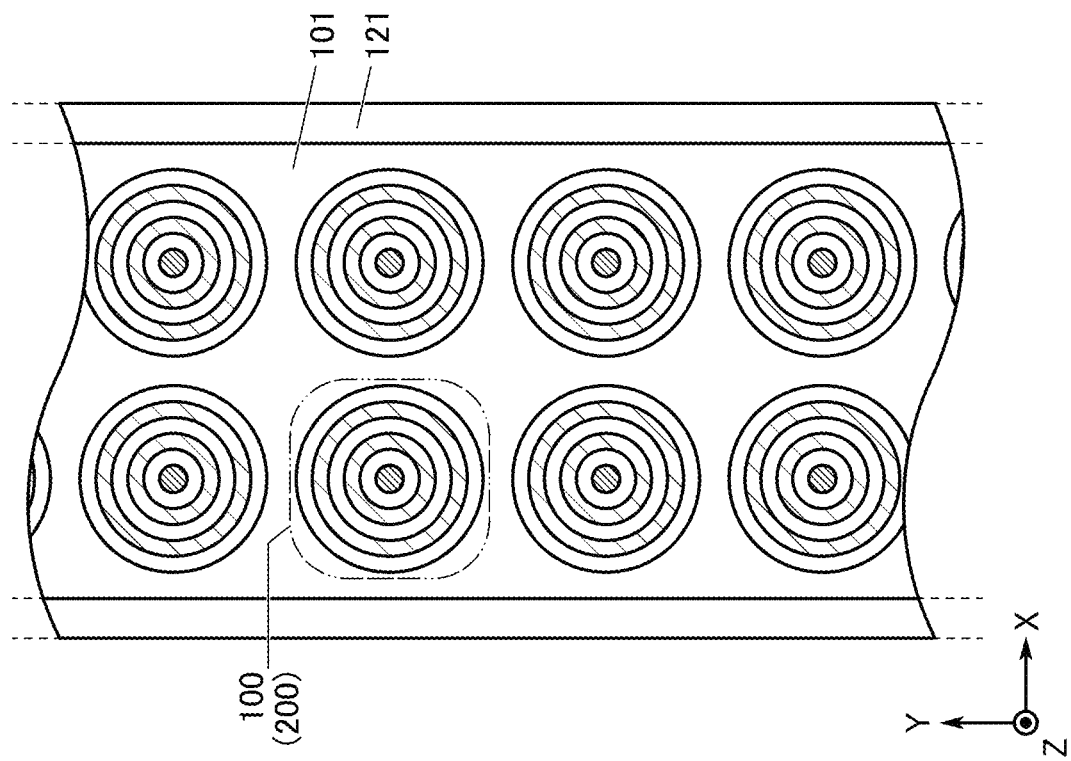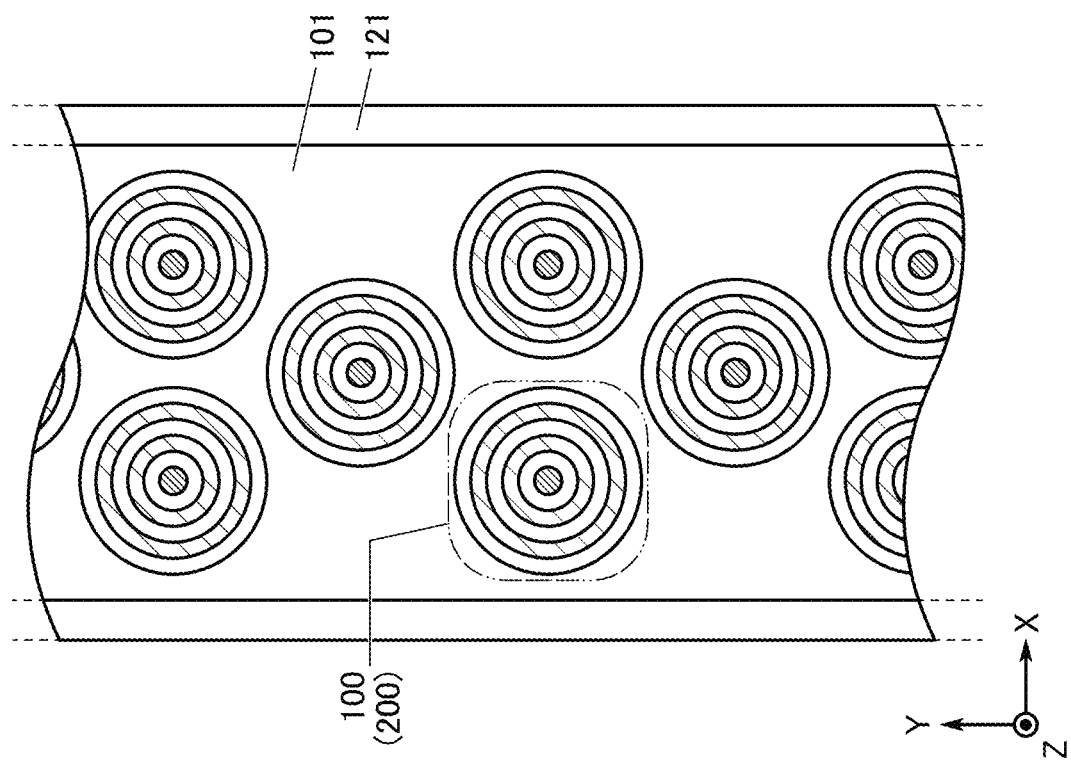

FIG. 14A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 14B
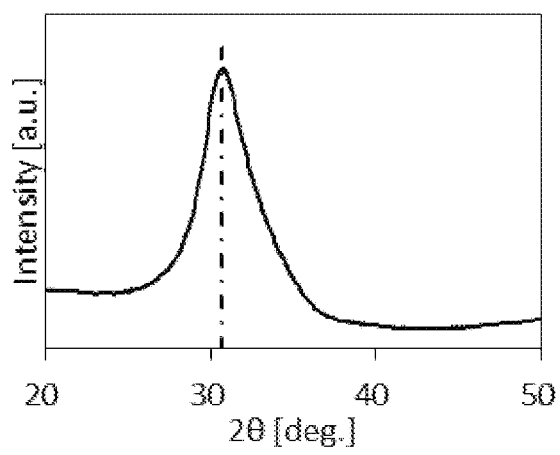
FIG. 14C
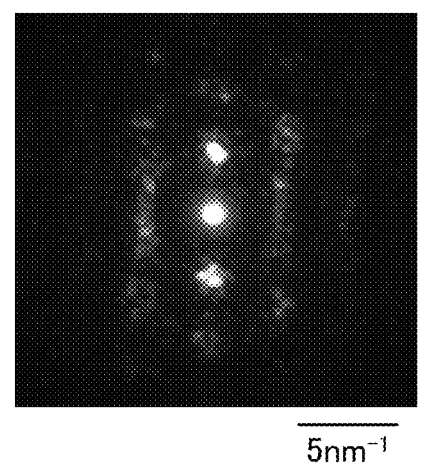

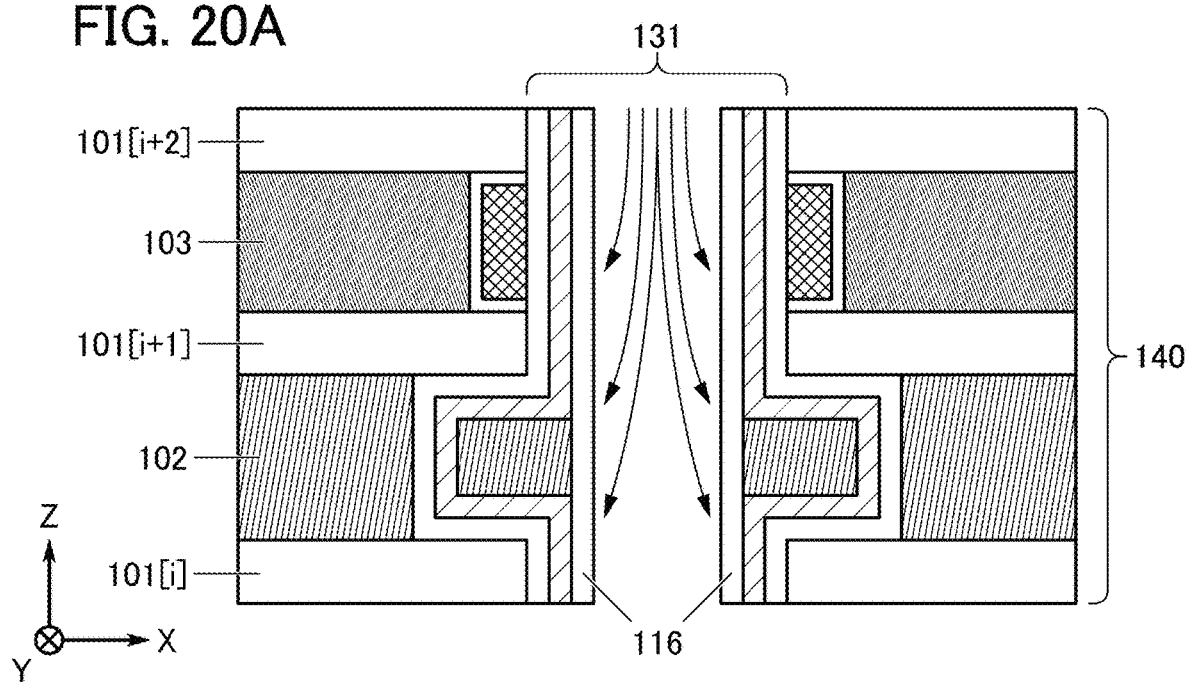
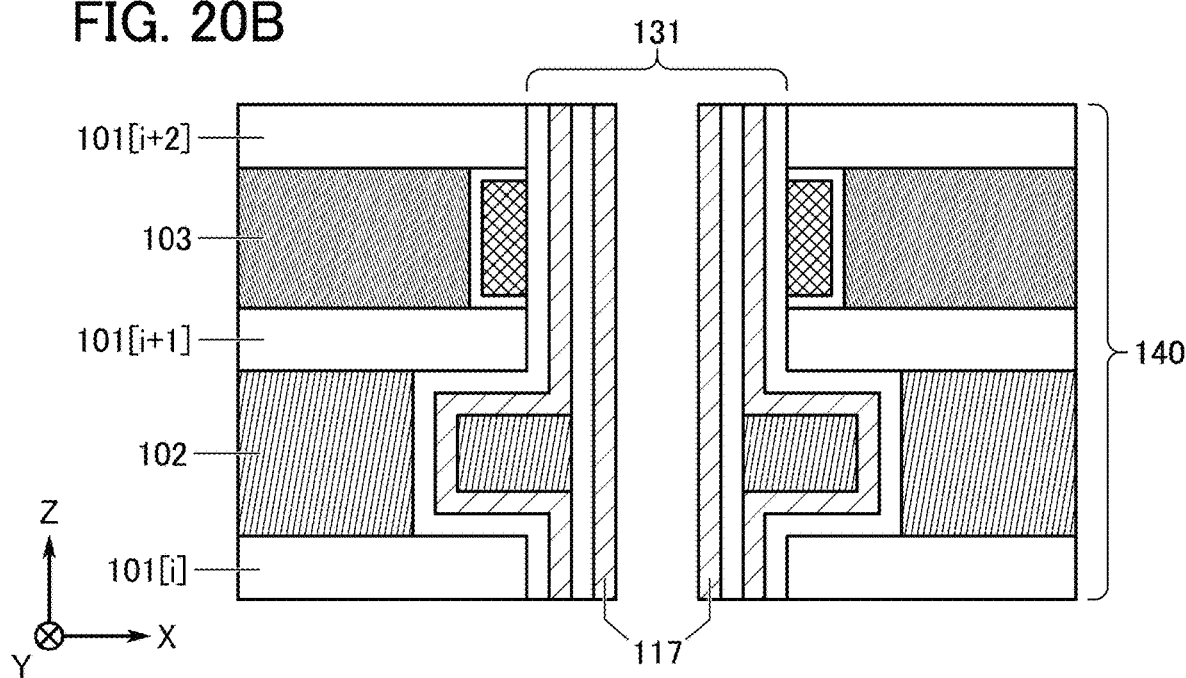

1150A

1150A

400: Semiconductor device (memory device)
1100: Arithmetic processing device (CPU)

1150B

- 400b
- 400a
- 1100

1150B

- 400b
- 400a
- 1100

400a: Semiconductor device (memory device)
400b: Semiconductor device (memory device)
1100: Arithmetic processing device (CPU)

400a: Semiconductor device (memory device)
400b: Semiconductor device (memory device)
1100: Arithmetic processing device (CPU)

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and an inspecting method thereof.

BACKGROUND ART

In recent years, electronic components such as central processing units (CPUs), graphics processing units (GPUs), memory devices, and sensors have been used in various electronic devices such as personal computers, smartphones, and digital cameras; the electronic components have been improved in various aspects such as miniaturization and low power consumption.

Memory devices with large memory capacity are especially required because the amount of data handled in the aforementioned electronic devices and the like has increased. As an example of a way to increase the memory capacity, Patent Document 1 and Patent Document 2 disclose a three-dimensional NAND memory element using a metal oxide in a channel formation region.

REFERENCES

Patent Documents

[Patent Document 1] PCT International Publication No. 2019/3060

[Patent Document 2] Japanese Published Patent Application No. 2018-207038

SUMMARY OF THE INVENTION

Problems to be Solved by the Invention

An object of one embodiment of the present invention is to provide a highly reliable memory device. Another object of one embodiment of the present invention is to provide a memory device having large memory capacity. Another object of one embodiment of the present invention is to provide a novel memory device. Another object of one embodiment of the present invention is to provide a highly reliable semiconductor device. Another object of one embodiment of the present invention is to provide a semiconductor device having large memory capacity. Another object of one embodiment of the present invention is to provide a novel semiconductor device.

Note that the objects of one embodiment of the present invention are not limited to the objects listed above. The objects listed above do not preclude the existence of other objects. The other objects are objects that are not described in this section and will be described below. The objects that are not described in this section can be derived from the description of the specification, the drawings, and the like and can be extracted as appropriate from the description by those skilled in the art. One embodiment of the present invention achieves at least one of the objects listed above and the other objects. One embodiment of the present invention does not necessarily achieve all the objects listed above and the other objects.

Means for Solving the Problems

One embodiment of the present invention is a semiconductor device including a structure body extending in a first direction, a first conductor extending in a second direction, and a second conductor extending in the second direction. The structure body includes a third conductor extending in the first direction, a first insulator adjacent to the third conductor, a first semiconductor adjacent to the first insulator, and a second insulator adjacent to the first semiconductor. In a first intersection portion where the structure body and the first conductor intersect with each other, the structure body includes a second semiconductor adjacent to the second insulator, a third insulator adjacent to the second semiconductor, a functional body adjacent to the third insulator, and a fourth insulator adjacent to the functional body. In a second intersection portion where the structure body and the second conductor intersect with each other, the structure body includes a fourth conductor adjacent to the second insulator, the second semiconductor adjacent to the fourth conductor, and the third insulator adjacent to the second semiconductor. The first insulator, the first semiconductor, the second insulator, the second semiconductor, the third insulator, the functional body, and the fourth insulator in the first intersection portion are provided concentrically around the third conductor when seen from the first direction. The first insulator, the first semiconductor, the second insulator, the fourth conductor, the second semiconductor, and the third insulator in the second intersection portion are provided concentrically around the third conductor when seen from the first direction.

The first direction is orthogonal to the second direction. The first intersection portion functions as a first transistor, and the second intersection portion functions as a second transistor and a capacitor. At least one of the first semiconductor and the second semiconductor may be silicon.

As the functional body, an insulator or a semiconductor can be used. With the use of silicon nitride (an insulator containing nitrogen and silicon) as the functional body, for example, the first transistor can be an MONOS transistor. For another example, with the use of silicon nitride (an insulator containing nitrogen and silicon) as the functional body, the first transistor can be an FG transistor.

Charge injection into the functional body increases the threshold voltage of the first transistor, so that the first transistor can be a normally-off transistor. Thus, the first transistor can be a normally-off transistor, and the second transistor can be a normally-on transistor.

At least one of the first semiconductor and the second semiconductor may be an oxide semiconductor. The oxide semiconductor preferably contains at least one of indium and zinc.

Another embodiment of the present invention is an electronic device including the above semiconductor device and at least one of an operation switch, a battery, and a display portion.

Effect of the Invention

According to one embodiment of the present invention, a highly reliable memory device can be provided. Alternatively, a memory device having large memory capacity can be provided. Alternatively, a novel memory device can be provided. Alternatively, a highly reliable semiconductor device can be provided. Alternatively, a semiconductor device having large memory capacity can be provided. Alternatively, a novel semiconductor device can be provided.

Note that the effects of one embodiment of the present invention are not limited to the effects listed above. The effects listed above do not preclude the existence of other effects. The other effects are effects that are not described in this section and will be described below. The effects that are not described in this section can be derived from the description of the specification, the drawings, and the like and can be extracted as appropriate from the description by those skilled in the art. One embodiment of the present invention has at least one of the effects listed above and the other effects. Accordingly, one embodiment of the present invention does not have the effects listed above in some cases.

BRIEF DESCRIPTION OF THE DRAWINGS

FIG. 11A and FIG. 11B are top views of a memory string.

FIG. 14A is a diagram showing the classification of crystal structures. FIG. 14B is a graph showing an XRD spectrum of a CAAC-IGZO film. FIG. 14C is an image showing a nanobeam electron diffraction pattern of a CAAC-IGZO film.

FIG. 20A and FIG. 20B are cross-sectional views illustrating a method for manufacturing a memory cell.

MODE FOR CARRYING OUT THE INVENTION

Figure 1A:
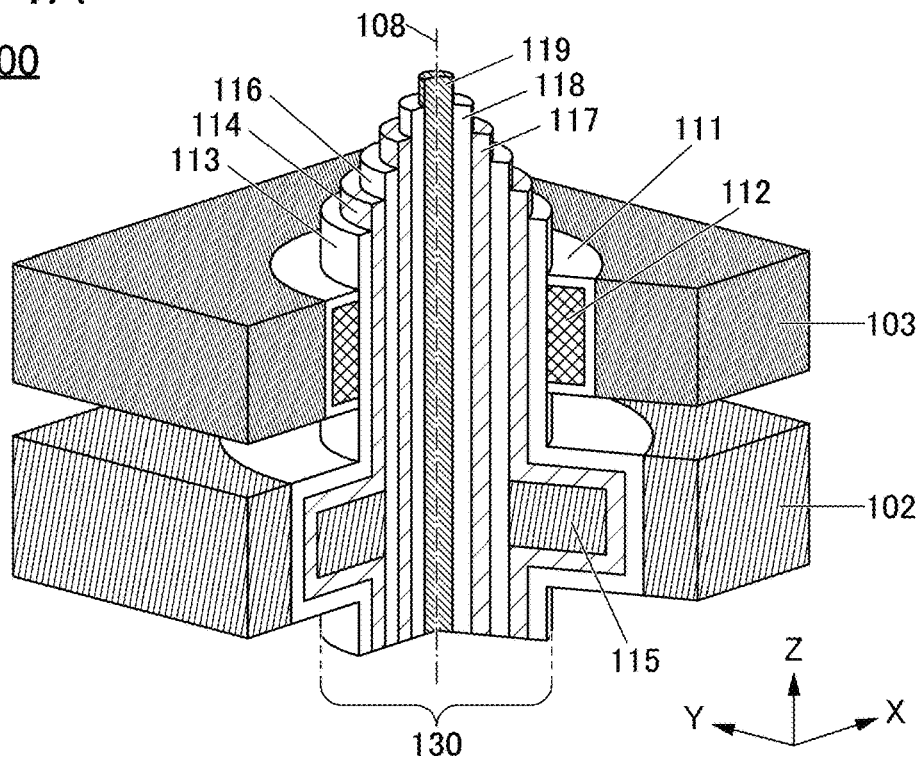
FIG. 1A is a perspective view of a memory cell.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves may be semiconductor devices or may each include a semiconductor device.

When this specification and the like state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be in an on state or an off state. That is, a switch has a function of being in a conduction state (on state) or a non-conduction state (off state) to control whether or not current flows.

For example, in the case where X and Y are functionally connected, one or more circuits that enable functional connection between X and Y (e.g., a logic circuit (an inverter, a NAND circuit, a NOR circuit, or the like), a signal converter circuit (a digital-to-analog converter circuit, an analog-to-digital converter circuit, a gamma correction circuit, or the like), a potential level converter circuit (a power supply circuit (e.g., a step-up circuit or a step-down circuit), a level shifter circuit for changing the potential level of a signal, or the like), a voltage source, a current source, a switching circuit, an amplifier circuit (a circuit that can increase the signal amplitude, the amount of current, or the like, an operational amplifier, a differential amplifier circuit, a source follower circuit, a buffer circuit, or the like), a signal generation circuit, a memory circuit, or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; conversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1 \times 10^9 \Omega$.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be greater than or equal to 0.05 fF and less than or equal to 10 pF, for example. For another example, the electrostatic capacitance value may be greater than or equal to 1 pF and less than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used to describe the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, and the like depending on the circuit structure, the device structure, and the like. Furthermore, a terminal, a wiring, and the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" (also referred to as "H potential" or "H") and "low-level potential" (also referred to as "L potential" or "L") do not represent a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which positive carriers move, and the amount of current is described with a positive value. In other words, the direction in which negative carriers move is opposite to the direction of current, and the amount of current is described with a negative value. Thus, in the case where the polarity of current (or the direction of current) is not specified in this specification and the like, the description "current flows from element A to element B" can be rephrased as "current flows from element B to element A", for example. For another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. For another example, a "first" component in one embodiment in this specification and the like can be omitted in other embodiments or the scope of claims.

The term "over" or "under" does not necessarily mean that a component is placed directly on or directly under and directly in contact with another component. For example, the expression "electrode B over insulating layer A" does not necessarily mean that the electrode B is formed on and in direct contact with the insulating layer A, and does not exclude the case where another component is provided between the insulating layer A and the electrode B.

The positional relationship between components changes as appropriate in accordance with the direction in which each component is described. Thus, the positional relationship is not limited to that described with a term in this specification and the like and can be described with another term as appropriate depending on the situation. For example, in this specification and the like, terms for describing arrangement, such as "over" and "under", are sometimes used for convenience to describe the positional relationship between components with reference to drawings. Accordingly, the expression "an insulator positioned over (on) a top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°.

Similarly, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the term "film", "layer", or the like is not used and can be interchanged with another term depending on the case or situation. For example, the term "conductive layer" or "conductive film" can be changed into the term "conductor" in some cases. For another example, the term "insulating layer" or "insulating film" can be changed into the term "insulator" in some cases.

In this specification and the like, the term "electrode", "wiring", "terminal", or the like does not limit the function of a component. For example, an "electrode" is sometimes used as part of a "wiring", and vice versa. Furthermore, the term "electrode" or "wiring" can also mean the case where a plurality of "electrodes" or "wirings" are formed in an integrated manner, for example. For another example, a "terminal" is sometimes used as part of a "wiring" or an "electrode", and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or situation. For example, the term "wiring" can be changed into the term "signal line" in some cases. For another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or situation. Conversely, the term "signal" or the like can be changed into the term "potential" in some cases.

In this specification and the like, an impurity in a semiconductor refers to, for example, elements other than the main components of a semiconductor layer. For instance, an element with a concentration of lower than 0.1 atomic % is an impurity. When an impurity is contained, the density of defect states in the semiconductor may be increased, carrier mobility may be decreased, or the crystallinity may be decreased, for example. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components; specific examples are hydrogen (included also in water), lithium, sodium, silicon, boron, phosphorus, carbon, and nitrogen. Specifically, when the semiconductor is a silicon layer, examples of impurities that change the characteristics of the semiconductor include oxygen, Group 1 elements except hydrogen, Group 2 elements, Group 13 elements, and Group 15 elements.

In this specification and the like, a switch has a function of controlling whether current flows or not by being in a conduction state (on state) or a non-conduction state (off state). Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In addition, in this specification and the like, "on-state current" sometimes refers to current that flows between a source and a drain when a transistor is in an on state. Furthermore, "off-state current" sometimes refers to current that flows between a source and a drain when a transistor is in an off state.

In this specification and the like, "parallel" indicates a state where the angle formed between two straight lines is greater than or equal to −10° and less than or equal to 10°. Thus, the case where the angle is greater than or equal to −5° and less than or equal to 5° is also included. The term "approximately parallel" or "substantially parallel" indicates a state where the angle formed between two straight lines is greater than or equal to −30° and less than or equal to 30°. The term "perpendicular" indicates a state where the angle formed between two straight lines is greater than or equal to 80° and less than or equal to 100°. Thus, the case where the angle is greater than or equal to 85° and less than or equal to 95° is also included. The term "approximately perpendicular" or "substantially perpendicular" indicates a state where the angle formed between two straight lines is greater than or equal to 60° and less than or equal to 120°.

In this specification and the like, the terms "identical", "the same", "equal", "uniform", and the like used in describing calculation values and measurement values or in describing objects, methods, events, and the like that can be converted into calculation values or measurement values allow for a margin of error of ±20% unless otherwise specified.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, in the case where a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that the modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. Moreover, some components may be omitted in a perspective view, a top view, and the like for easy understanding of the drawings.

In the drawings of this specification, the size, the layer thickness, or the region is exaggerated for clarity in some cases. Therefore, they are not limited to the illustrated size, aspect ratio, and the like. Note that the drawings schematically show ideal examples, and embodiments of the present invention are not limited to shapes or values shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification sign such as "_1", "[n]", or "[m,n]" are sometimes added to the reference numerals. For example, one of two wirings GL is referred to as a wiring GL[1] and the other is referred to as a wiring GL[2] in some cases.

Embodiment 1

In this embodiment, a structure example and a manufacturing method example of a memory cell 100 functioning as a memory device of one embodiment of the present invention will be described with reference to drawings.

<Structure Example of Memory Device>

FIG. 1A is a perspective view of a memory cell 100 of one embodiment of the present invention. The memory cell 100 is a memory device having a three-dimensional stacked-layer structure. In FIG. 1A, part of the memory cell 100 is omitted to illustrate the internal structure of the memory cell 100. Note that arrows indicating the X direction, the Y direction, and the Z direction are sometimes illustrated in drawings. The X direction, the Y direction, and the Z direction are directions orthogonal to each other. In this specification and the like, one of the X direction, the Y direction, and the Z direction may be referred to as a "first direction". Another one of the directions may be referred to as a "second direction". The remaining one of the directions may be referred to as a "third direction". Note that in this embodiment and the like, the Z direction is a direction in which a structure body 130 to be described later extends.

Figure 1B:
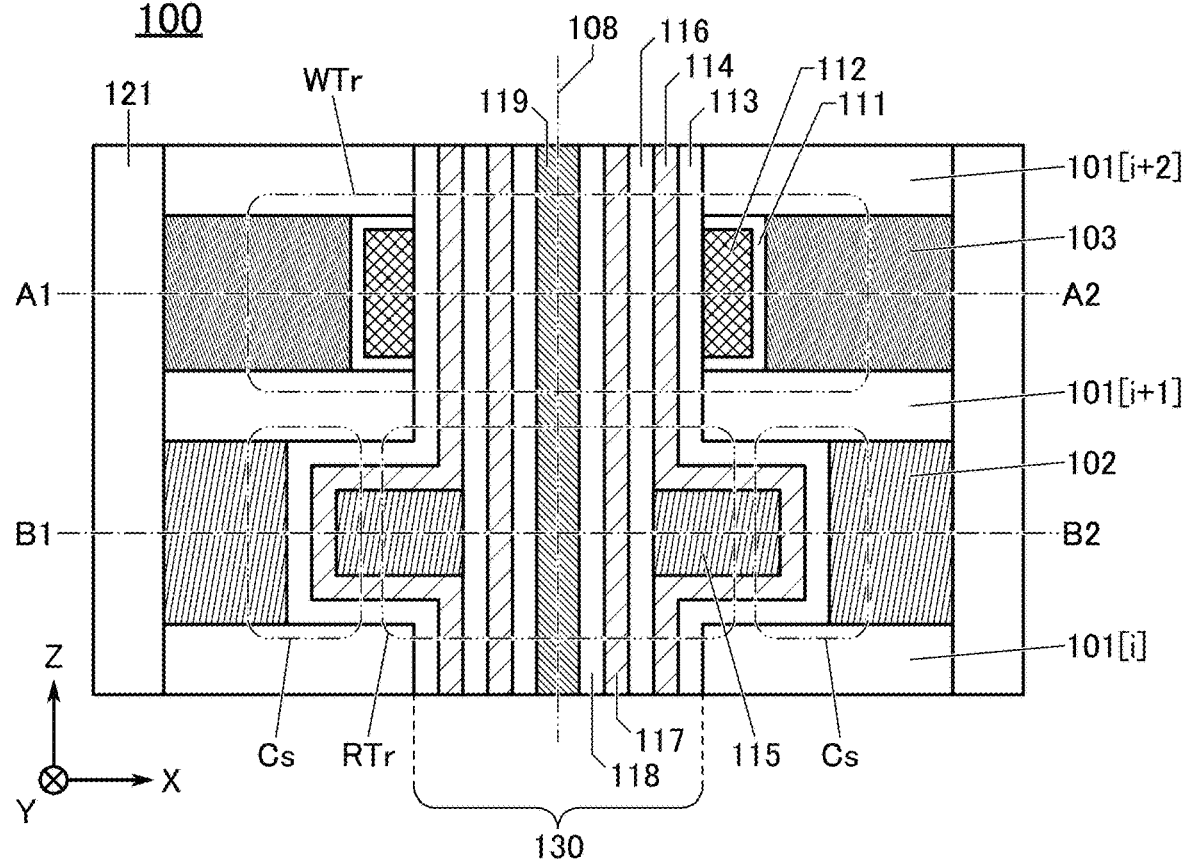
FIG. 1B is a cross-sectional view of the memory cell.
Figure 2A:
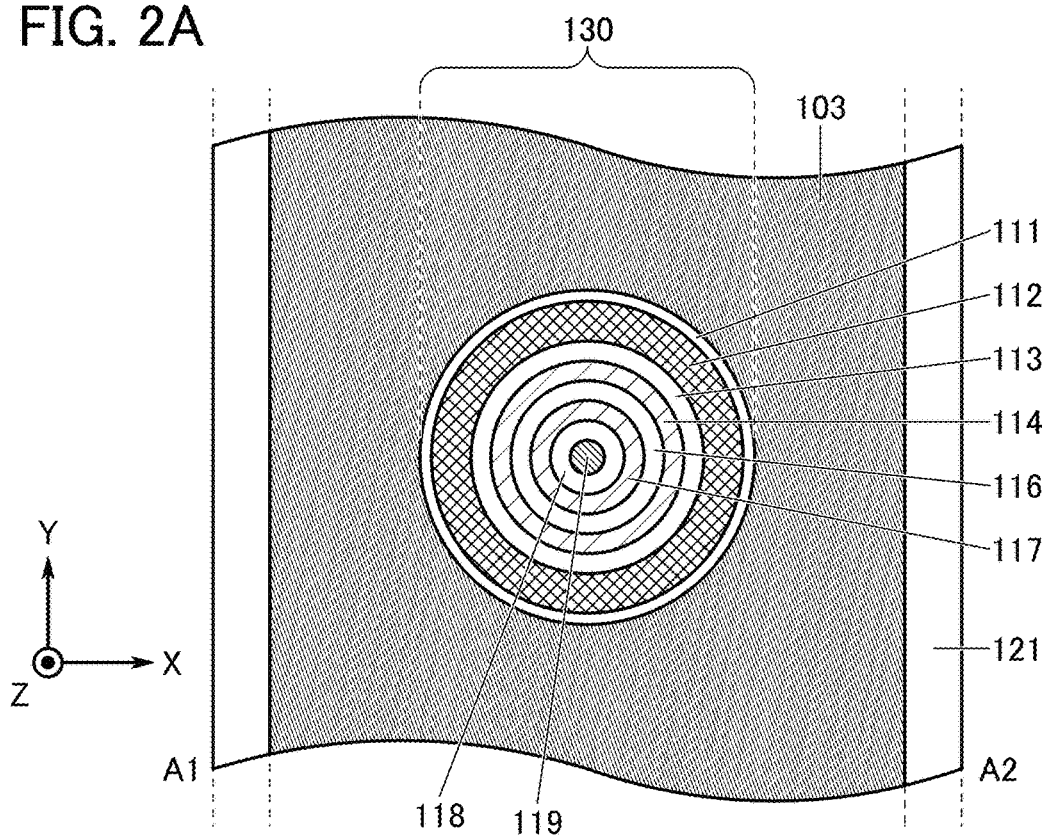
FIG. 2A and FIG. 2B are cross-sectional views of a memory cell.
Figure 2B:
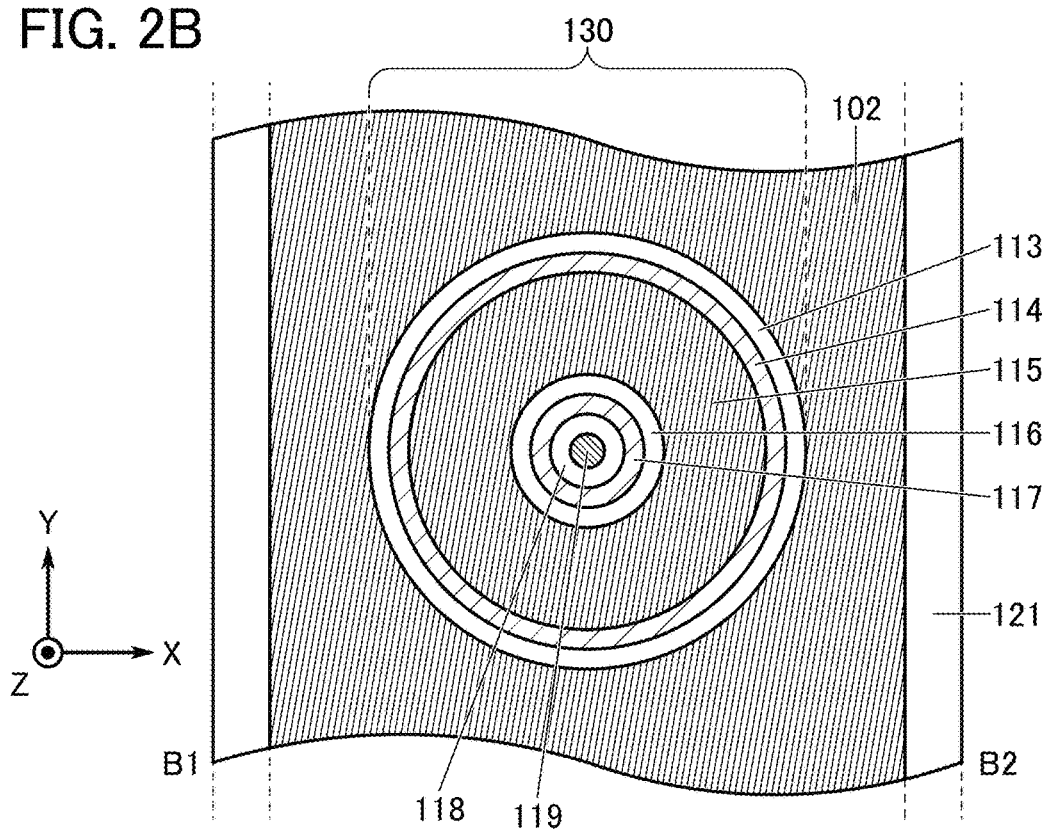

FIG. 1B is a cross-sectional view illustrating part of the memory cell 100 illustrated in FIG. 1A. FIG. 1B is the cross-sectional view of part of the memory cell 100 seen from the Y direction. FIG. 1B is the cross-sectional view along the XZ plane that passes through a central axis 108. FIG. 2A is a cross-sectional view in which a portion A1-A2 represented by a dashed-dotted line in FIG. 1B is seen from the Z direction. FIG. 2B is a cross-sectional view in which a portion B1-B2 represented by a dashed-dotted line in FIG. 1B is seen from the Z direction.

The memory cell 100 includes a plurality of insulators 101 over a substrate (not illustrated). The plurality of insulators 101 are sequentially stacked from the substrate side. In this embodiment and the like, the i-th (i is an integer of 1 or more) insulator 101 is denoted as an insulator 101[i]. FIG. 1B illustrates an insulator 101[i+1] provided over the insulator 101[i] and an insulator 101[i+2] provided over the insulator 101[i+1]. A conductor 102 is provided between the insulator 101[i] and the insulator 101[i+1], and a conductor 103 is provided between the insulator 101[i+1] and the insulator 101[i+2]. Note that the insulators 101, the conductor 102, and the conductor 103 extend in the Y direction. The memory cell 100 includes an insulator 121 that covers side surfaces of the insulators 101, the conductor 102, and the conductor 103.

Figure 3:
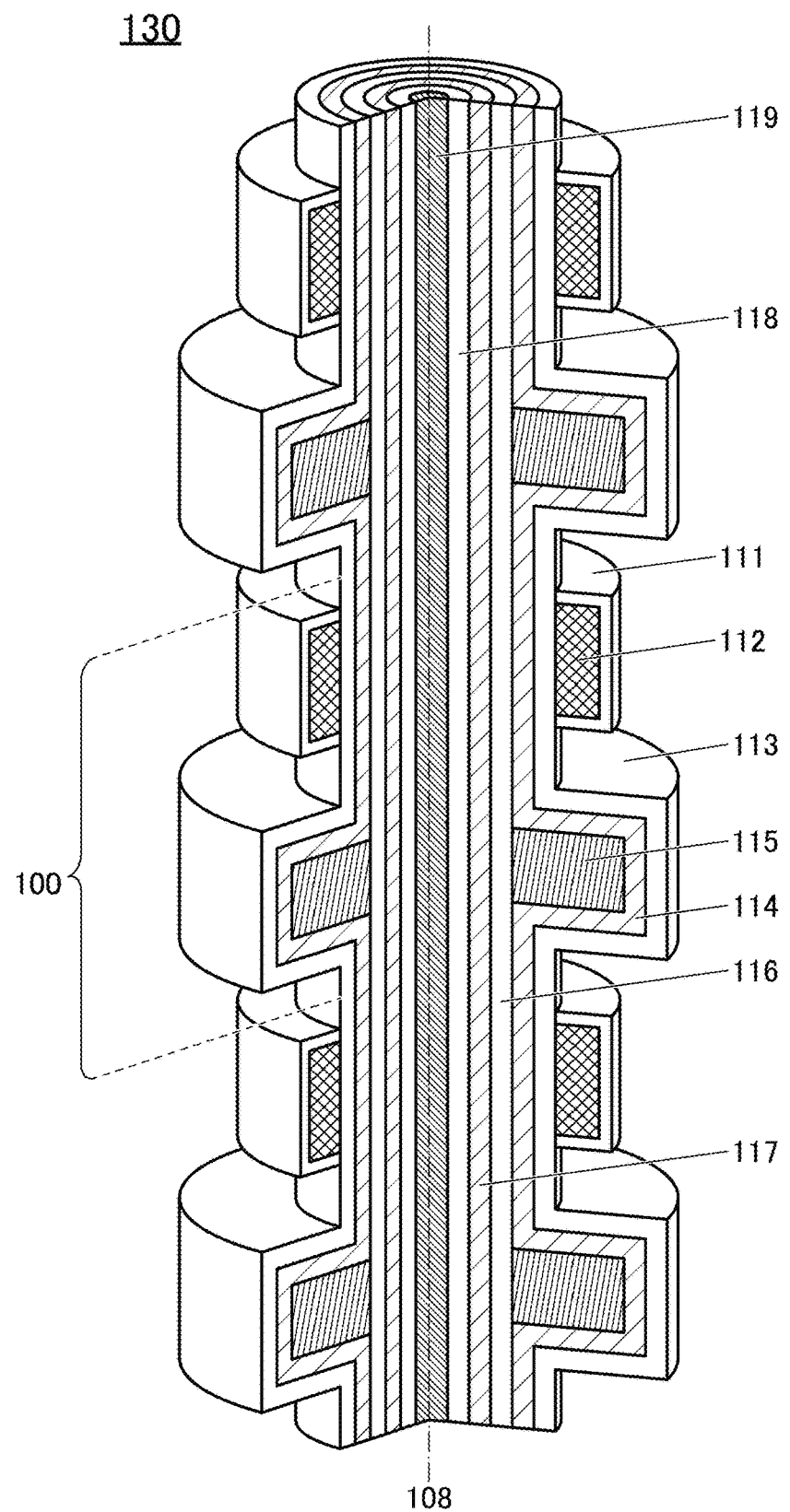
FIG. 3 is a perspective view of a structure body.

The memory cell 100 includes the structure body 130. The structure body 130 extends in the Z direction along the central axis 108. FIG. 3 is a perspective view of the structure body 130. The structure body 130 has a columnar shape. In FIG. 3, part of the structure body 130 is omitted to illustrate the internal structure of the structure body 130. Part of the structure body 130 functions as part of the memory cell 100.

As illustrated in FIG. 1 and FIG. 3, the structure body 130 has unevenness on a side surface extending in the Z direction.

Although this embodiment describes the case where the peripheral shape of the structure body 130 is circular when the structure body 130 is seen from the Z direction, the peripheral shape of the structure body 130 is not necessarily circular and may be a polygon such as a triangle or a quadrilateral, for example. Moreover, the peripheral shape of the structure body 130 may consist of curves or a combination of curves and straight lines.

The structure body 130 includes a region intersecting with the conductor 102 (also referred to as an "intersection portion R") and a region intersecting with the conductor 103 (also referred to as an "intersection portion W"). The structure body 130 includes an insulator 111, a functional body 112, an insulator 113, a semiconductor 114, a conductor 115, an insulator 116, a semiconductor 117, an insulator 118, and a conductor 119.

Specifically, the conductor 119 extends in the Z direction along the central axis 108, and the insulator 118 is provided adjacent to the conductor 119. The semiconductor 117 is provided adjacent to the insulator 118. The insulator 116 is provided adjacent to the semiconductor 117.

In the intersection portion W of the structure body 130, the semiconductor 114 is provided adjacent to the insulator 116, the insulator 113 is provided adjacent to the semiconductor 114, the functional body 112 is provided adjacent to the insulator 113, and the insulator 111 is provided adjacent to the functional body 112. FIG. 2A is a cross-sectional view in the direction perpendicular to the Z direction in the intersection portion W. In the intersection portion W, the insulator 111, the functional body 112, the insulator 113, the semiconductor 114, the insulator 116, the semiconductor 117, and the insulator 118 are provided concentrically around the conductor 119.

In the intersection portion R of the structure body 130, the conductor 115 is provided adjacent to the insulator 116, the semiconductor 114 is provided adjacent to the conductor 115, and the insulator 113 is provided adjacent to the semiconductor 114. FIG. 2B is a cross-sectional view in the direction perpendicular to the Z direction in the intersection portion R. In the intersection portion R, the insulator 113, the semiconductor 114, the conductor 115, the insulator 116, the semiconductor 117, and the insulator 118 are provided concentrically around the conductor 119.

In the intersection portion W, the insulator 111, the functional body 112, the insulator 113, the semiconductor 114, and the conductor 103 function as a transistor WTr. Thus, the transistor WTr can be regarded as being formed in the intersection portion W.

In the intersection portion W, the conductor 103 functions as a gate electrode of the transistor WTr. Thus, the insulator 111, the functional body 112, and the insulator 113 function as a gate insulator of the transistor WTr. The semiconductor 114 functions as a semiconductor where a channel of the transistor WTr is formed.

In the intersection portion W, the conductor 119 sometimes functions as a back gate electrode of the transistor WTr. Thus, the insulator 116, the semiconductor 117, and the insulator 118 sometimes function as a back gate insulator of the transistor WTr. FIG. 2A is also a cross-sectional view of the transistor WTr seen from the Z direction.

In the intersection portion R, the conductor 119, the insulator 118, the semiconductor 117, the insulator 116, and the conductor 115 function as a transistor RTr. The conductor 115, the semiconductor 114, the insulator 113, and the conductor 102 function as a capacitor Cs. Thus, the transistor RTr and the capacitor Cs can be regarded as being formed in the intersection portion R.

In the intersection portion R, the conductor 115 functions as a gate electrode of the transistor RTr. Thus, the insulator 116 functions as a gate insulator. The semiconductor 117 functions as a semiconductor where a channel of the transistor RTr is formed. The conductor 119 sometimes functions as a back gate electrode of the transistor RTr. Thus, the insulator 118 sometimes functions as a back gate insulator of the transistor RTr. FIG. 2B is also a cross-sectional view of the transistor RTr seen from the Z direction.

The functional body 112 included in the transistor WTr can function as a charge accumulation layer. The threshold voltage of the transistor WTr can be controlled by accumulating charge in the functional body 112. For example, the transistor WTr can be a normally-off transistor when the threshold voltage of the transistor WTr is increased.

Charge can be injected into the functional body 112 from the conductor 103 through the insulator 111. In that case, the insulator 111 functions as an injection layer and the insulator 113 functions as a blocking layer. Charge can also be injected into the functional body 112 from the semiconductor 114 through the insulator 113. In that case, the insulator 113 functions as an injection layer and the insulator 111 functions as a blocking layer. The thickness of the injection layer when seen from the direction perpendicular to the Z direction is preferably smaller than that of the blocking layer.

When the insulator 111, the functional body 112, and the insulator 113 are an oxide, a nitride, and an oxide, respectively, the transistor WTr can be called an MONOS (Metal Oxide Nitride Oxide Semiconductor) transistor.

When n-type silicon or p-type silicon is used for the gate electrode of the MONOS transistor, the transistor can be called an SONOS (Silicon Oxide Nitride Oxide Semiconductor) transistor.

Similarly, when tantalum nitride is used for the gate electrode and aluminum oxide is used for the blocking layer, the transistor can be called a TANOS (Tantalum nitride Aluminium oxide Nitride Oxide Semiconductor) transistor.

Moreover, when tantalum nitride is used for the gate electrode and hafnium oxide is used for the blocking layer, the transistor can be called a THNOS (Tantalum nitride Hafnium oxide Nitride Oxide Semiconductor) transistor.

A material with a narrower band gap than the insulator 111 and the insulator 113 is preferably used for the functional body 112 functioning as the charge accumulation layer. For example, silicon oxide is used for the insulator 111 and the insulator 113 and an insulator such as silicon nitride is used for the functional body 112. In the case where silicon nitride is used for the functional body 112, silicon-rich silicon nitride is preferably used. For example, in the case where silicon nitride is used for the insulator 111 and the insulator 113, silicon nitride with a higher silicon content than silicon nitride used for the insulator 111 and the insulator 113 is used for the functional body 112.

The functional body 112 functioning as the charge accumulation layer may be a semiconductor. For example, a semiconductor such as silicon may be used for the functional body 112. The transistor WTr in which a semiconductor is used for the functional body 112 can be called an FG (Floating Gate) transistor.

The insulator 111, the functional body 112, and the insulator 113 may each be a stack of a plurality of layers. For example, the insulator functioning as the blocking layer may be a stack of silicon oxide and aluminum oxide.

Figure 4A:
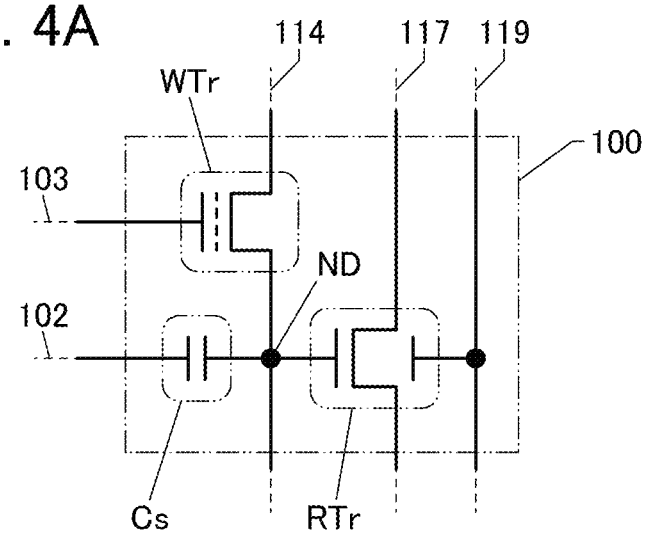
FIG. 4A to FIG. 4C are equivalent circuit diagrams of a memory cell.

FIG. 4A is an equivalent circuit diagram of the memory cell 100. In FIG. 4A, one of a source and a drain of the transistor WTr is electrically connected to the semiconductor 114, and the other of the source and the drain is electrically connected to the gate of the transistor RTr. The gate of the transistor WTr is electrically connected to the conductor 103. The transistor WTr includes the charge accumulation layer between the gate and a semiconductor layer.

Part of the semiconductor 114 functions as a channel formation region of the transistor WTr. Another part of the semiconductor 114 functions as the source or the drain of the transistor WTr. The semiconductor 114 can also function as an electrode or a wiring. Part of the conductor 103 functions as the gate of the transistor WTr.

The transistor RTr illustrated in FIG. 4A is a transistor having a back gate. In this embodiment, part of the conductor 119 functions as the back gate of the transistor RTr. Another part of the semiconductor 114 and the conductor 115 function as the gate of the transistor RTr. Part of the conductor 102 functions as the other electrode of the capacitor Cs. Part of the semiconductor 117 functions as one of a source and a drain of the transistor RTr. Another part of the semiconductor 117 functions as the other of the source and the drain of the transistor RTr. The semiconductor 117 can also function as an electrode or a wiring.

Figure 4B:
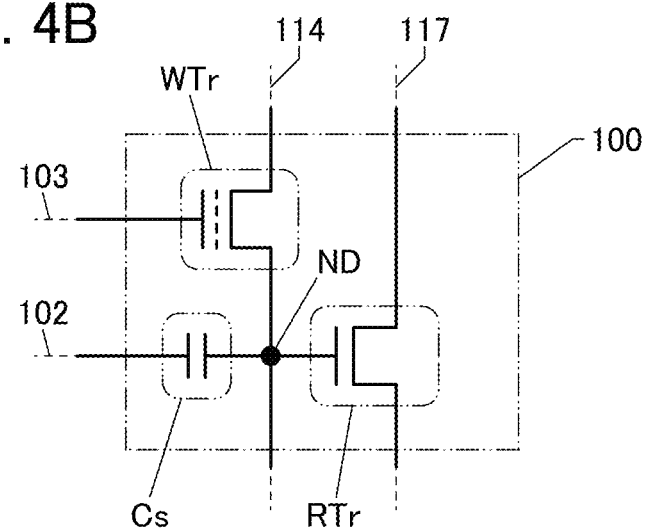
Figure 4C:
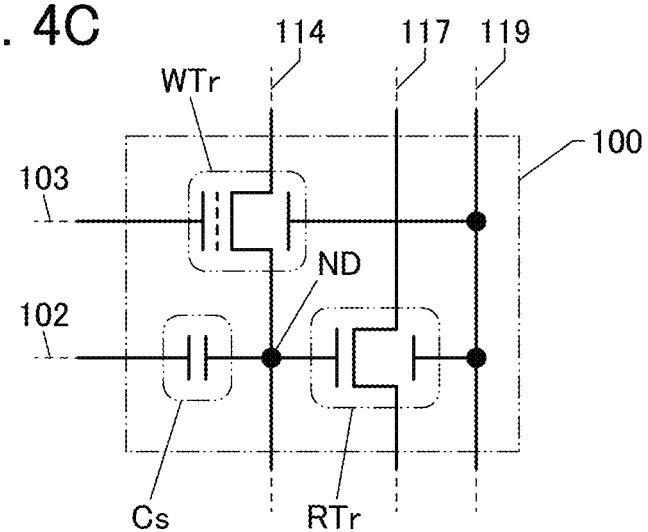
Figure 5A:
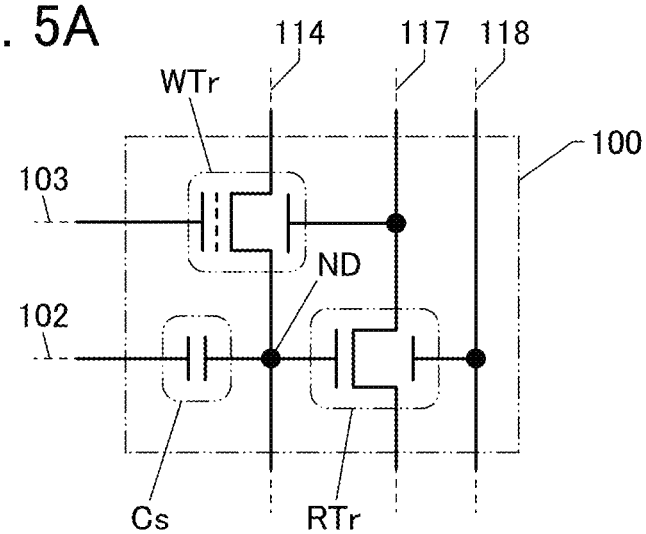
FIG. 5A and FIG. 5B are equivalent circuit diagrams of a memory cell.
Figure 5B:
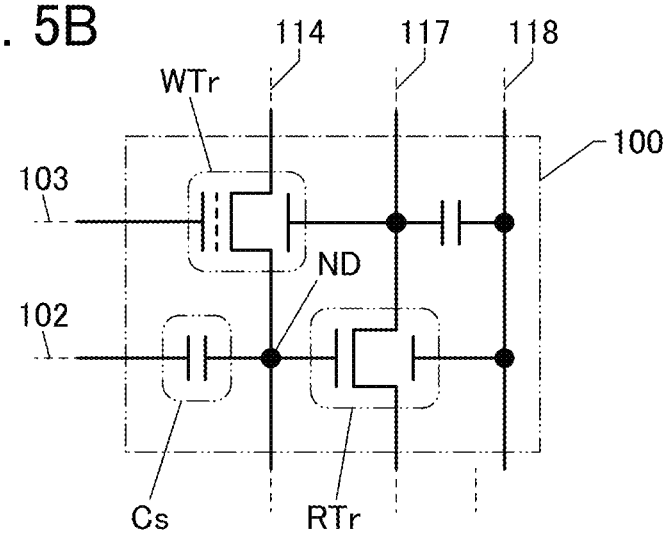

As illustrated in FIG. 4B, the transistor RTr does not necessarily have the back gate. FIG. 4B corresponds to an equivalent circuit diagram of each of a memory cell 100B and a memory cell 100C to be described later. As illustrated in FIG. 4C, the transistor WTr may be provided with a back gate. FIG. 4C illustrates a circuit structure example in which the back gate of the transistor WTr is electrically connected to the conductor 119; however, a conductor electrically connected to the back gate of the transistor WTr may be provided besides the conductor 119. Alternatively, a circuit structure illustrated in FIG. 5A or FIG. 5B may be employed.

The conductor 102 functions as one electrode of the capacitor Cs. Another part of the conductor 115 and another part of the semiconductor 114 function as the other electrode of the capacitor Cs. In this specification and the like, a node where the gate of the transistor RTr, the other of the source and the drain of the transistor WTr, and the other electrode of the capacitor Cs are electrically connected is referred to as a node ND.

Figure 6:
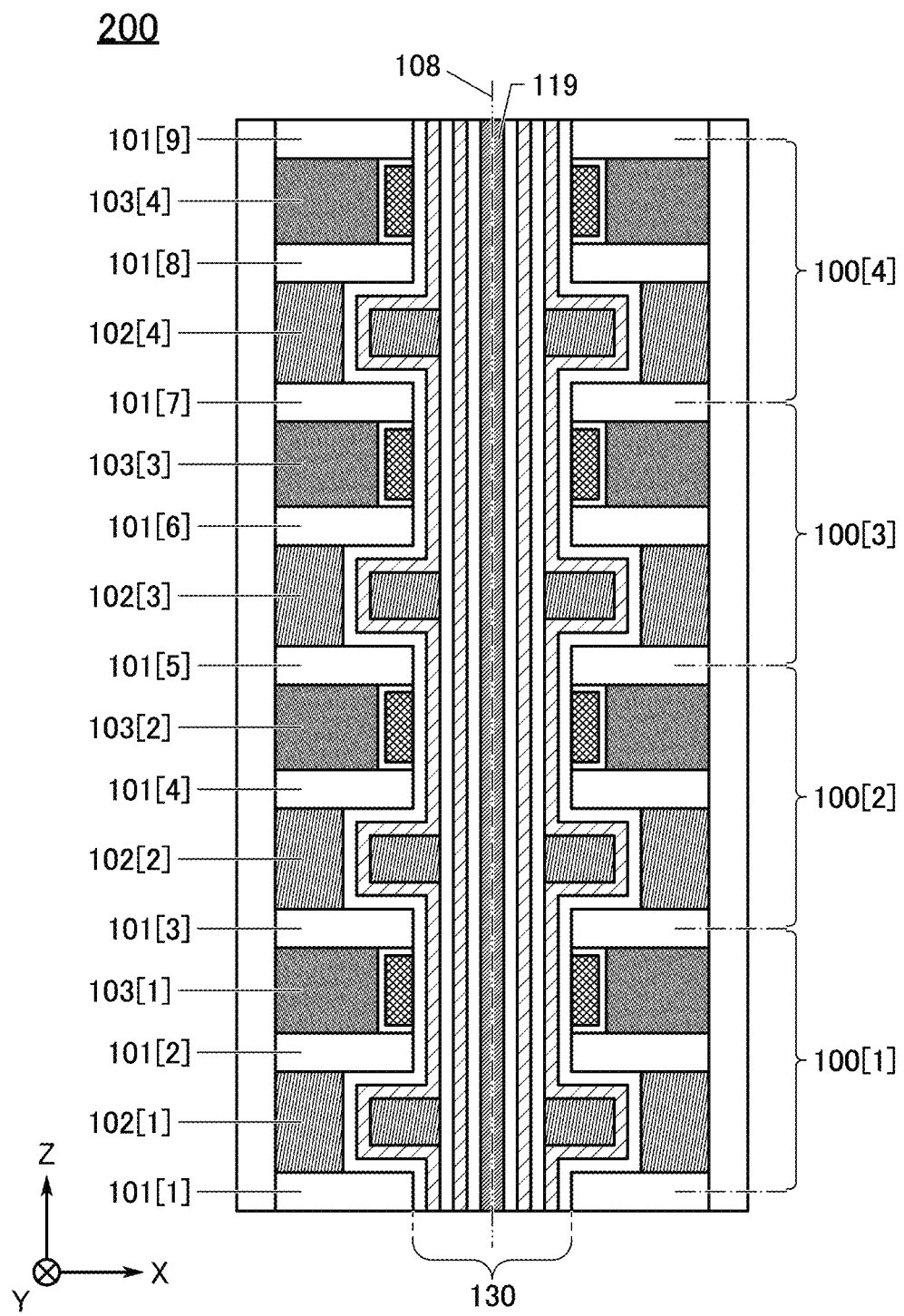
FIG. 6 is a cross-sectional view of a memory string.

FIG. 6 is a cross-sectional view of a memory string 200 including four memory cells 100 (a memory cell 100[1] to a memory cell 100[4]). The memory string 200 illustrated in FIG. 6 includes nine insulators 101 (an insulator 101[1] to an insulator 101[9]), four conductors 102 (a conductor 102[1] to a conductor 102[4]), and four conductors 103 (a conductor 103[1] to a conductor 103[4]).

Figure 7:
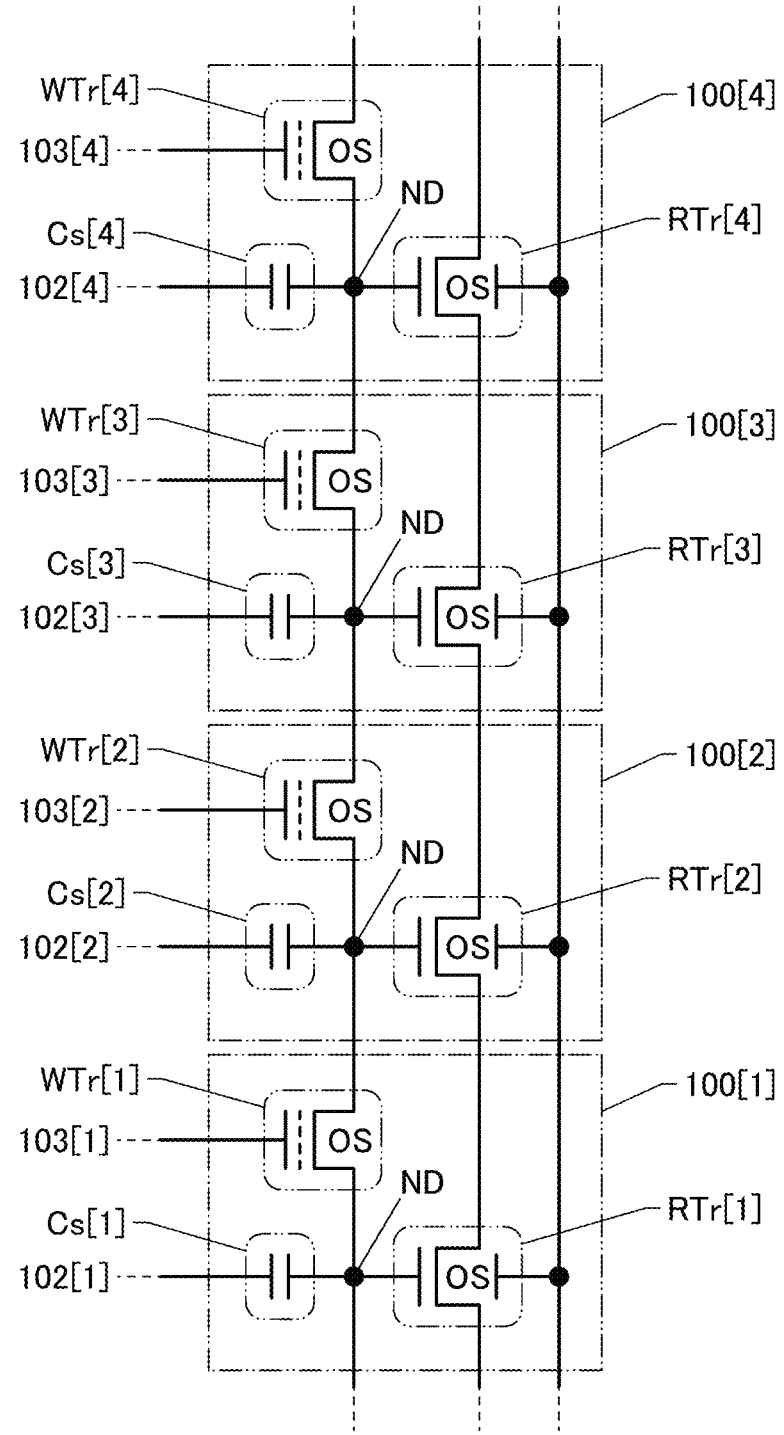
FIG. 7 is an equivalent circuit diagram of a memory string.

FIG. 7 is an equivalent circuit diagram of the memory string 200. The memory string 200 has a structure in which the four memory cells 100 are connected in series. Thus, the memory string 200 is a NAND memory device.

To clarify that a transistor is an OS transistor in an equivalent circuit diagram and the like, "OS" is sometimes written beside a circuit symbol of the transistor. Similarly, to clarify that a transistor is a Si transistor (a transistor using silicon for a semiconductor layer in which a channel is formed), "Si" is sometimes written beside a circuit symbol of the transistor. FIG. 7 shows that the transistor WTr and the transistor RTr are OS transistors.

In FIG. 7, the transistor WTr, the transistor RTr, and the capacitor Cs included in the memory cell 100[1] are denoted as a transistor WTr[1], a transistor RTr[1], and a capacitor Cs[1]. The transistors WTr, the transistors RTr, and the capacitors Cs included in the memory cell 100[2] to the memory cell 100[4] are denoted in a similar manner.

Note that the number of memory cells 100 included in the memory string 200 is not limited to four. Given that the number of memory cells 100 included in the memory string 200 is n, n is an integer of 2 or more.

The expression "a structure in which a plurality of memory cells 100 are connected in series" means that a drain (or source) of the transistor WTr[k] included in the memory cell 100[k] (k is an integer greater than or equal to 1 and less than or equal to n) is electrically connected to a source (or drain) of the transistor WTr[k+1] included in the memory cell 100[k+1], and a drain (or source) of the transistor RTr[k] included in the memory cell 100[k] is electrically connected to a source (or drain) of the transistor RTr[k+1] included in the memory cell 100[k+1].

As the semiconductors in which the channels of the transistor WTr and the transistor RTr are formed, a single crystal semiconductor, a polycrystalline semiconductor, a microcrystalline semiconductor, an amorphous semiconductor, and the like can be used alone or in combination. As a semiconductor material, silicon and germanium can be used, for example. A compound semiconductor such as silicon germanium, silicon carbide, gallium arsenide, an oxide semiconductor, or a nitride semiconductor may be used.

Note that the semiconductor used in the transistor may be a stack of semiconductors. When semiconductor layers are stacked, semiconductors having different crystal states may be used or different semiconductor materials may be used.

The same material or different materials may be used for the semiconductor 114 and the semiconductor 117. For example, both the semiconductor 114 and the semiconductor 117 may be an oxide semiconductor. Both the semiconductor 114 and the semiconductor 117 may be silicon. The semiconductor 114 may be an oxide semiconductor, and the semiconductor 117 may be silicon. The semiconductor 114 may be silicon, and the semiconductor 117 may be an oxide semiconductor.

In particular, the transistor WTr is preferably a transistor using an oxide semiconductor, which is one type of metal oxide, in a semiconductor layer where a channel is formed. An oxide semiconductor has a band gap of 2 eV or more and thus has an extremely low off-state current. When an OS transistor is used as the transistor WTr, charge written to the node ND (also referred to as storage node) can be retained for a long time. In the case where OS transistors are used as transistors included in the memory cell 100, the memory cell 100 can be referred to as an "OS memory". The memory string 200 including such a memory cell 100 can also be referred to as an "OS memory".

A NAND memory device including the OS memory is referred to as an "OS NAND type" or an "OS NAND memory device". An OS NAND memory device in which a plurality of OS memories are stacked in the Z direction is referred to as a "3D OS NAND type" or a "3D OS NAND memory device".

Figure 8:
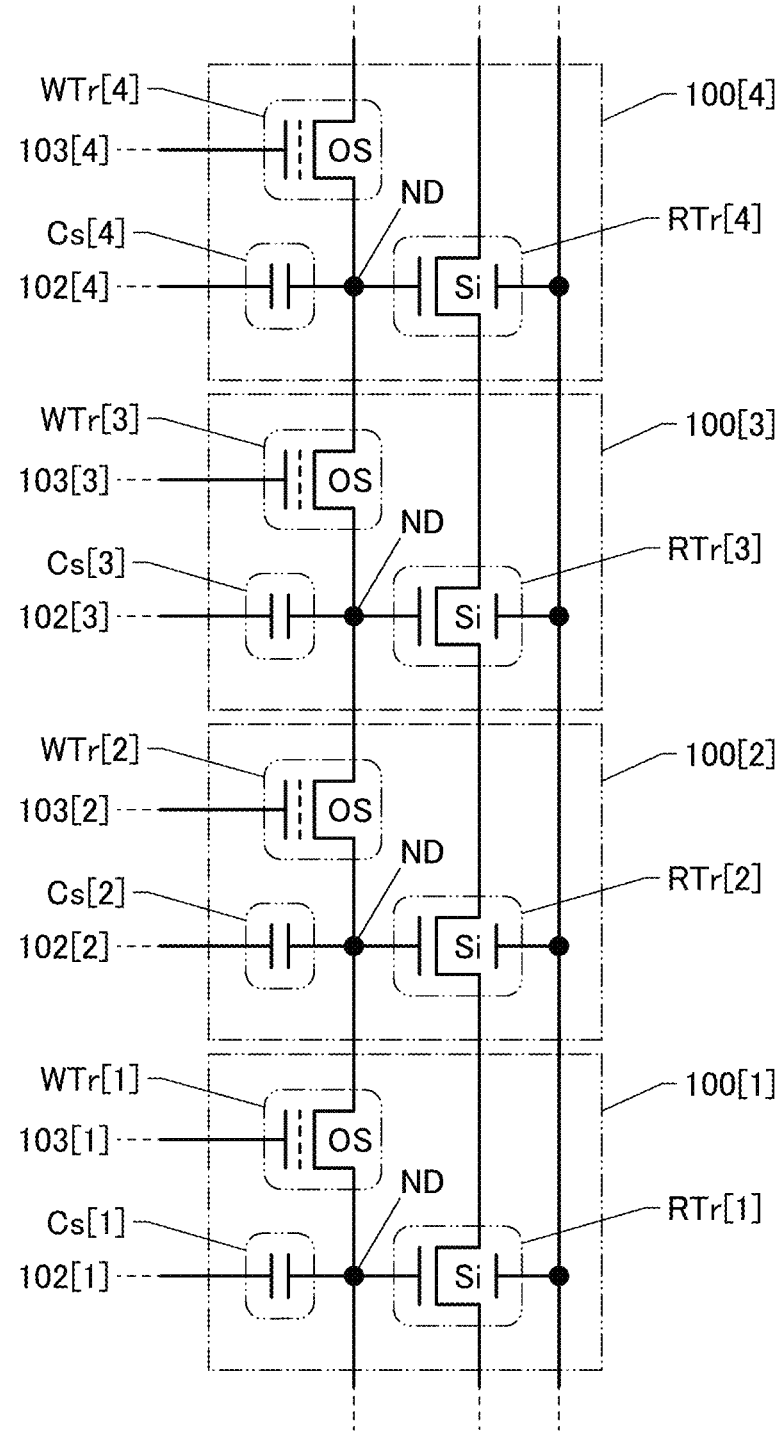
FIG. 8 is an equivalent circuit diagram of a memory string.

The transistor RTr may be a transistor using silicon in a semiconductor layer where a channel is formed (also referred to as a "Si transistor"). The transistor RTr may be a Si transistor and the transistor WTr may be an OS transistor. FIG. 8 is an equivalent circuit diagram of the memory string 200 in which OS transistors are used as the transistors WTr and Si transistors are used as the transistors RTr.

The OS memory can retain written data for a period of one year or longer, or even 10 years or longer after power supply is stopped. Thus, the OS memory can be regarded as a nonvolatile memory.

In the OS memory, the amount of written charge is less likely to change over a long period of time; hence, the OS memory can retain multilevel (multibit) data as well as binary (1-bit) data.

An OS memory employs a method in which charge is written to a node through the OS transistor; hence, high voltage, which a conventional flash memory requires, is unnecessary and high-speed writing operation is possible. The OS memory does not require erase operation before data rewriting, which is performed in a flash memory. Furthermore, the number of data writing and reading operations in the OS memory is substantially unlimited because charge injection and extraction into/from a floating gate or a charge trap layer are not performed. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level in data rewriting. Hence, the OS memory has higher write endurance than the magneto-resistive memory and the resistance-change memory.

The off-state current of the OS transistor hardly increases even in a high temperature environment. Specifically, the off-state current hardly increases even at environment temperatures higher than or equal to room temperature and lower than or equal to 200° C. Moreover, the on-state current is less likely to decrease even in a high temperature environment. A memory device including the OS memory achieves stable operation and high reliability even in a high temperature environment. The OS transistor has high withstand voltage between its source and drain. When OS transistors are used as transistors included in a semiconductor device, the semiconductor device achieves stable operation and high reliability even in a high temperature environment.

Figure 9:
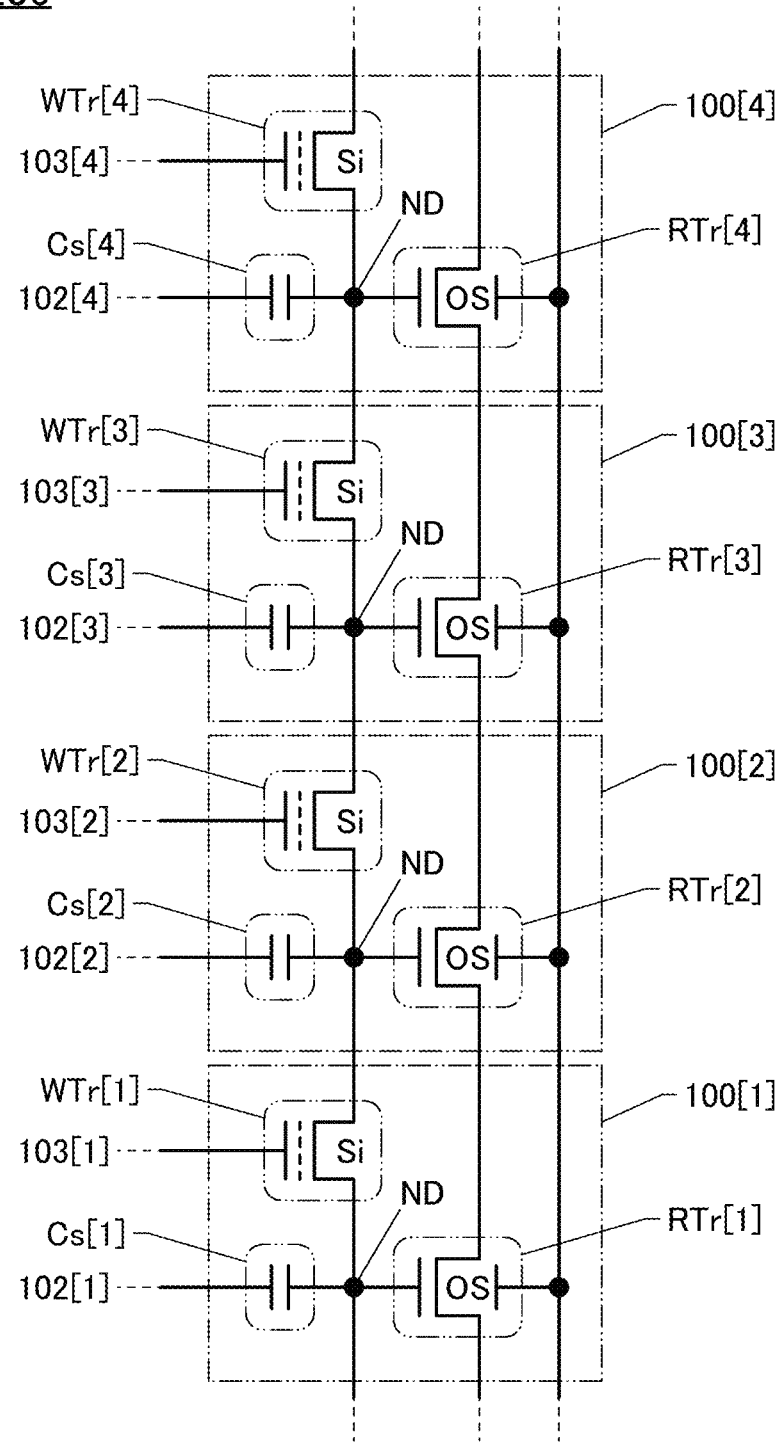
FIG. 9 is an equivalent circuit diagram of a memory string.
Figure 10:
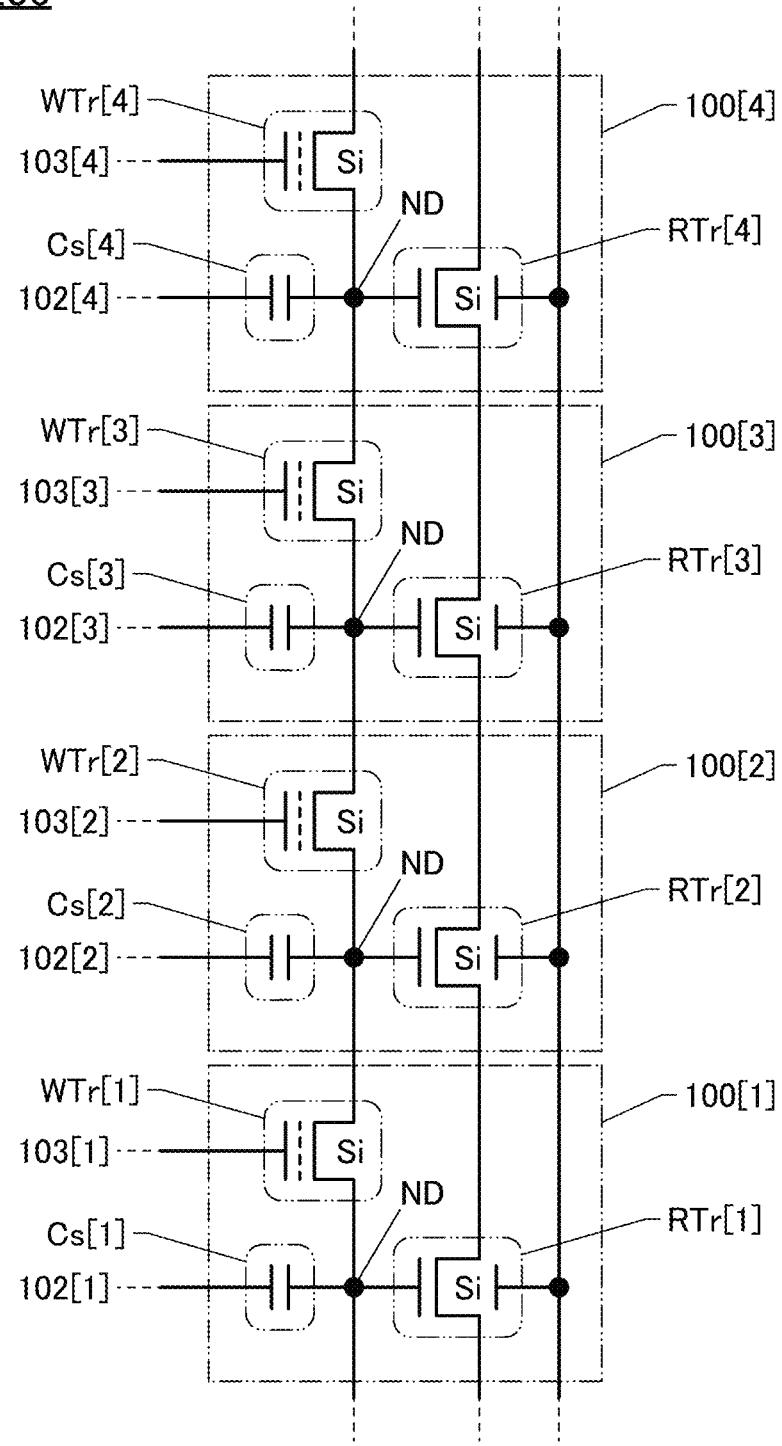
FIG. 10 is an equivalent circuit diagram of a memory string.

As illustrated in FIG. 9, Si transistors may be used as the transistors WTr and OS transistors may be used as the transistors RTr depending on the purpose, application, or the like. As illustrated in FIG. 10, Si transistors may be used as both the transistors WTr and the transistors RTr depending on the purpose, application, or the like.

When a plurality of memory cells 100 are provided continuously in the Z direction as in the memory string 200, the memory capacity per unit area can be increased.

In the case where the memory capacity of a semiconductor device using the memory cell 100 or the memory string 200 is desired to be increased, a plurality of memory cells 100 or a plurality of memory strings 200 are provided in a staggered arrangement (see FIG. 11A) or in a grid pattern (see FIG. 11B). FIG. 11 illustrates top views of the memory strings.

Table 1 shows comparison of a 3D NAND memory device fabricated using Si transistors and a 3D OS NAND memory device.

TABLE 1

| Primary item | Secondary item | 3D NAND | Comparison | 3D OS NAND | |
|---|---|---|---|---|---|
| 1. High-speed write or write/erase | Write speed per page | 300 µs/page | > | 1 to 3 µs/page (assuming 32 layers) | ○ |
| | Write/erase speed per block | 2 ms/block | >> | 2.6 µs/block (assuming 32 layers) | ◎ |
| 2. High-speed read | Read speed per page | 50 µs/page | = | 50 µs/page (assuming 32 layers) | — |
| 3. No high voltage needed | Program voltage Vph | 12 to 20 V | >> | 3 to 5 V | ○ |
| | Program voltage Vpl | 0 V | ≈ | −3 to 0 V | — |
| | Logic voltage Vc | 1.2 V | = | 1.2 V | — |
| 4. No rewrite degradation | Write endurance | $10^3$ to $10^5$ cycles | << | $10^{12}$ cycles or more | ◎ |
| 5. No erase operation per block needed | — | Necessary | | Not necessary | ○ |
| 6. Multilevel | How many levels are possible? | 4 bit/cell (16 levels) | | ≈4 bit/cell (16 levels) | — |
| 7. Applicable to non-von Neumann architecture | Ease of stacking Ease of access | Need cache memory | | No need of external cache memory | ○ |
| 8. Power consumption | — | 8 W (for SSD) | >> | Much smaller than 3D NAND | ◎ | x: worse,
○: better,
◎: best

[Modification Example]

Next, modification examples of the memory cell 100 will be described. Modification examples of the memory cell described below can be combined as appropriate with another memory cell described in this specification and the like.

Figure 12A:
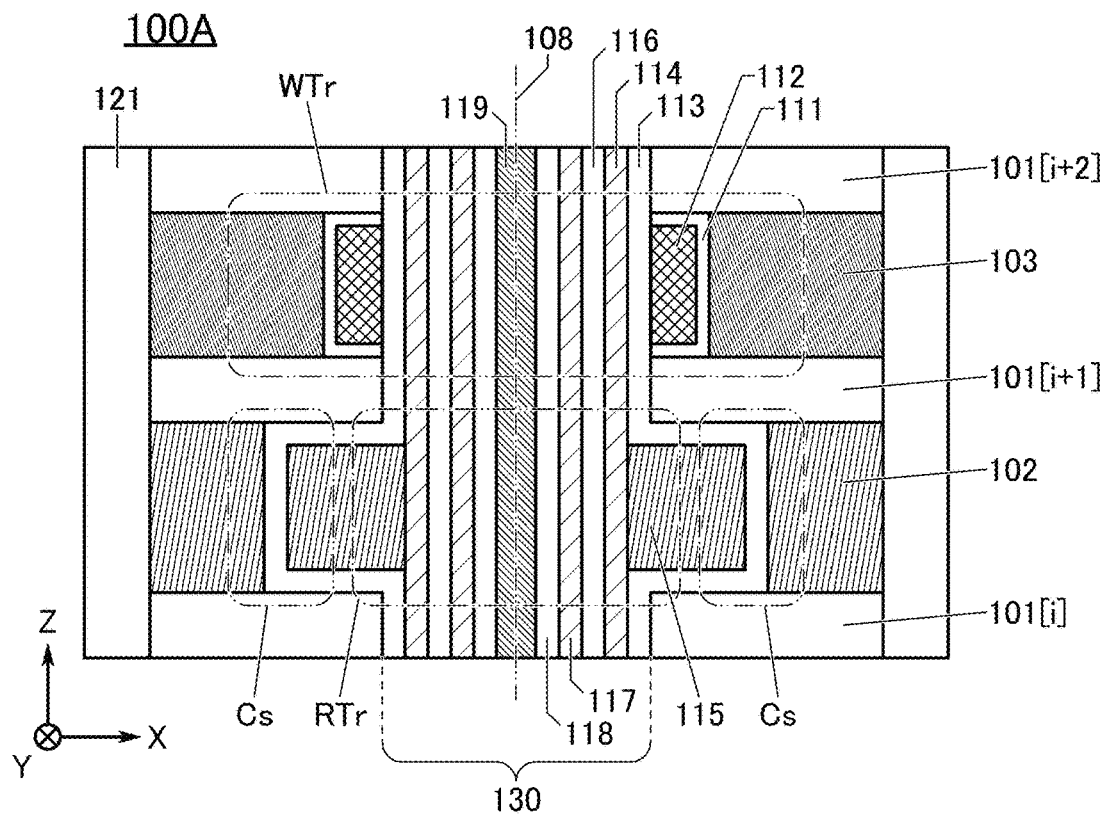
FIG. 12A and FIG. 12B are cross-sectional views of memory cells.

FIG. 12A is a cross-sectional view of a memory cell 100A. The memory cell 100A is a modification example of the memory cell 100. Therefore, the differences between the memory cell 100A and the memory cell 100 are mainly described in this embodiment and the like.

In the intersection portion R of the memory cell of one embodiment of the present invention, as in the memory cell 100A illustrated in FIG. 12A, the semiconductor 114 may be provided adjacent to the insulator 116, the conductor 115 may be provided adjacent to the semiconductor 114, and the insulator 113 may be provided adjacent to the conductor 115.

In the memory cell 100A, the conductor 119, the insulator 118, the semiconductor 117, the insulator 116, the semiconductor 114, and the conductor 115 function as the transistor RTr. The semiconductor 114 sometimes functions as a gate electrode. Alternatively, the semiconductor 114 sometimes functions as a gate insulator. The conductor 115, the insulator 113, and the conductor 102 function as the capacitor Cs.

Figure 12B:
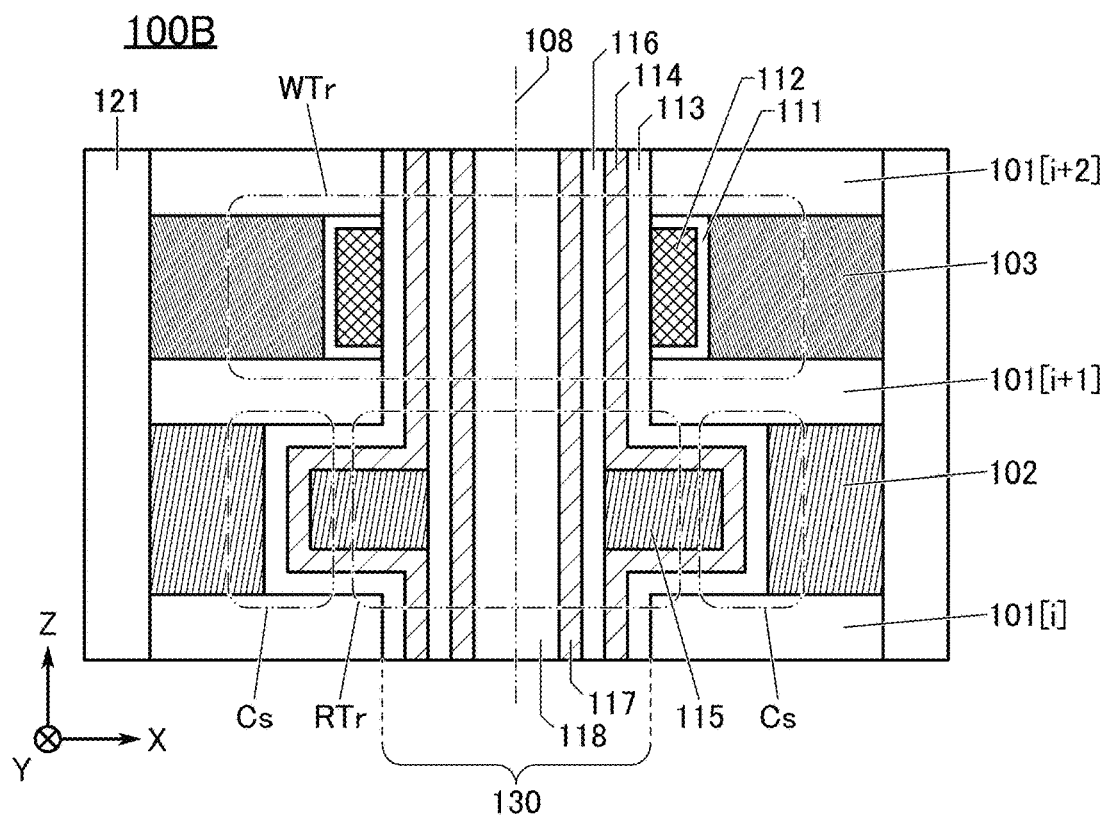

FIG. 12B is a cross-sectional view of the memory cell 100B. The memory cell 100B is a modification example of the memory cell 100. As in the memory cell 100B, the formation of the conductor 119 functioning as the back gate may be omitted and the insulator 118 may be embedded. Not providing the conductor 119 can simplify the manufacturing process and increase the productivity of the memory device.

Figure 13:
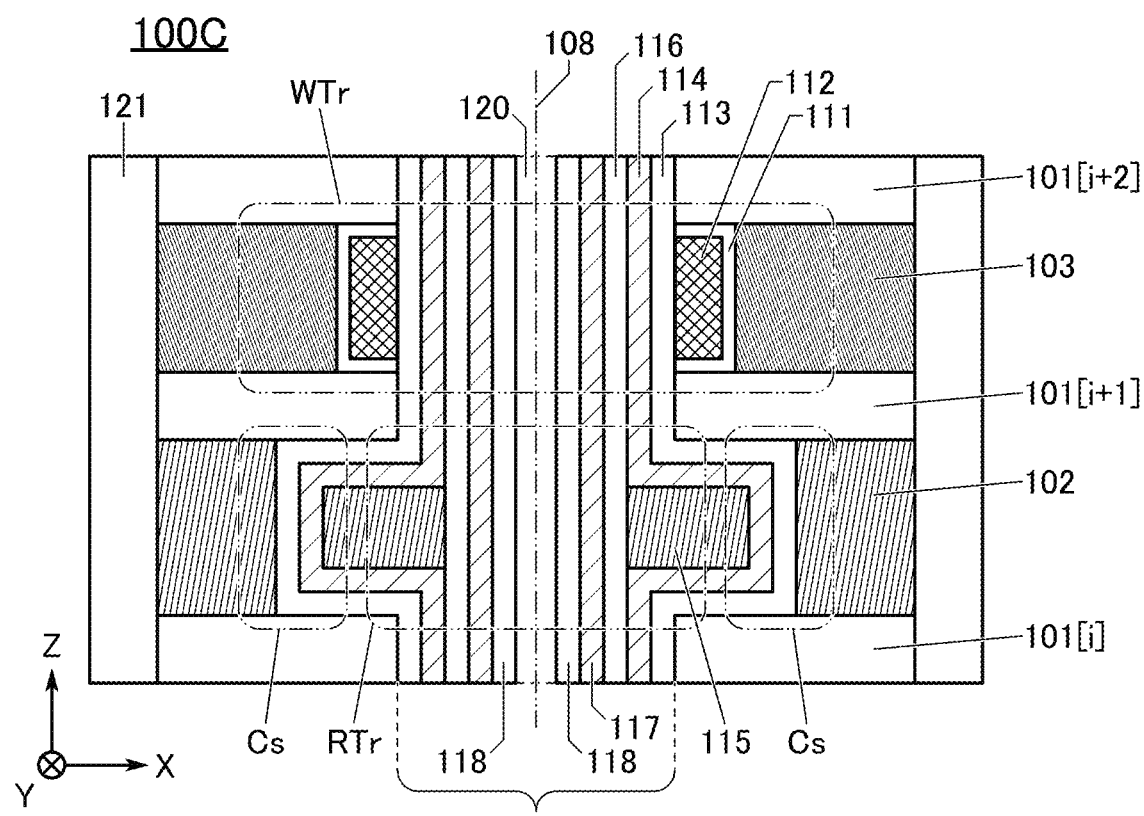
FIG. 13 is a cross-sectional view of a memory cell.

FIG. 13 is a cross-sectional view of the memory cell 100C. The memory cell 100C is a modification example of the memory cell 100 and is also a modification example of the memory cell 100B. As in the memory cell 100C, the formation of the conductor 119 functioning as the back gate may be omitted, and a hollow 120 may be left by not filling a region where the conductor 119 is to be formed. Leaving the hollow by not providing the conductor 119 can simplify the manufacturing process and further increase the productivity of the memory device.

[Constituent Materials for Memory Cell]

Next, constituent materials that can be used for the memory cell 100 and the like will be described.

[Substrate]

The memory cell 100 and the memory string 200 can be provided over a substrate. As the substrate, for example, an insulator substrate, a semiconductor substrate, or a conductor substrate can be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate of silicon carbide, silicon germanium, gallium arsenide, indium phosphide, zinc oxide, gallium oxide, gallium nitride (GaN), or the like. Another example includes a semiconductor substrate in which an insulator region is provided in the above semiconductor substrate, such as an SOI (Silicon On Insulator) substrate. Examples of the conductor substrate include a graphite substrate, a metal substrate, an alloy substrate, and a conductive resin substrate. Other examples include a substrate containing a nitride of a metal and a substrate containing an oxide of a metal. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided over the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as leakage current may arise because of a thinner gate insulator. When a high-k material is used for an insulator functioning as a gate insulator, the voltage during operation of the transistor can be lowered while the physical thickness of the gate insulator is maintained. On the other hand, when a material having a low dielectric constant is used for an insulator functioning as an interlayer film, the parasitic capacitance generated between wirings can be reduced. A material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulator that has a function of inhibiting passage of oxygen and impurities such as hydrogen, the transistor can have stable electrical characteristics. As the insulator having a function of inhibiting passage of oxygen and impurities such as hydrogen, for example, a single layer or stacked layers of an insulator containing boron, carbon, nitrogen, oxygen, fluorine, magnesium, aluminum, silicon, phosphorus, chlorine, gallium, germanium, yttrium, zirconium, lanthanum, neodymium, hafnium, or tantalum can be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

Note that in this specification and the like, "oxynitride" refers to a material that contains more oxygen than nitrogen as its main component. For example, "silicon oxynitride" refers to a material that contains more oxygen than nitrogen and contains silicon, nitrogen, and oxygen. In this specification and the like, "nitride oxide" refers to a material that contains more nitrogen than oxygen as its main component. For example, "aluminum nitride oxide" refers to a material that contains more nitrogen than oxygen and contains aluminum, nitrogen, and oxygen.

In the case where an oxide semiconductor is used as the semiconductor 114 and/or the semiconductor 117, the insulator functioning as a gate insulator is preferably an insulator including a region containing oxygen that is released by heating. For example, when silicon oxide or silicon oxynitride that includes a region containing oxygen released by heating is in contact with the semiconductor 114 and/or the semiconductor 117, oxygen vacancies in the semiconductor 114 and/or the semiconductor 117 can be filled.

As the insulator, a single insulating layer formed using any of the above materials may be used, or a stack of a plurality of insulating layers formed using any of the above materials may be used.

For example, in the case where an insulator is provided in contact with a conductor, an insulator having a function of inhibiting passage of oxygen is preferably used as the insulator in order to prevent oxidation of the conductor. For example, hafnium oxide, aluminum oxide, or silicon nitride is preferably used as the insulator.

In the case where insulators are stacked adjacent to a conductor, an insulator that has a function of inhibiting passage of oxygen is preferably used as the insulator in contact with the conductor. For example, the insulator in contact with the conductor may be formed using hafnium oxide, and an insulator using silicon oxynitride may be formed in contact with the insulator.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

As the conductor, a single conductive layer formed using any of the above materials may be used, or a stack of a plurality of conductive layers formed using any of the above materials may be used. For example, a stacked-layer structure combining a material containing any of the above metal elements and a conductive material containing oxygen may be employed. A stacked-layer structure combining a material containing any of the above metal elements and a conductive material containing nitrogen may be employed. A stacked-layer structure combining a material containing any of the above metal elements, a conductive material containing oxygen, and a conductive material containing nitrogen may be employed.

When an oxide semiconductor, which is a type of metal oxide, is used for the channel formation region of the transistor, the conductor functioning as the gate electrode preferably employs a stacked-layer structure combining a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the oxide semiconductor in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the oxide semiconductor in which the channel is formed can be captured in some cases. Hydrogen entering from an external insulator or the like can be captured in some cases.

[Oxide Semiconductor]

A metal oxide functioning as a semiconductor (an oxide semiconductor) is preferably used as the semiconductor 114 and/or the semiconductor 117. In particular, an oxide semiconductor is preferably used as the semiconductor 114. An oxide semiconductor that can be used in the memory cell 100 will be described below.

An oxide semiconductor preferably contains at least indium or zinc. In particular, indium and zinc are preferably contained. In addition, aluminum, gallium, yttrium, tin, or the like is preferably contained. Furthermore, one or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide that contains indium, an element M, and zinc is considered. Note that the element M is one or more elements selected from aluminum, gallium, yttrium, and tin. Other examples of an element that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M

[Classification of Crystal Structures]

First, the classification of the crystal structures of an oxide semiconductor will be described with reference to FIG. 14A. FIG. 14A is a diagram showing the classification of crystal structures of an oxide semiconductor, typically IGZO (metal oxide containing In, Ga, and Zn).

As shown in FIG. 14A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 14A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. Here, FIG. 14B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 14B and obtained by GIXD measurement is hereinafter simply referred to as an XRD spectrum. The CAAC-IGZO film shown in FIG. 14B has a composition in the neighborhood of In:Ga:Zn=4:2:3 [atomic ratio]. The CAAC-IGZO film shown in FIG. 14B has a thickness of 500 nm.

As shown in FIG. 14B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 14B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 14C shows a diffraction pattern of the CAAC-IGZO film. FIG. 14C shows a diffraction pattern obtained with NBED in which an electron beam is incident in the direction parallel to the substrate. The CAAC-IGZO film in FIG. 14C has a composition in the neighborhood of In:Ga:Zn=4:2:3 [atomic ratio]. In the nanobeam electron diffraction method, electron diffraction is performed with a probe diameter of 1 nm.

As shown in FIG. 14C, a plurality of spots indicating c-axis alignment are observed in the diffraction pattern of the CAAC-IGZO film.

[Structure of Oxide Semiconductor]

Oxide semiconductors might be classified in a manner different from that in FIG. 14A when classified in terms of the crystal structure. Oxide semiconductors are classified into a single crystal oxide semiconductor and a non-single-crystal oxide semiconductor, for example. Examples of the non-single-crystal oxide semiconductor include a CAAC-OS (C Axis Aligned Crystalline Oxide Semiconductor) and an nc-OS (nanocrystalline Oxide Semiconductor). Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide, the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

[Structure of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, a CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

When the above oxide semiconductor is used for a transistor, a transistor with high field-effect mobility can be achieved. In addition, a transistor having high reliability can be achieved.

Furthermore, an oxide semiconductor with a low carrier concentration is preferably used for a channel formation region of the transistor. For example, the carrier concentration of the channel formation region of the oxide semiconductor is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor. A highly purified intrinsic or substantially highly purified intrinsic state may be referred to as an i-type or a substantially i-type.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in a film provided in proximity be also reduced. Examples of impurities include hydrogen, nitrogen, an alkali metal, an alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, further preferably lower than $1\times10^{18}$ atoms/cm$^3$.

When an oxide semiconductor with sufficiently reduced impurities is used for the channel formation region of the transistor, stable electrical characteristics can be given.

[Other Semiconductor Materials]

Semiconductor materials that can be used for the semiconductor 114 and the semiconductor 117 are not limited to the above-described oxide semiconductors. A semiconductor material having a band gap (a semiconductor material that is not a zero-gap semiconductor) may be used for the semiconductor 114 and the semiconductor 117. For example, a single element semiconductor such as silicon, a compound semiconductor such as gallium arsenide, or a layered material (also referred to as an atomic layered material or a two-dimensional material) may be used as a semiconductor material. In particular, a layered material functioning as a semiconductor is preferably used as a semiconductor material.

In this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As a semiconductor material used in the semiconductor device of one embodiment of the present invention, transition metal chalcogenide functioning as a semiconductor may be used, for example. Specific examples include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), and zirconium selenide (typically ZrSe$_2$).

[Deposition Method]

The conductors, insulators, and semiconductors can be formed by a sputtering method, a CVD method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma CVD method. A thermal CVD method is a deposition method that does not use plasma and thus enables less plasma damage to a processed object. For example, a wiring, an electrode, an element (a transistor, a capacitor, or the like), or the like included in a semiconductor device might be charged up by receiving charge from plasma. In that case, accumulated charge might break the wiring, the electrode, the element, or the like included in the semiconductor device. By contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

An ALD method is also a deposition method that enables less plasma damage to a processed object. An ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of a processed object. Thus, a CVD method and an ALD method are deposition methods that enable favorable step coverage almost regardless of the shape of a processed object. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be formed depending on the flow rate ratio of the source gases. Moreover, for example, by a CVD method and an ALD method, a film whose composition is continuously changed can be formed by changing the flow rate ratio of the source gases during the deposition. In the case of forming a film while changing the flow rate ratio of the source gases, as compared with the case of forming a film with use of a plurality of deposition chambers, the time taken for the deposition can be shortened because the time taken for transfer and pressure adjustment is omitted. Thus, the productivity of the semiconductor device can be increased in some cases.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after the introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on a surface of a substrate to form a first thin layer, and then the second source gas is introduced to react with the first thin layer; thus, a second thin layer is stacked over the first thin layer, and a thin film is formed as a result. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

A variety of films such as metal films, semiconductor films, and inorganic insulating films can be formed by a thermal CVD method such as an MOCVD method or an ALD method. For example, in the case where an In—Ga—Zn—O film is formed, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where a hafnium oxide film is formed by a deposition apparatus employing ALD, two kinds of gases, ozone (O$_3$) as an oxidizer and a source gas obtained by vaporization of liquid containing a solvent and a hafnium precursor compound (hafnium alkoxide or hafnium amide such as tetrakis(dimethylamide)hafnium (TDMAH, Hf[N(CH$_3$)$_2$]$_4$)), are used. Examples of another material include tetrakis(ethylmethylamide)hafnium.

For example, when an aluminum oxide film is formed by a deposition apparatus employing ALD, two kinds of gases, H$_2$O as an oxidizer and a source gas obtained by vaporization of liquid containing a solvent and an aluminum precursor compound (trimethylaluminum (TMA, Al(CH$_3$)$_3$) or the like), are used. Examples of another material include tris (dimethylamide)aluminum, triisobutylaluminum, and aluminum tris(2,2,6,6-tetramethyl-3,5-heptanedionate).

For example, when a silicon oxide film is formed by a deposition apparatus employing ALD, hexachlorodisilane is adsorbed on a surface where the film is to be formed, and radicals of an oxidizing gas (O$_2$ or dinitrogen monoxide) are supplied to react with the adsorbate.

For example, when a tungsten film is formed by a deposition apparatus employing ALD, a WF$_6$ gas and a B$_2$H$_6$ gas are sequentially and repeatedly introduced to form an initial tungsten film, and then a WF$_6$ gas and an H$_2$ gas are sequentially and repeatedly introduced to form a tungsten film. Note that a SiH$_4$ gas may be used instead of a B$_2$H$_6$ gas.

For example, when an oxide semiconductor film, e.g., an In—Ga—Zn—O film is formed by a deposition apparatus employing ALD, an In(CH$_3$)$_3$ gas and an O$_3$ gas) are sequentially and repeatedly introduced to form an In—O layer, a Ga(CH$_3$)$_3$ gas and an O$_3$ gas) are sequentially and repeatedly introduced to form a GaO layer, and then a Zn(CH$_3$)$_2$ gas and an O$_3$ gas) are sequentially and repeatedly introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an H$_2$O gas that is obtained by bubbling water with an inert gas such as Ar may be used instead of an O$_3$ gas), it is preferable to use an O$_3$ gas), which does not contain H. An In(C$_2$H$_5$)$_3$ gas may be used instead of an In(CH$_3$)$_3$ gas. A Ga(C$_2$H$_5$)$_3$ gas may be used instead of a Ga(CH$_3$)$_3$ gas. A Zn(C$_2$H$_5$)$_2$ gas may be used instead of a Zn(CH$_3$)$_2$ gas.

<Example of Method for Manufacturing Memory Device>

Next, an example of a method for manufacturing the memory cell 100 will be described.

Figure 15A:
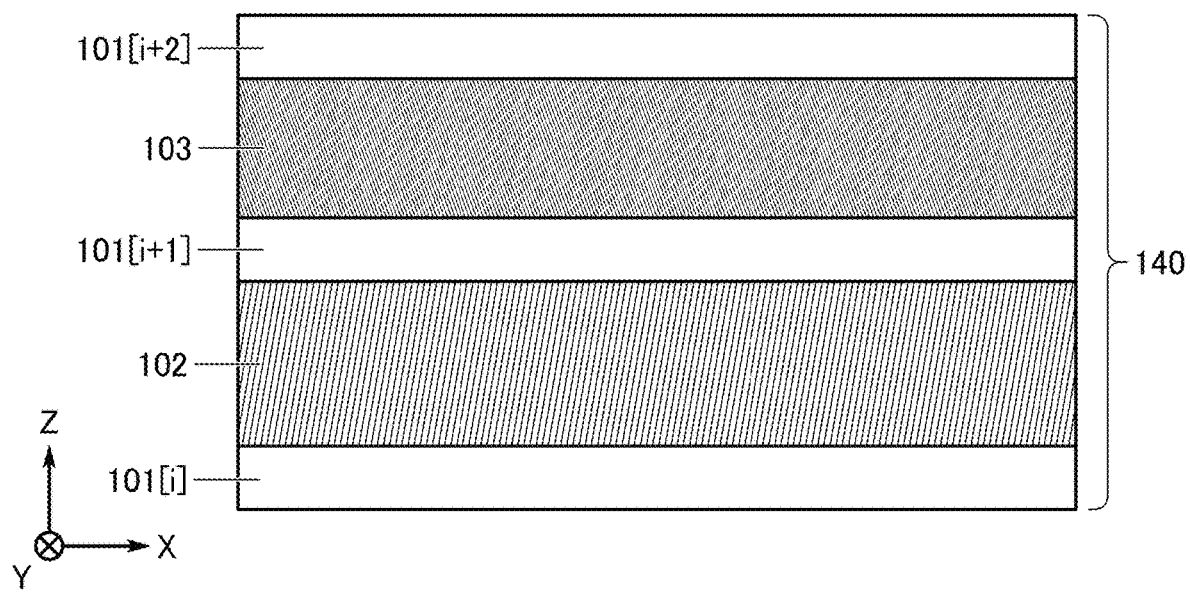
FIG. 15A and FIG. 15B are cross-sectional views illustrating a method for manufacturing a memory cell.

First, a stack 140 illustrated in FIG. 15A is manufactured. The stack 140 includes the insulator 101, the conductor 102, and the conductor 103. The insulator 101[i] is provided above a substrate (not illustrated), the conductor 102 is provided over the insulator 101[i], the insulator 101[i+1] is provided over the conductor 102, the conductor 103 is provided over the insulator 101[i+1], and the insulator 101[i+2] is provided over the conductor 103.

The insulator 101 is preferably a material with a low concentration of impurities such as water and hydrogen. For example, the amount of hydrogen molecules released from the insulator 101 per unit area is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in TDS (Thermal Desorption Spectroscopy) in the range of 50° C. to 500° C. The insulator 101 may be formed using an insulator from which oxygen is released by heating. Note that a material usable for the insulator 101 is not limited to the above description.

Note that the insulator 101 may have a stacked-layer structure of a plurality of insulators. For example, the insulator 101 may be a stack of hafnium oxide and silicon oxynitride. Among the plurality of insulators included in the insulator 101, the aforementioned insulator that has a function of inhibiting passage of oxygen is preferably used as the insulator in contact with the conductor 103.

Figure 15B:
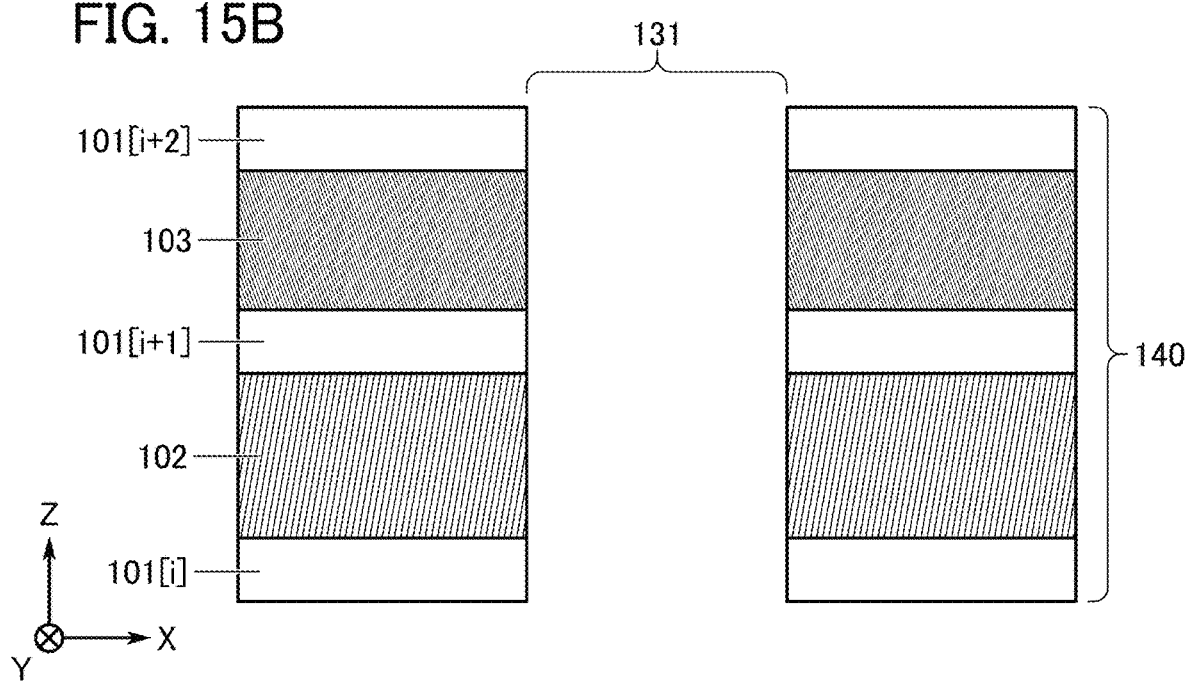

Next, a resist mask is formed over the stack 140, and the insulator 101, the conductor 103, and the conductor 102 are partly removed by etching treatment using the resist mask as a mask, whereby an opening 131 is formed in the stack 140 (see FIG. 15B).

The resist mask can be formed, for example, by a lithography method, a printing method, or an inkjet method as appropriate. Formation of the resist mask by an inkjet method needs no photomask; thus, manufacturing cost can be reduced in some cases. For the etching treatment, either a dry etching method or a wet etching method or both of them may be used. A dry etching method is suitable for microfabrication.

To form a resist mask by a lithography method, a resist is formed first, and then the resist is exposed to light through a photomask. Next, a region exposed to light is removed or left using a developing solution, so that a resist mask is formed.

Etching treatment through the resist mask is performed to process a conductor, a semiconductor, an insulator, or the like into a desired shape. The resist mask is formed, for example, by exposing the resist to KrF excimer laser light, ArF excimer laser light, or EUV (Extreme Ultraviolet) light. A liquid immersion technique may be employed in which a gap between a substrate and a projection lens is filled with a liquid (e.g., water) to perform light exposure. An electron beam or an ion beam may be used instead of the above-mentioned light. Note that a photomask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed in the following manner: an insulating film or a conductive film that is the hard mask material is formed over a conductive film, a resist mask is formed thereover, and then the hard mask material is etched.

As a dry etching apparatus for performing etching treatment by a dry etching method, a capacitively coupled plasma (CCP) etching apparatus including parallel plate electrodes can be used, for example. The capacitively coupled plasma etching apparatus including the parallel plate electrodes may have a structure in which high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. A dry etching apparatus including a high-density plasma source can be used. As the dry etching apparatus including a high-density plasma source, an inductively coupled plasma (ICP) etching apparatus can be used, for example.

Figure 16A:
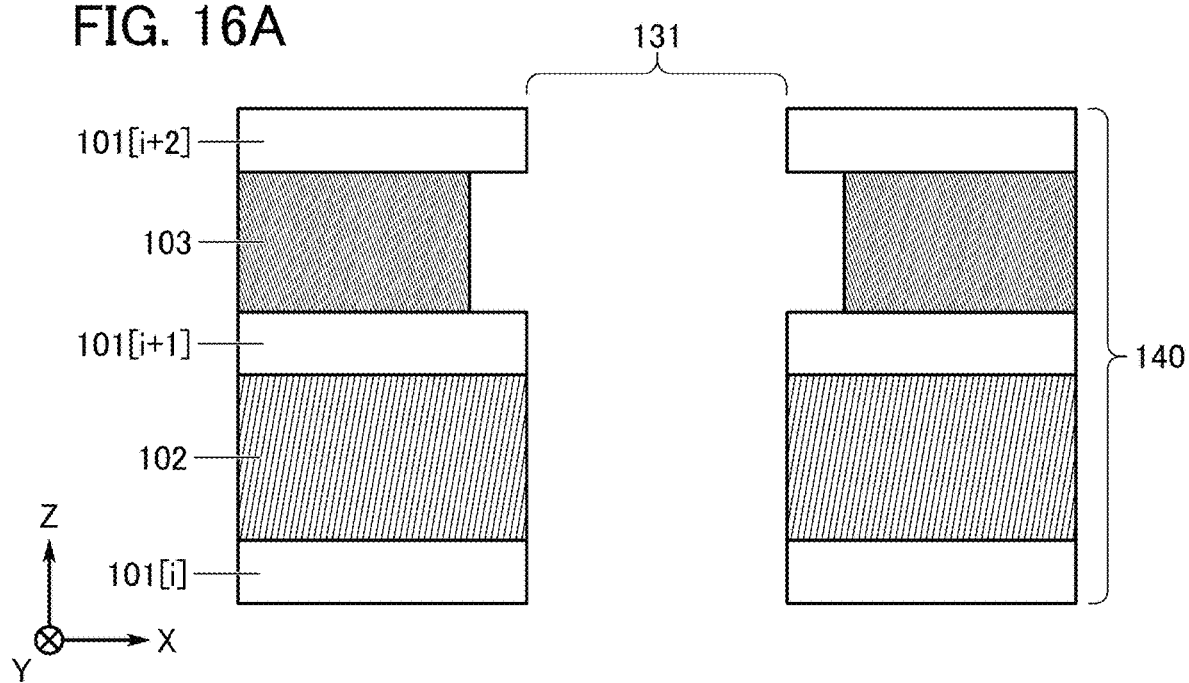
FIG. 16A and FIG. 16B are cross-sectional views illustrating a method for manufacturing a memory cell.

Next, part of the conductor 103 exposed on the side surface of the opening 131 is etched, whereby the conductor 103 is made to recede from the side surface of the opening 131 (see FIG. 16A). The conductor 103 is etched under the conditions where the selectivity to the insulator 101 and the conductor 102 can be obtained.

Figure 16B:
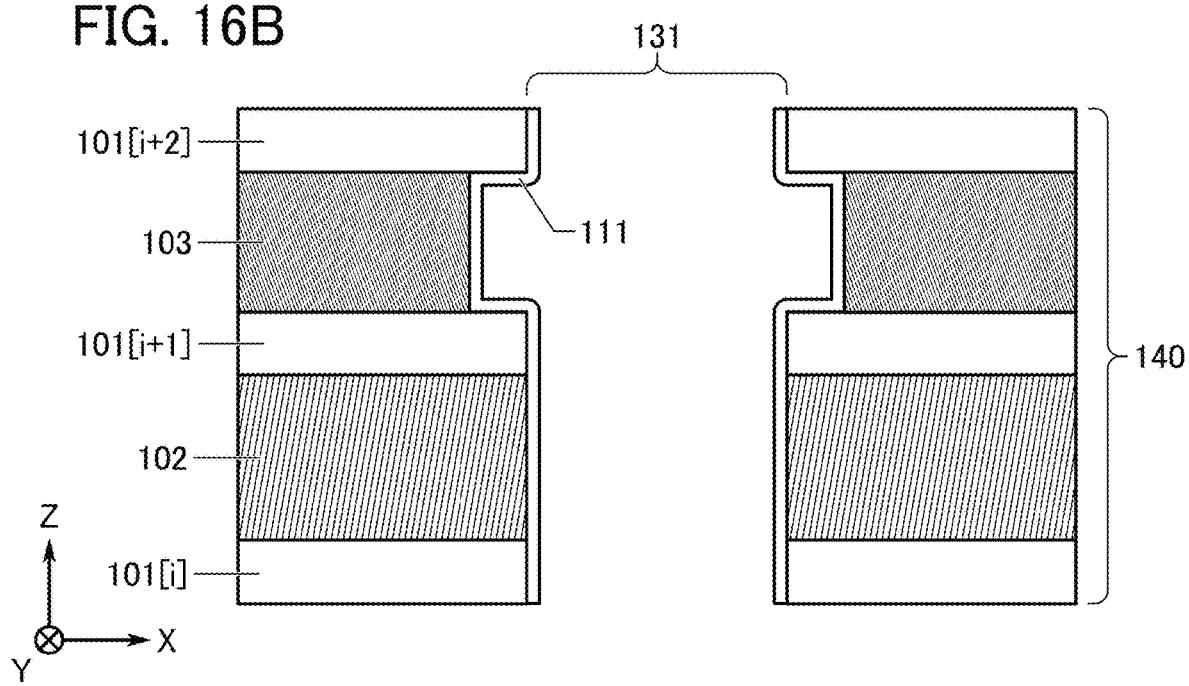

Next, the insulator 111 is formed along the side surface of the opening 131 (see FIG. 16B). The surfaces of the insulator 101, the conductor 103, and the conductor 102 that are exposed in the opening 131 are covered with the insulator 111. Silicon oxide is used for the insulator 111, for example. Note that the insulator 111 may have a stacked-layer structure of a plurality of insulators.

Figure 17A:
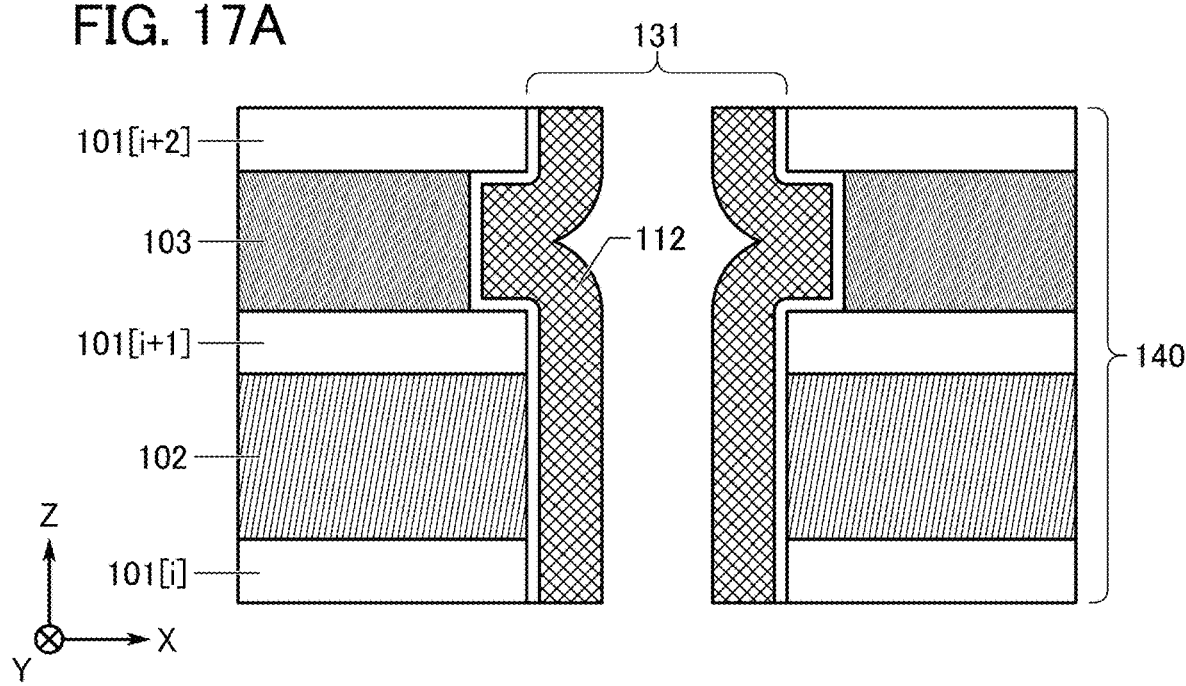
FIG. 17A and FIG. 17B are cross-sectional views illustrating a method for manufacturing a memory cell.

Subsequently, the functional body 112 is formed along the surface of the insulator 111 (see FIG. 17A). Silicon nitride is used for the insulator 111, for example. Note that the functional body 112 may have a stacked-layer structure of a plurality of insulators.

Figure 17B:
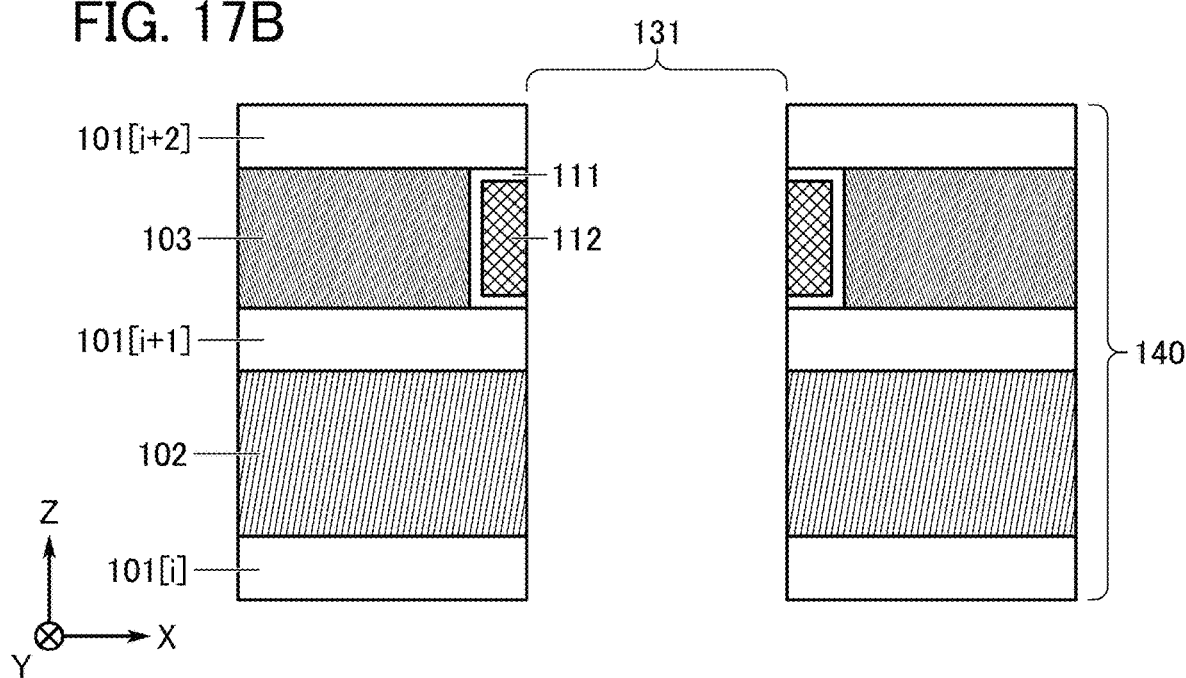

Next, the insulator 111 and the functional body 112 in the opening 131 are partly etched. The insulator 111 and the functional body 112 are etched in a region other than a portion overlapping with the insulator 101 when seen from the Z direction (see FIG. 17B).

Figure 18A:
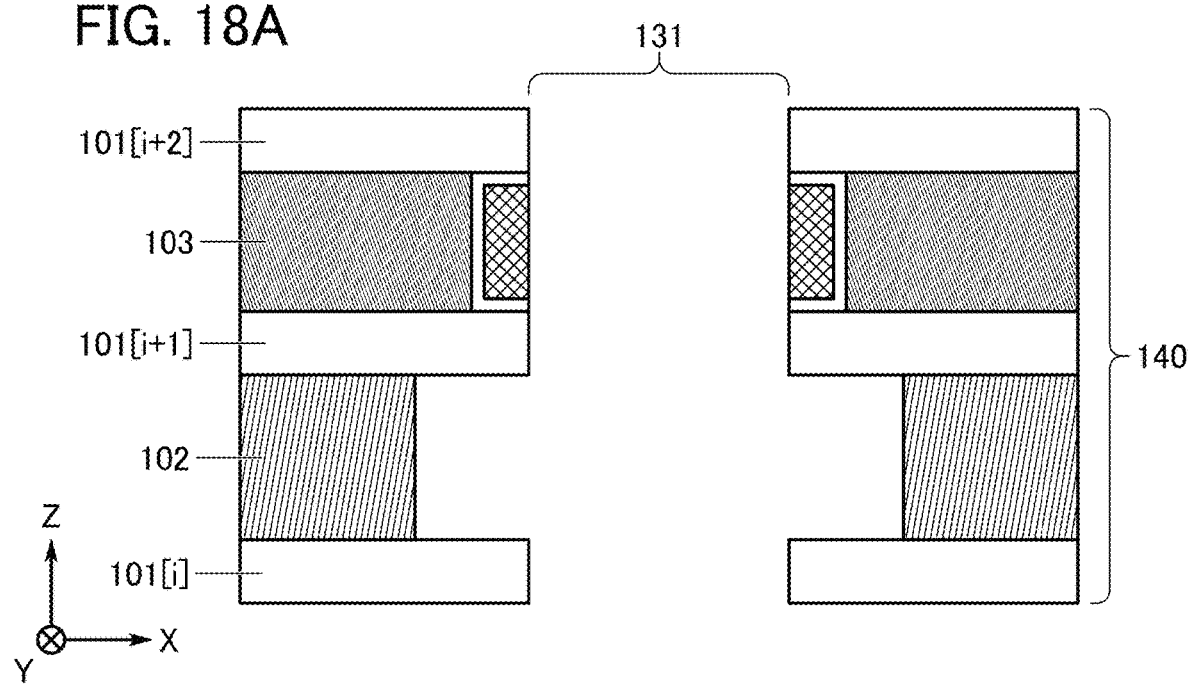
FIG. 18A and FIG. 18B are cross-sectional views illustrating a method for manufacturing a memory cell.

Next, part of the conductor 102 exposed on the side surface of the opening 131 is etched, whereby the conductor 102 is made to recede from the side surface of the opening 131 (see FIG. 18A). The conductor 102 is etched under the conditions where the selectivity to the insulator 101 and the conductor 103 can be obtained.

Figure 18B:
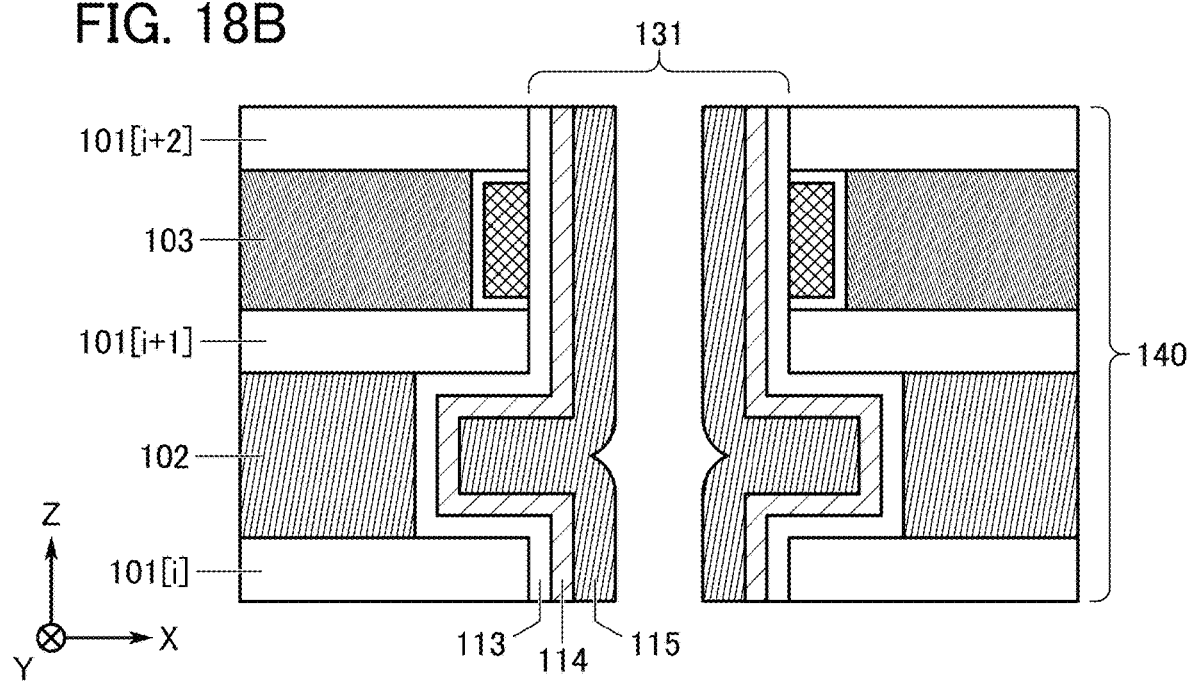

Next, the insulator 113 is formed along the side surface of the opening 131 (see FIG. 18B). The surfaces of the insulator 101, the insulator 111, the functional body 112, and the conductor 102 that are exposed in the opening 131 are covered with the insulator 113.

In the case where an oxide semiconductor is used as the semiconductor 114, silicon oxide or silicon oxynitride, for example, can be used as appropriate as the insulator 113. By providing the insulator containing oxygen in contact with the semiconductor 114, oxygen vacancies in the semiconductor 114 can be reduced, and the reliability of the transistor can be improved.

Specifically, an oxide material that releases part of oxygen by heating, namely, an insulator material including an excess oxygen region is preferably used for the insulator 113. An oxide that releases oxygen by heating is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS analysis. In the TDS analysis, the film-surface temperature is preferably higher than or equal to 100° C. and lower than or equal to 700° C., or higher than or equal to 100° C. and lower than or equal to 400° C. Note that the insulator 113 may have a stacked-layer structure of a plurality of insulators.

Oxygen adding treatment described later may be performed after the formation of the insulator 113.

Next, the semiconductor 114 and the conductor 115 are formed along the side surface of the opening 131 (see FIG.

18B). In this embodiment, an oxide semiconductor having a composition In:Ga:Zn=4:2:3 [atomic ratio] or a neighborhood thereof is used as the semiconductor 114.

As a semiconductor material used for the semiconductor 114, a metal oxide having a composition In:Ga:Zn=4:2:3 to 4.1, In:Ga:Zn=1:1:1, In:Ga:Zn=5:1:6, In:Ga:Zn=5:1:3, or In:Ga:Zn=10:1:3, or a composition in the neighborhood thereof may be used, for example. As a semiconductor material used for the semiconductor 114, a metal oxide having a composition In:Zn=5:1 or In:Zn=10:1, or a composition in the neighborhood thereof may be used. Indium oxide may be used as the semiconductor 114.

The semiconductor 114 may have a stacked-layer structure of a plurality of layers. For example, the semiconductor 114 may be a stack of a metal oxide having a composition In:Ga:Zn=1:3:4, In:Ga:Zn=1:3:2, or In:Ga:Zn=1:1:1, or a composition in the neighborhood thereof and a metal oxide having a composition In:Ga:Zn=4:2:3 to 4.1, In:Ga:Zn=1:1:1, In:Ga:Zn=5:1:6, In:Ga:Zn=5:1:3, or In:Ga:Zn=10:1:3, or a composition in the neighborhood thereof.

Alternatively, the semiconductor 114 may have a three-layer structure in which a metal oxide having a composition In:Ga:Zn=4:2:3 to 4.1, In:Ga:Zn=1:1:1, In:Ga:Zn=5:1:6, In:Ga:Zn=5:1:3, or In:Ga:Zn=10:1:3, or a composition in the neighborhood thereof is provided between two metal oxides each having a composition In:Ga:Zn=1:3:4, In:Ga:Zn=1:3:2, or In:Ga:Zn=1:1:1, or a composition in the neighborhood thereof.

In the manufacturing process of the memory cell, heat treatment is preferably performed with the surface of the semiconductor 114 exposed. The heat treatment is performed at a temperature higher than or equal to 100° C. and lower than or equal to 600° C., preferably higher than or equal to 350° C. and lower than or equal to 550° C., for example. The heat treatment is performed in a nitrogen gas or inert gas atmosphere or an atmosphere containing an oxidizing gas at 10 ppm or more, 1% or more, or 10% or more. For example, the heat treatment is preferably performed in an oxygen atmosphere. Accordingly, oxygen can be supplied to the semiconductor 114 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that treatment for supplying oxygen (also referred to as "oxygen adding treatment") performed on the semiconductor 114 can promote a reaction in which oxygen vacancies in the semiconductor 114 are filled with supplied oxygen, i.e., a reaction of "Vo+O→null". Furthermore, hydrogen remaining in the semiconductor 114 reacts with supplied oxygen, so that the hydrogen can be removed as $H_2O$ (dehydration). This can inhibit recombination of hydrogen remaining in the semiconductor 114 with oxygen vacancies and formation of VoH.

Oxygen adding treatment can be performed by conducting microwave treatment in an oxygen-containing atmosphere. In that case, high-frequency waves such as microwaves and RF, oxygen plasma, oxygen radicals, and the like are applied to the semiconductor 114. The microwave treatment is preferably performed with a microwave treatment apparatus including a power source for generating high-density plasma using microwaves, for example. The microwave treatment apparatus may include a power source for applying RF to the substrate side. The use of high-density plasma enables high-density oxygen radicals to be generated. Application of RF to the substrate (not illustrated) side allows oxygen ions generated by the high-density plasma to be guided into the opening 131 efficiently. The microwave treatment is preferably performed under reduced pressure, and the pressure is set to 60 Pa or higher, preferably 133 Pa or higher, further preferably 200 Pa or higher, still further preferably 400 Pa or higher. The oxygen flow rate ratio $O_2/(O_2+Ar)$ is lower than or equal to 50%, preferably higher than or equal to 10% and lower than or equal to 30%. The treatment temperature is lower than or equal to 750° C., preferably lower than or equal to 500° C., and is approximately 400° C., for example. After the oxygen plasma treatment, heat treatment may be successively performed without exposure to the air.

The effect of plasma, microwaves, and the like enables VoH included in the semiconductor 114 to be cut off, and hydrogen H to be removed from the semiconductor 114. That is, the reaction "VoH→H+Vo)" and then the reaction "Vo→O→null" occur in the semiconductor 114, whereby the hydrogen concentration in the semiconductor 114 can be reduced. As a result, oxygen vacancies and VoH in the semiconductor 114 can be reduced to lower the carrier concentration.

After the formation of the semiconductor 114, the conductor 115 is formed. In this embodiment, the conductor 115 is formed using tungsten.

Figure 19A:
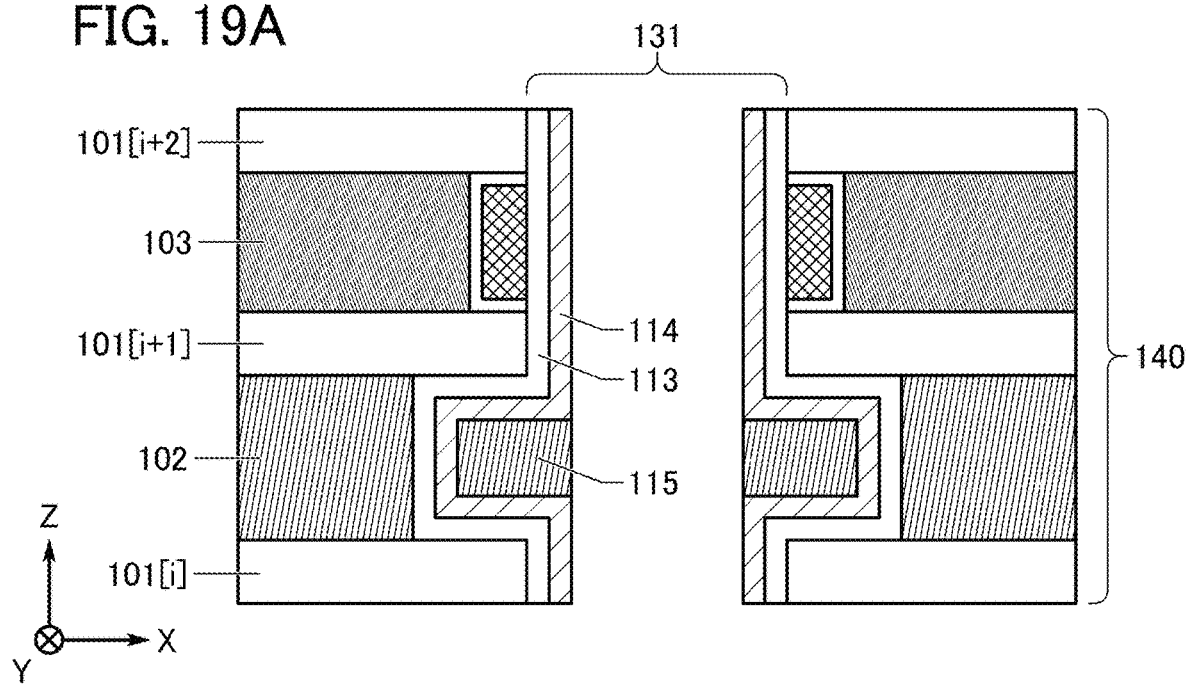
FIG. 19A and FIG. 19B are cross-sectional views illustrating a method for manufacturing a memory cell.

Next, the conductor 115 in the opening 131 is partly etched. The conductor 115 is etched in a region other than a portion overlapping with the semiconductor 114 when seen from the Z direction (see FIG. 19A). Accordingly, the semiconductor 114 and the conductor 115 are exposed in the opening 131. After the semiconductor 114 and the conductor 115 are exposed, oxygen adding treatment may be performed.

Figure 19B:
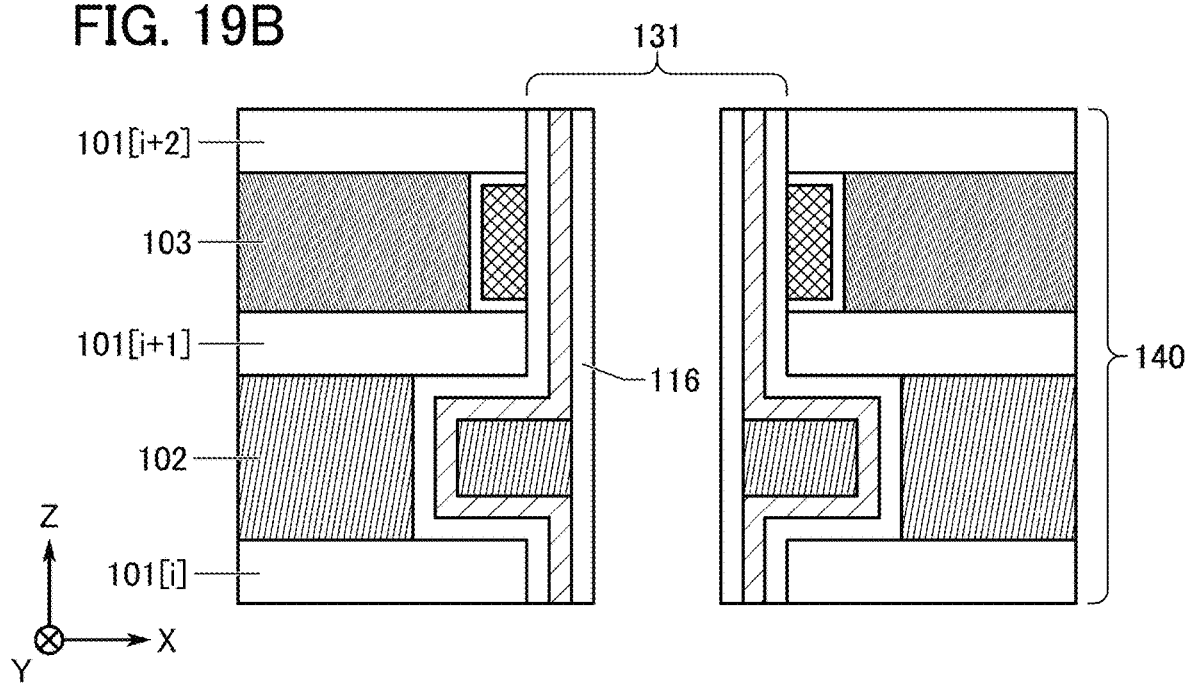

Next, the insulator 116 is formed along the side surface of the opening 131 (see FIG. 19B). The surfaces of the semiconductor 114 and the conductor 115 exposed in the opening 131 are covered with the insulator 116. In the case where an oxide semiconductor is used as the semiconductor 114, silicon oxide, silicon oxynitride, or the like is used as appropriate as the insulator 116, for example. When an insulator containing oxygen is provided in contact with the semiconductor 114, oxygen vacancies in the semiconductor 114 can be reduced, leading to an improvement in the reliability of the transistor. A material similar to that for the insulator 113 may be used for the insulator 116. The insulator 116 may have a stacked-layer structure of a plurality of insulators.

In particular, in the case where an oxide semiconductor is used as the semiconductor 114 and the semiconductor 117, the insulator 116 is preferably an insulator including a region containing oxygen released by heating. The insulator 116 may have a stacked-layer structure of a plurality of insulators. For example, in the case where an oxide semiconductor is used as the semiconductor 114 and the semiconductor 117, the insulator 116 may have a three-layer structure of silicon oxide or silicon oxynitride, hafnium oxide or aluminum oxide, and silicon oxide or silicon oxynitride. That is, a structure may be employed in which one layer of hafnium oxide or aluminum oxide is sandwiched between two layers of silicon oxide or silicon oxynitride. Note that the insulator 116 may have a stacked-layer structure of two layers or a stacked-layer structure of four or more layers.

Oxygen adding treatment may be performed after the formation of the insulator 116 (see FIG. 20A).

Next, the semiconductor 117 is formed along the side surface of the opening 131 (see FIG. 20B). The surface of the insulator 116 exposed in the opening 131 is covered with the semiconductor 117. In the case where an oxide semiconductor is used as the semiconductor 117, oxygen adding treatment may be performed as in the case where an oxide semiconductor is used as the semiconductor 114.

Figure 21A:
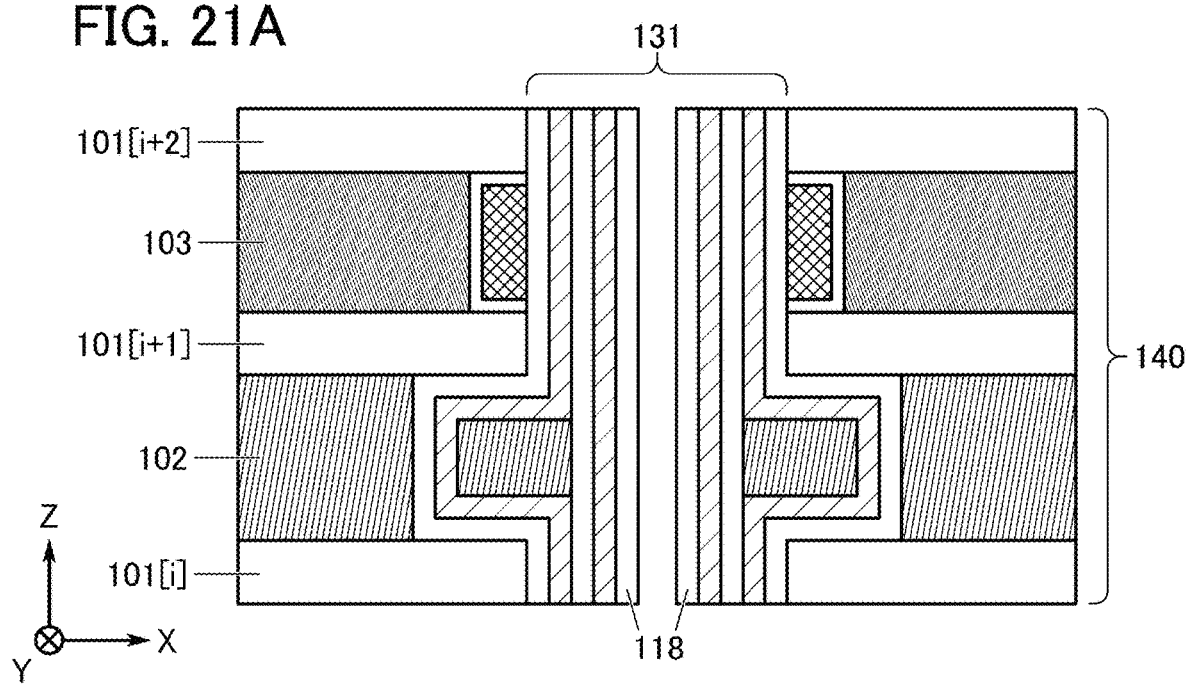
FIG. 21A and FIG. 21B are cross-sectional views illustrating a method for manufacturing a memory cell.

Next, the insulator 118 is formed along the side surface of the opening 131 (see FIG. 21A). The surface of the semiconductor 117 exposed in the opening 131 is covered with the insulator 118. In the case where an oxide semiconductor is used as the semiconductor 117, silicon oxide, silicon oxynitride, or the like is used as appropriate as the insulator 118, for example. When an insulator containing oxygen is provided in contact with the semiconductor 117, oxygen vacancies in the semiconductor 117 can be reduced, leading to an improvement in the reliability of the transistor. A material similar to that for the insulator 113 or the insulator 116 may be used for the insulator 118.

The insulator 118 may have a stacked-layer structure of a plurality of insulators. In the case where an oxide semiconductor is used as the semiconductor 117, among the plurality of insulators included in the insulator 118, the insulator in contact with the semiconductor 117 is preferably an insulator including a region containing oxygen released by heating. As the insulator in contact with the conductor 119, the insulator having a function of inhibiting passage of oxygen is preferably used. For example, as the insulator in contact with the semiconductor 117 among the plurality of insulators included in the insulator 118, silicon oxide or silicon oxynitride may be used. As the insulator in contact with the conductor 119 among the plurality of insulators included in the insulator 118, hafnium oxide or aluminum oxide may be used.

Alternatively, the insulator 118 may be a stack of silicon oxide or silicon oxynitride, aluminum oxide, and silicon nitride, for example. In the case where silicon nitride is used for the insulator 118, silicon nitride that contains a small amount of hydrogen is preferably used.

Figure 21B:
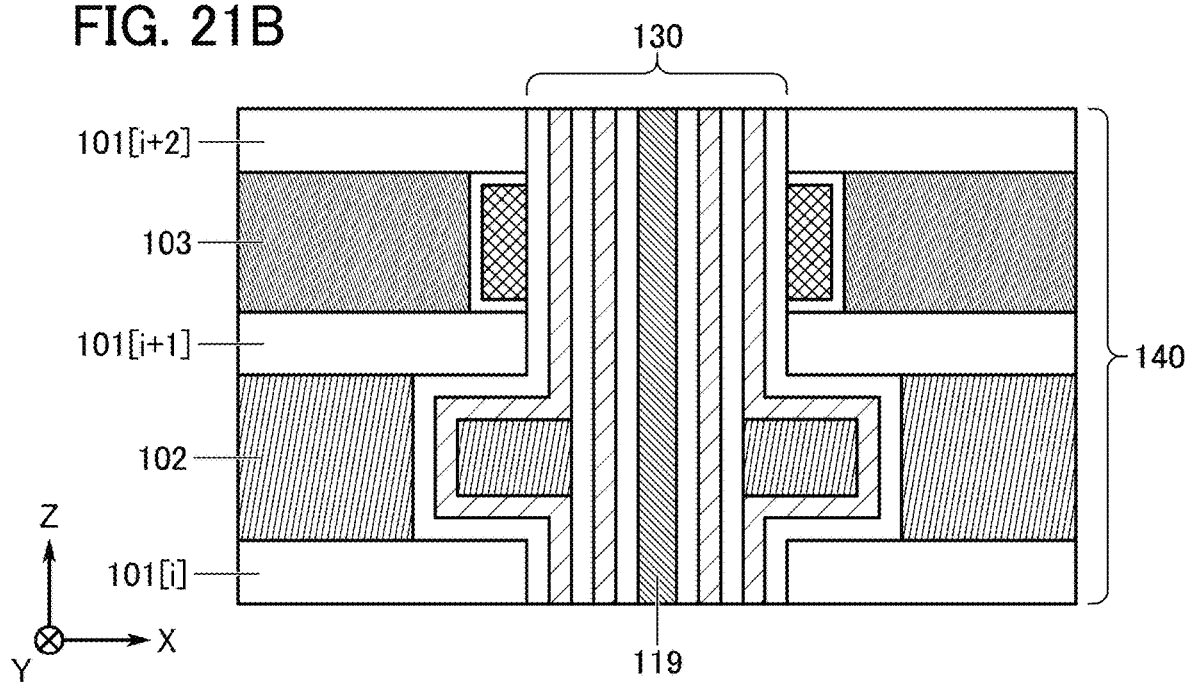

Next, the conductor 119 is formed after the formation of the insulator 118 (see FIG. 21B). In this embodiment, tungsten is used as the conductor 119. Note that the conductor 119 may have a stacked-layer structure of a plurality of conductors. Among the plurality of conductors included in the conductor 119, the conductor in contact with the insulator 118 is preferably formed using a conductive material that is not easily oxidized. For example, in the conductor 119, the conductor in contact with the insulator 118 may be titanium nitride. For example, the conductor 119 may be a stack of titanium nitride and tungsten.

Figure 22A:
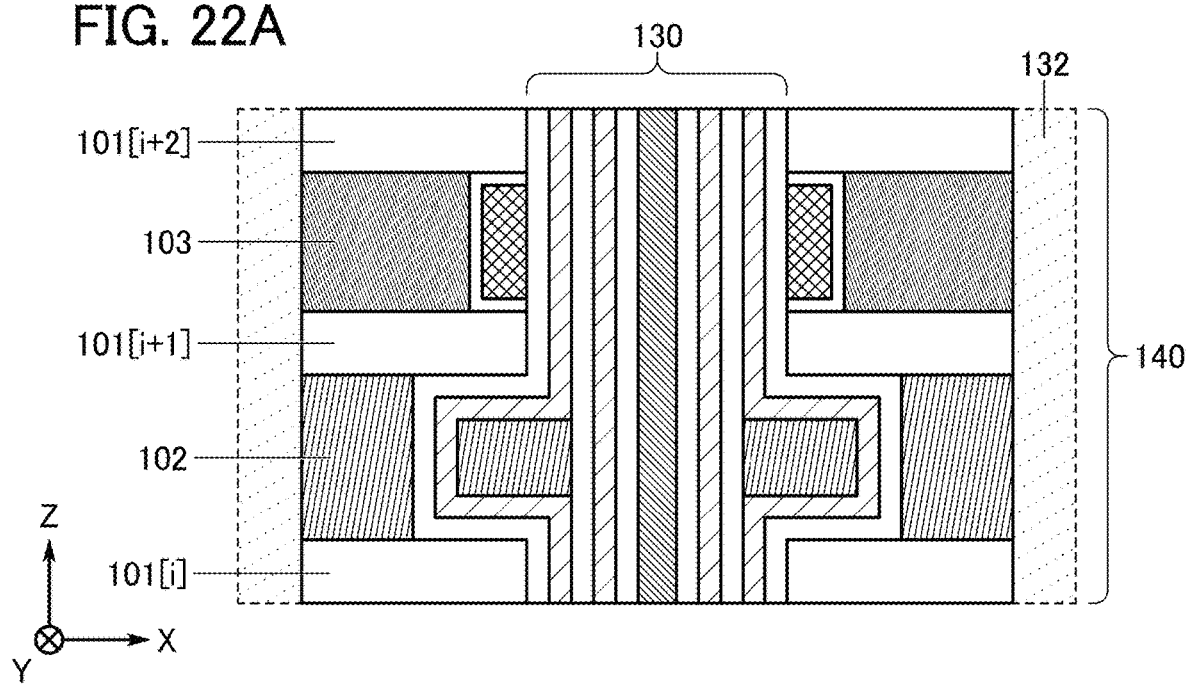
FIG. 22A and FIG. 22B are cross-sectional views illustrating a method for manufacturing a memory cell.

In the above manner, the structure body 130 is formed in the opening 131. Next, part of the stack 140 in a region that does not overlap with the structure body 130 when seen from the Z direction is removed, whereby a region 132 is formed (see FIG. 22A). The region 132 can be formed by a method similar to that for the opening 131. In the region 132, the side surfaces of the insulator 101, the conductor 102, and the conductor 103 are exposed.

Figure 22B:
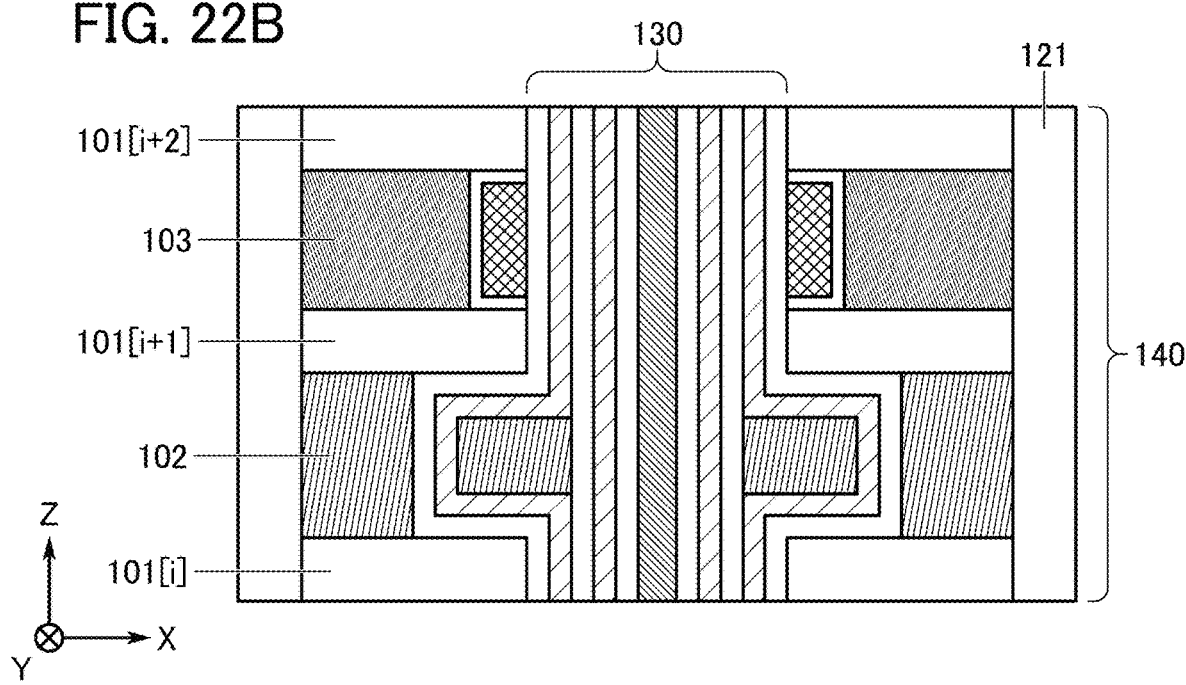

Next, the insulator 121 that covers the side surfaces of the insulator 101, the conductor 102, and the conductor 103, which are exposed, is formed (see FIG. 22B). An insulating material having a function of inhibiting passage of impurities such as water and hydrogen is preferably used for the insulator 121, for example. For the insulator 121, aluminum oxide or the like is used, for example.

Note that the insulator 121 may have a stacked-layer structure of a plurality of insulators. For example, the insulator 121 may be a stack of hafnium oxide and silicon oxynitride. Among the plurality of insulators included in the insulator 121, the insulator that has a function of inhibiting passage of oxygen is preferably used as the insulator in contact with the conductor 102 and the conductor 103.

In the above manner, the memory cell 100 can be manufactured.

This embodiment can be implemented in an appropriate combination with the structures described in the other embodiments and the like.

Embodiment 2

In this embodiment, a circuit structure example and an operation method example of a semiconductor device 300 including a plurality of memory strings 200 will be described with reference to drawings.

<Circuit Structure Example>

A circuit structure of the semiconductor device 300 is described with reference to FIG. 23. The semiconductor device 300 includes m memory strings 200. In this embodiment and the like, the first memory string 200 is denoted as a memory string 200[1] and the m-th memory string 200 is denoted as a memory string 200[m] (m is an integer of 1 or more). Moreover, the j-th memory string 200 is denoted as a memory string 200[j] (j is an integer greater than or equal to 1 and less than or equal to m).

As described in the above embodiment, the memory strings 200 each include the n memory cells 100. FIG. 23 illustrates the memory cells 100 each having the circuit structure illustrated in FIG. 4A; alternatively, the memory cells 100 may each have the circuit structure illustrated in any of FIG. 4B, FIG. 4C, FIG. 5A, and FIG. 5B. In this embodiment and the like, the k-th (k is an integer greater than or equal to 1 and less than or equal to n) memory cell 100 included in the j-th memory string 200 is denoted as a memory cell 100[k,j].

Figure 23:
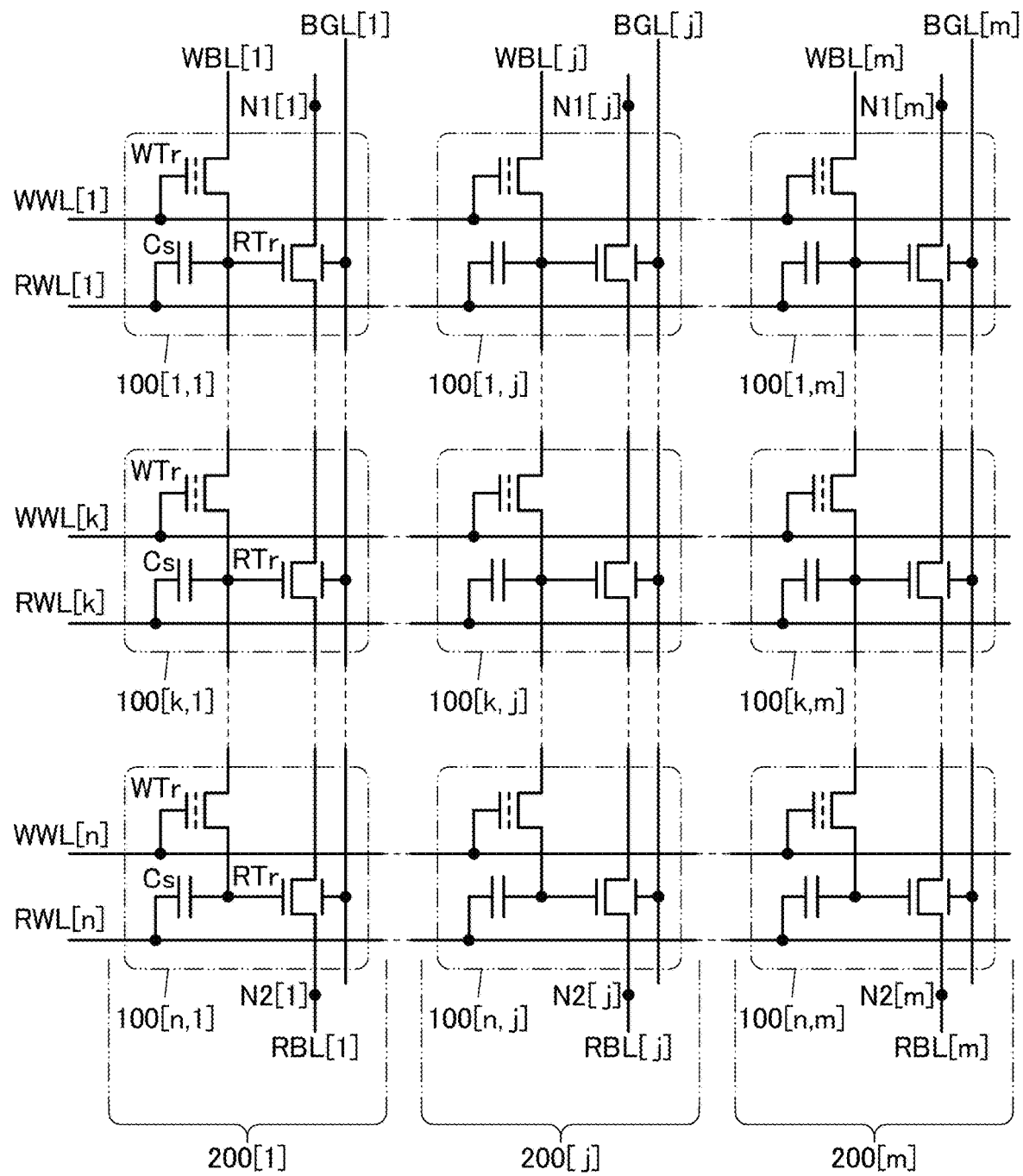
FIG. 23 is a circuit diagram of a semiconductor device.

The semiconductor device 300 illustrated in FIG. 23 includes n wirings WWL, n wirings RWL, m wirings WBL, m wirings RBL, and m wirings BGL. In this embodiment and the like, the k-th wiring WWL and the k-th wiring RWL are denoted as a wiring WWL[k] and a wiring RWL[k]. The j-th wiring WBL, the j-th wiring RBL, and the j-th wiring BGL are denoted as a wiring WBL[j], a wiring RBL[j], and a wiring BGL[j].

A wiring WWL[1] is electrically connected to the gate (the conductor 103) of the transistor WTr included in each of the memory cell 100[1,1] to the memory cell 100[1,m]. The wiring WWL[k] is electrically connected to the gate (the conductor 103) of the transistor WTr included in each of the memory cell 100[k,1] to the memory cell 100[k,m]. A wiring WWL[n] is electrically connected to the gate (the conductor 103) of the transistor WTr included in each of the memory cell 100[n,1] to the memory cell 100[n,m].

A wiring RWL[1] is electrically connected to the capacitor Cs included in each of the memory cell 100[1,1] to the memory cell 100[1,m]. The wiring RWL[k] is electrically connected to the capacitor Cs included in each of the memory cell 100[k,1] to the memory cell 100[k,m]. A wiring RWL[n] is electrically connected to the capacitor Cs included in each of the memory cell 100[n,1] to the memory cell 100[n,m]. The wiring RWL is electrically connected to the gate (the conductor 115) of the transistor RTr through the capacitor Cs.

A wiring WBL[1] is electrically connected to one of the source and the drain (the semiconductor 114) of the transistor WTr included in the memory cell 100[n,1]. The wiring WBL[j] is electrically connected to one of the source and the drain (the semiconductor 114) of the transistor WTr included in the memory cell 100[n,j]. A wiring WBL[m] is electrically connected to one of the source and the drain (the semiconductor 114) of the transistor WTr included in the memory cell 100[n,m].

A wiring RBL[1] is electrically connected to one of the source and the drain (the semiconductor 117) of the transistor RTr included in the memory cell 100[1,1]. The wiring RBL[j] is electrically connected to one of the source and the drain (the semiconductor 117) of the transistor RTr included in the memory cell 100[1,j]. A wiring RBL[m] is electrically connected to one of the source and the drain (the semiconductor 117) of the transistor RTr included in the memory cell 100[1,m].

A wiring BGL[1] is electrically connected to the back gate (the conductor 119) of the transistor RTr included in each of the memory cell 100[1,1] to the memory cell 100[n,1]. The wiring BGL[j] is electrically connected to the back gate (the conductor 119) of the transistor RTr included in each of the memory cell 100[1,j] to the memory cell 100[n,j]. A wiring BGL[m] is electrically connected to the back gate (the conductor 119) of the transistor RTr included in each of the memory cell 100[1,m] to the memory cell 100[n,m].

The wiring WWL functions as a writing word line, the wiring RWL functions as a reading word line, the wiring WBL functions as a writing bit line, and the wiring RBL functions as a reading bit line.

In the memory string 200[1] illustrated in FIG. 23, a region electrically connected to the other of the source and the drain of the transistor RTr included in the memory cell 100[1,1] is denoted as a node N1[1], and a region electrically connected to the one of the source and the drain of the transistor RTr included in the memory cell 100[n,1] is denoted as a node N2[1]. Similarly, the node N1 and the node N2 in the memory string 200[j] are denoted as a node N1[j] and a node N2[j]. The node N1 and the node N2 in the memory string 200[m] are denoted as a node N1[m] and a node N2[m].

<Operation Method Example>

Next, an example of the operation method for the semiconductor device 300 illustrated in FIG. 23 will be described. In this embodiment, an operation example of writing data to the memory cell 100 included in the memory string 200[1] and an operation example of reading data therefrom will be described.

Note that in the following description, a low-level potential (Low) and a high-level potential (High) do not represent any particular potentials, and specific potentials may vary depending on wirings. For example, a low-level potential and a high-level potential applied to the wiring WWL may be different from a low-level potential and a high-level potential applied to the wiring RWL.

In this operation method example, the wiring BGL has previously been applied with a potential in a range where the transistor RTr and the transistor WTr operate normally.

Figure 25A:
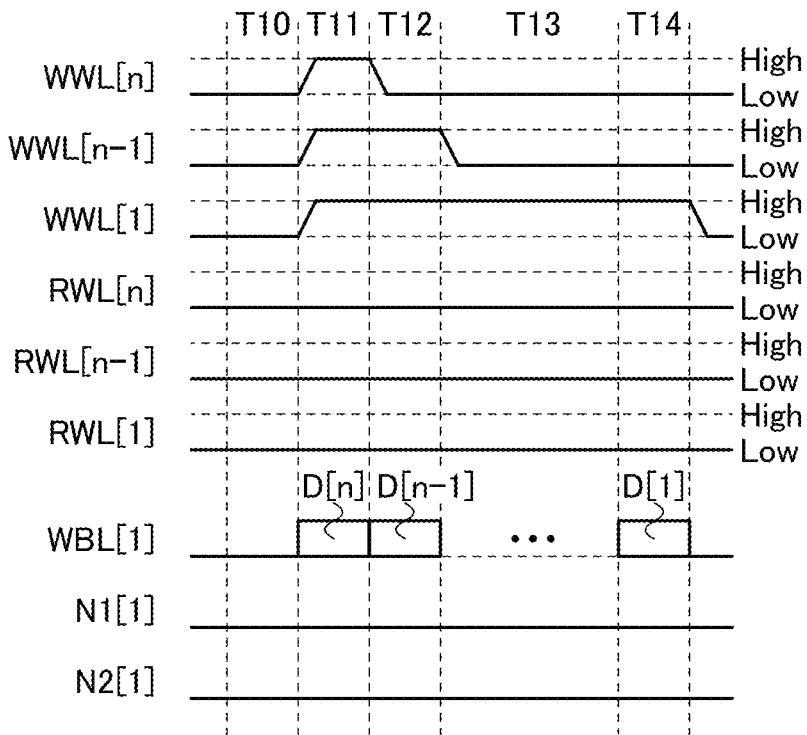
FIG. 25A and FIG. 25B are timing charts showing an operation example of a semiconductor device.
Figure 25B:
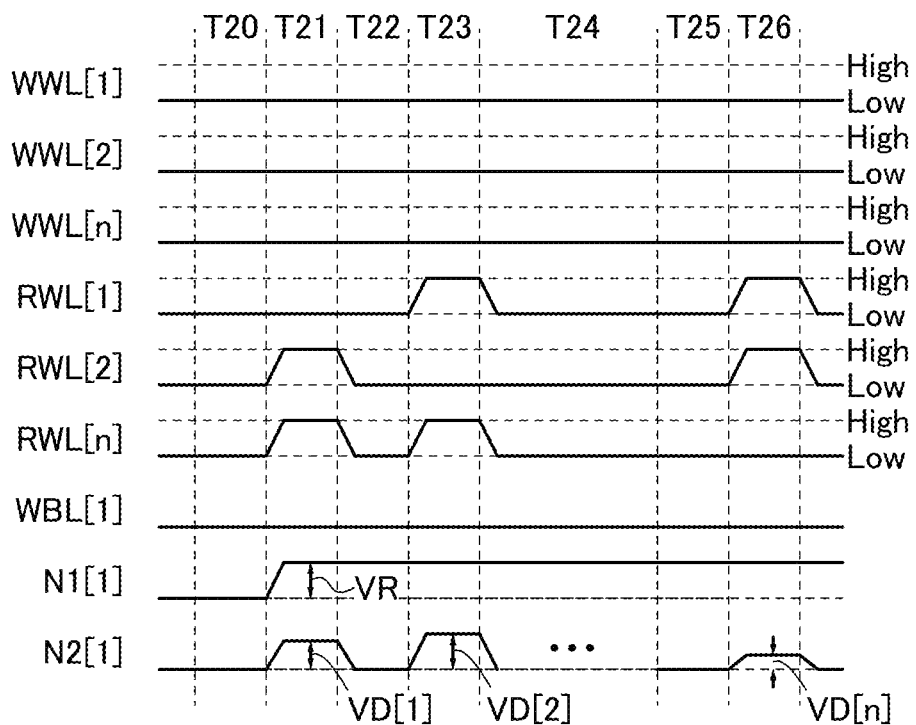

FIG. 25A is a timing chart showing an operation example of writing data to the memory string 200[1], and FIG. 25B is a timing chart showing an operation example of reading data from the memory string 200[1]. The timing charts shown in FIG. 25 show changes in potential level of the wiring WWL[1], the wiring WWL[2], the wiring WWL[n−1], the wiring WWL[n], the wiring RWL[1], the wiring RWL[2], the wiring RWL[n−1], the wiring RWL[n], the node N1[1], and the node N2[1]. As for the wiring WBL[1], data supplied to the wiring WBL[1] is shown.

FIG. 25A shows an example of writing data D[1] to data D[n] to the respective memory cells 100[1,1] to 100[n,1]. Note that the data D[1] to the data D[n] can be binary data or multilevel data. The data D[1] to the data D[n] are supplied from the wiring WBL[1].

Data writing to the memory string 200[1] is sequentially performed from the memory cell 100[n,1] to the memory cell 100[1,1]. Writing data to the memory cell 100[2,1] after writing data to the memory cell 100[1,1] would cause loss of data retained in the memory cell 100[1,1] at the stage of writing data to the memory cell 100[2,1]. For that reason, the operation of reading the data written to the memory cell 100[1,1] once and saving the data at another place is required.

To write data to the memory cell 100[k,1] in the circuit structure of the memory string 200, a low-level potential is supplied to the wiring WWL[n] to the wiring WWL[k+1] so that the transistors WTr included in the memory cell 100[n,1] to the memory cell 100[k+1,1] are turned off, in order to prevent rewriting of data retained in the memory cell 100[n,1] to the memory cell 100[k+1,1]. Thus, the data retained in each of the memory cell 100[n,1] to the memory cell 100[k+1,1] can be protected.

Moreover, when data is written to the memory cell 100[k,1], the data is supplied from the wiring WBL[1]; hence, a high-level potential is supplied to the wiring WWL[1] to the wiring WWL[k] so that the transistors WTr included in the memory cell 100[1,1] to the memory cell 100[k,1] are sufficiently turned on. Consequently, the data can be retained in the storage node of the memory cell 100[k,1].

When data is written to the memory cell 100[1,1] to the memory cell 100[n,1], the wiring RBL[1] can be controlled independently and thus is not necessarily set to a particular potential. For example, the potential of the wiring RBL[1] is set to a low-level potential. The potentials of the node N1[1] and the node N2[1] are each set to a low-level potential.

On the basis of the above description, an operation method example of the semiconductor device 300 will be described.

<<Charge-Injection Operation>>

Figure 24:
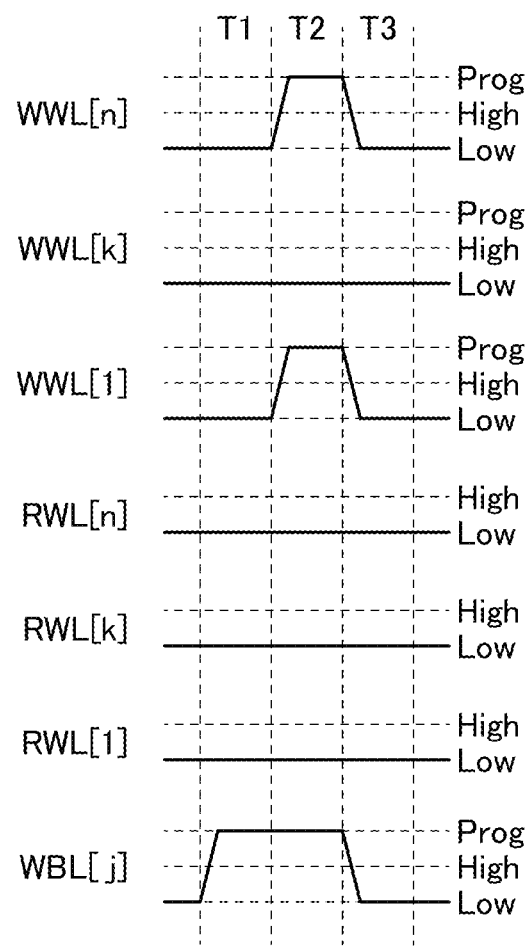
FIG. 24 is a timing chart showing an operation example of a semiconductor device.

An example of charge-injection operation is described with reference to a timing chart in FIG. 24. First, an operation example in which charge is injected into the functional body 112 to increase the threshold voltage of the transistor WTr is described. In this embodiment, operation for injecting charge into the functional body 112 in the transistor WTr included in the memory cell 100[k,j] is described.

In a period T1, a program potential (Prog) is supplied to the wiring WBL[j]. The program potential is higher than a high-level potential.

In a period T2, the program potential is supplied to the wirings WWL other than the wiring WWL[k]. A low-level potential is supplied to the wiring WWL[k]. Then, charge is injected into the functional body 112 from the wiring WWL[k] through the insulator 111.

In a period T3, a low-level potential is supplied to the wirings WWL and the wiring WBL. The wiring RWL[1] to the wiring RWL[n], which may have any potential during the charge-injection operation, are supplied with a low-level potential in this embodiment.

In the above manner, charge can be injected into the functional body 112 from the wiring WWL side. The charge-injection operation is performed at the initial startup of the semiconductor device 300. Note that the charge-injection operation may be performed every time the semiconductor device 300 is started up or at certain intervals. Injecting charge into the functional body 112 to increase the threshold voltage of the transistor WTr enables the transistor WTr to be a normally-off transistor. For example, when the transistor RTr is a normally-on transistor, the normally-off transistor and the normally-on transistor can be separately formed in the memory cell 100.

<<Writing Operation>>

An example of writing operation is described with reference to a timing chart in FIG. 25A. In a period T10, the potentials of the wiring WWL[1] to the wiring WWL[n], the wiring RWL[1] to the wiring RWL[n], the wiring WBL[1], the node N1[1], and the node N2[1] are each a low-level potential.

In a period T11, a high-level potential is supplied to the wiring WWL[1] to the wiring WWL[n]. Thus, the transistors WTr included in the memory cell 100[1,1] to the memory cell 100[n,1] are sufficiently turned on. The data D[n] is supplied to the wiring WBL[1]. Since the transistors WTr included in the memory cell 100[1,1] to the memory cell 100[n,1] are sufficiently turned on, the data D[n] is supplied to the storage node of the memory cell 100[n,1].

In a period T12, a low-level potential is supplied to the wiring WWL[n], and the high-level potential is continuously supplied to the wiring WWL[n-1] to the wiring WWL[1]. Thus, the transistor WTr included in the memory cell 100[n,1] is turned off and the transistors WTr included in the memory cell 100[n-1,1] to the memory cell 100[1,1] remain on. The data D[n-1] is supplied to the wiring WBL[1]. Since the transistors WTr included in the memory cell 100[n-1,1] to the memory cell 100[1,1] are sufficiently turned on, the data D[n-1] is supplied to the storage node of the memory cell 100[n-1,1]. Furthermore, since the transistor WTr included in the memory cell 100[n,1] is off, the data D[n] written to the memory cell 100[n,1] in the period T11 is retained.

In a period T13, as in the period T11 and the period T12, the data D[n-2] to the data D[2] are sequentially written to the memory cell 100[n-2,1] to the memory cell 100[2,1].

Specifically, the transistors WTr included in the memory cell 100[n,1] to the memory cell 100[k+1,1] to which the data has been written are turned off, the transistors WTr included in the memory cell 100[k,1] to the memory cell 100[1,1] to which the data has not been written yet are sufficiently turned on, and the data D[k] is supplied from the wiring WBL and written to the storage node of the memory cell 100[k,1]. After writing of the data D[k] to the memory cell 100[k,1] ends, the transistor WTr included in the memory cell 100[k,1] is turned off. Then, the data D[k-1] is supplied from the wiring WBL[1] and written to the storage node of the memory cell 100[k-1,1].

Note that the writing operation in the case where k is 1 is described in a period T14. In the period T14, a low-level potential is supplied to the wiring WWL[n] to the wiring WWL[2], and the high-level potential is continuously supplied to the wiring WWL[1]. Thus, the transistors WTr included in the memory cell 100[n,1] to the memory cell 100[2,1] are turned off and the transistor WTr included in the memory cell 100[1,1] remains on. The data D[1] is supplied to the wiring WBL[1]. Since the transistor WTr included in the memory cell 100[1,1] is sufficiently on, the data D[1] reaches and is written to the storage node of the memory cell 100[1,1]. Since the transistors WTr in the memory cell 100[n,1] to the memory cell 100[2,1] are off, the data D[n] to the data D[2] stored in the respective memory cells 100[n,1] to 100[2,1] are retained.

In this manner, data can be written to the memory cell 100[1,1] to the memory cell 100[n,1].

This embodiment describes the writing operation with the focus on the memory string 200[1]; in the circuit structure of the semiconductor device 300, when a high-level potential is supplied to the wiring WWL[k], the transistors WTr electrically connected to the wiring WWL[k] are all turned on. Thus, data writing to the memory string 200[2] to the memory string 200[m] is performed concurrently with data writing to the memory string 200[1].

The memory cell 100 described in this embodiment is an OS memory. Accordingly, the semiconductor device 300 including the memory cells 100 does not require erase operation before data rewriting and achieves fast writing operation.

When data is written to (rewritten in) the memory cell 100 that is close to the wiring WBL, it is possible to skip data writing operation on the memory cells 100 farther from the wiring WBL than the targeted memory cell 100. For example, when data is written to (rewritten in) the memory cell 100[1,1], it is possible to skip data writing operation on the memory cell 100[2,1] to the memory cell 100[n,1]. When data is written to the memory cell 100[2,1] it is possible to skip data writing operation on the memory cell 100[3,1] to the memory cell 100[n,1].

Data that is rewritten frequently is stored in the memory cell 100 close to the wiring WBL, so that the data can be written (rewritten) in a shorter time. That is, the speed of writing (rewriting) data can be increased.

With such operation, the OS NAND (including 3D OS NAND) memory device can operate like a RAM.

<<Reading Operation>>

FIG. 25B shows an example in which the data D[1] to the data D[n] are read from the respective memory cells 100[1,1] to 100[n,1]. Here, the transistors WTr need to be off to maintain the data retained in the memory cells 100. For that reason, the potentials of the wiring WWL[1] to the wiring WWL[n] are each set to a low-level potential during the operation of reading the data from the memory cell 100[1,1] to the memory cell 100[n,1].

To read data in a specific memory cell 100 in the semiconductor device 300 having the circuit structure illustrated in FIG. 23, the transistor RTr included in the memory cell 100 subjected to reading is made to operate in the saturation region after the transistors RTr included in the other memory cells 100 are sufficiently turned on. That is, current flowing between the source and the drain of the transistor RTr included in the memory cell 100 subjected to reading is determined on the basis of the source-drain voltage and data retained in the memory cell 100 subjected to reading.

For example, the case where the data retained in the memory cell 100[k,1] is read out is considered. In the reading operation, a high-level potential is supplied to the wiring RWL[1] to the wiring RWL[n] except the wiring RWL[k] so that the transistors RTr included in the memory cell 100[1,1] to the memory cell 100[n,1] except the memory cell 100[k,1] are sufficiently turned on.

Meanwhile, the on state and the off state of the transistor RTr included in the memory cell 100[k,1] are switched in accordance with the data retained in the memory cell 100[k,1]; hence, the potential of the wiring RWL[k] needs to be the same as the one at the time of writing the data to the memory cell 100[k,1]. Here, the potential of the wiring RWL[k] in the writing operation and the reading operation is considered as a low-level potential.

For example, a potential of +3 V is supplied to the node N1[1], and a potential of 0 V is supplied to the node N2[1]. Then, the node N2[1] is brought into a floating state, and the potential of the node N2[1] is measured subsequently. When the potentials of the wiring RWL[1] to the wiring RWL[n] except the wiring RWL[k] are each set to a high-level potential, the transistors RTr included in the memory cell 100[1,1] to the memory cell 100[n,1] except the memory cell 100[k,1] are sufficiently turned on.

Meanwhile, the voltage between the source and the drain of the transistor RTr included in the memory cell 100[k,1] depends on the gate potential of the transistor RTr and the potential of the node N1[1]; hence, the potential of the node N2[1] is determined on the basis of the data retained in the storage node of the memory cell 100[k,1].

In the above manner, the data retained in the memory cell 100[k,1] can be read out.

In view of the above, an example of the reading operation is described with reference to the timing chart in FIG. 25B. In a period T20, the potentials of the wiring WWL[1] to the wiring WWL[n], the wiring RWL[1] to the wiring RWL[n], the wiring WBL, the node N1[1], and the node N2[1] are each set to a low-level potential. Specifically, the node N2[1] is in a floating state. The data D[1] to the data D[n] are retained in the storage nodes of the respective memory cells 100[1,1] to 100[n,1].

In a period T21, a low-level potential is supplied to the wiring RWL[1], and a high-level potential is supplied to the wiring RWL[2] to the wiring RWL[n]. Thus, the transistors RTr included in the memory cell 100[2,1] to the memory cell 100[n,1] are sufficiently turned on. The on state and the off state of the transistor RTr in the memory cell 100[1,1] are determined on the basis of the data D[1] retained in the storage node of the memory cell 100[1,1].

Moreover, a potential VR is supplied to the wiring RBL[1]. Thus, the potential of the node N1[1] becomes VR, and the potential of the node N2[1] is determined on the basis of the potential VR of the node N1[1] and the data retained in the storage node of the memory cell 100[1,1]. Here, the potential of the node N2[1] is denoted by VD[1]. By measurement of the potential VD[1] of the node N2[1], the data D[1] retained in the storage node of the memory cell 100[1,1] can be read out.

In a period T22, a low-level potential is supplied to the wiring RWL[1] to the wiring RWL[n]. A low-level potential is supplied to the node N2[1], and then the node N2[1] is in a floating state. That is, the potentials of the wiring RWL[1] to the wiring RWL[n] and the node N2[1] in the period T22 are the same as those in the period T20. Note that the wiring RBL[1] may be continuously supplied with the potential VR or may be supplied with a low-level potential. In this operation example, the wiring RBL[1] is continuously supplied with the potential VR after the period T21. Thus, the potential VR is continuously supplied to the node N1[1].

In a period T23, a low-level potential is supplied to the wiring RWL[2], and a high-level potential is supplied to the wiring RWL[1] and the wiring RWL[3] to the wiring RWL[n]. Thus, the transistors RTr included in the memory cell 100[1,1] and the memory cell 100[3,1] to the memory cell 100[n,1] are sufficiently turned on. The on state and the off state of the transistor RTr in the memory cell 100[2,1] are determined on the basis of the data D[2] retained in the storage node of the memory cell 100[2,1]. The potential VR is supplied to the wiring RBL[1]. Thus, the potential of the node N2[1] is determined on the basis of the potential VR of the node N1[1] and the data retained in the storage node of the memory cell 100[2,1]. Here, the potential of the node N2[1] is denoted by VD[2]. By measurement of the potential VD[2] of the node N2[1], the data D[2] retained in the storage node of the memory cell 100[2,1] can be read out.

In a period T24, the data D[3] to the data D[n−1] are sequentially read from the respective memory cells 100[3,1] to 100[n−1,1] in the same manner as the reading operation in the period T22 and the period T23.

Specifically, in the case where the data D[k] is read from the memory cell 100[k,1], the potential of the node N2[1] is set to a low-level potential and the node N2[1] is brought into a floating state, and then a high-level potential is supplied to the wiring RWL[1] to the wiring RWL[n] except the wiring RWL[k] so that the transistors RTr included in the memory cell 100[1,1] to the memory cell 100[n,1] except the memory cell 100[k,1] are sufficiently turned on and the transistor RTr included in the memory cell 100[k,1] is set to an on state corresponding to the data D[k]. Next, the potential of the node N1[1] is set to VR, whereby the potential of the node N2[1] becomes a potential corresponding to the data D[k]; by measurement of this potential, the data D[k] can be read out. After the data D[k] retained in the memory cell 100[k,1] is read out, as preparation for the next reading operation, a low-level potential is supplied to the wiring RWL[1] to the wiring RWL[n] to supply a low-level potential to the node N2[1], and then the node N2[1] is brought into a floating state.

In a period T25, a low-level potential is supplied to the wiring RWL[1] to the wiring RWL[n]. A low-level potential is supplied to the node N2[1], and then the node N2[1] is brought into a floating state. That is, the potentials of the wiring RWL[1] to the wiring RWL[n] and the node N2[1] in the period T25 are the same as those in the period T20.

In a period T26, a low-level potential is supplied to the wiring RWL[n], and a high-level potential is supplied to the wiring RWL[1] to the wiring RWL[n−1]. Thus, the transistors RTr included in the memory cell 100[1,1] to the memory cell 100[n−1,1] are sufficiently turned on. The transistor RTr in the memory cell 100[n,1] becomes an on state corresponding to the data D[n] retained in the storage node of the memory cell 100[n,1]. The potential VR is continuously supplied to the wiring RBL[1]. Accordingly, the potential of the node N2[1] is determined on the basis of the potential VR of the node N1[1] and the data retained in the storage node of the memory cell 100[n,1]. Here, the potential of the node N2[1] is denoted by VD[n]. By measurement of the potential VD[n] of the node N2[1], the data D[n] retained in the storage node of the memory cell 100[n,1] can be read out.

In this manner, the data retained in the memory cell 100[1,1] to the memory cell 100[n,1] can be read out.

This embodiment describes the reading operation with the focus on the memory string 200[1]; in the circuit structure of the semiconductor device 300, data reading from the memory string 200[2] to the memory string 200[m] can be performed concurrently with data reading from the memory string 200[1]. By turning off the transistor WTr, data retained in the storage node is not corrupted during the data reading operation. Thus, only data included in the given memory string 200 can be read out.

<Structure Examples of Semiconductor Device>

Next, structure examples of the semiconductor device 300 will be described.

Figure 26A:
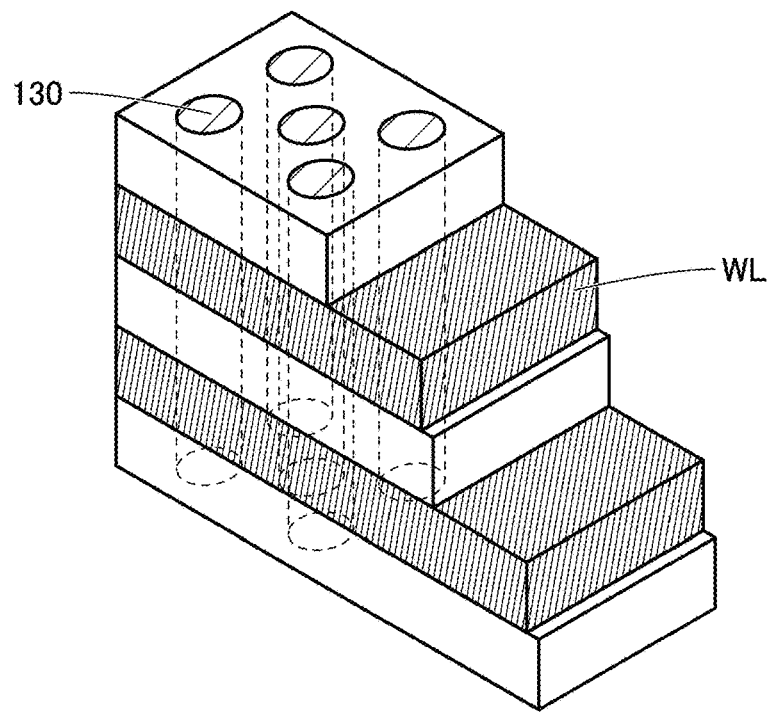
FIG. 26A is a perspective view illustrating a structure example of a semiconductor device.
Figure 26B:
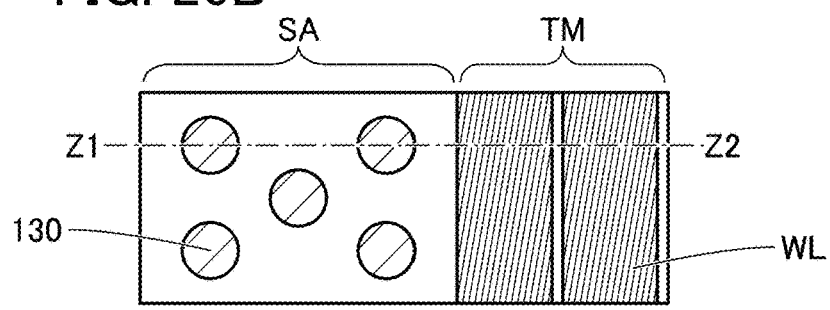
FIG. 26B is a top view illustrating a structure example of the semiconductor device.
Figure 26C:
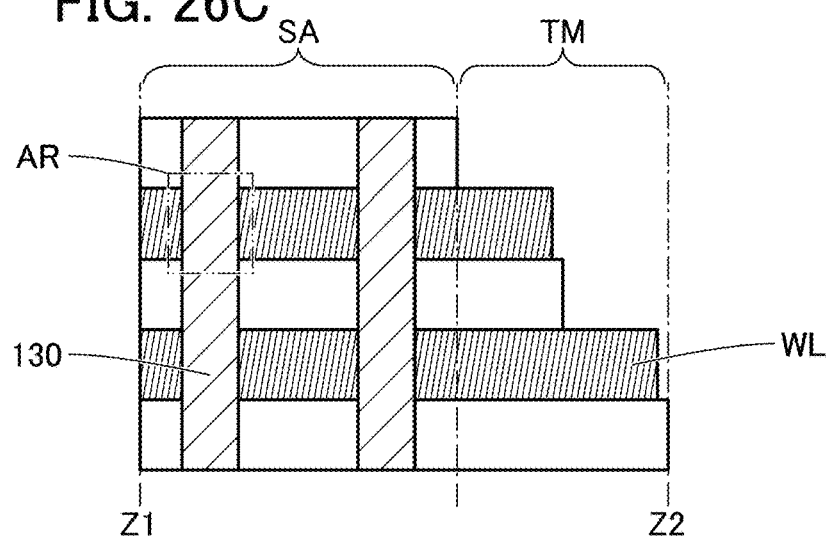
FIG. 26C is a cross-sectional view illustrating a structure example of the semiconductor device.

FIG. 26A to FIG. 26C are examples of schematic views illustrating part of the semiconductor device 300. FIG. 26A is a perspective view of part of the semiconductor device, and FIG. 26B is a top view of part of the semiconductor device. FIG. 26C is a cross-sectional view along the dashed-dotted line Z1-Z2 in FIG. 26B.

The semiconductor device includes a structure body in which wirings WL (the wirings WWL or the wirings RWL) and insulators (regions without a hatching pattern in FIG. 26A to FIG. 26C) are stacked.

An opening portion is formed in the structure body to penetrate the insulators and the wirings WL altogether. To provide the memory cell 100 in a region AR that penetrates the wiring WL, the structure body 130 is formed in the opening portion.

In FIG. 26A, the structure bodies 130 included inside the structure body are denoted by dashed lines. A region where the structure bodies 130 are formed is referred to as a region SA. The memory strings 200 are formed along the structure bodies 130; thus, the memory strings 200 are formed in the region SA.

A region TM where the wiring WL is exposed functions as a connection terminal for supplying a potential to the wiring WL. That is, by electrically connecting the wiring WL and a wiring in the region TM, a potential can be supplied to the gate of the transistor included in the memory cell 100. Note that the wiring WL corresponds to the conductor 103 or the conductor 102.

Note that the shape of the region TM is not limited to that in the structure example illustrated in FIG. 26A to FIG. 26C. The structure of the semiconductor device 300 of one embodiment of the present invention may be, for example, a structure in which an insulator is formed over the region TM, an opening portion is provided in the insulator, and a conductor PG is formed to fill the opening portion, as illustrated in FIG. 27A to FIG. 27C.

Figure 27A:
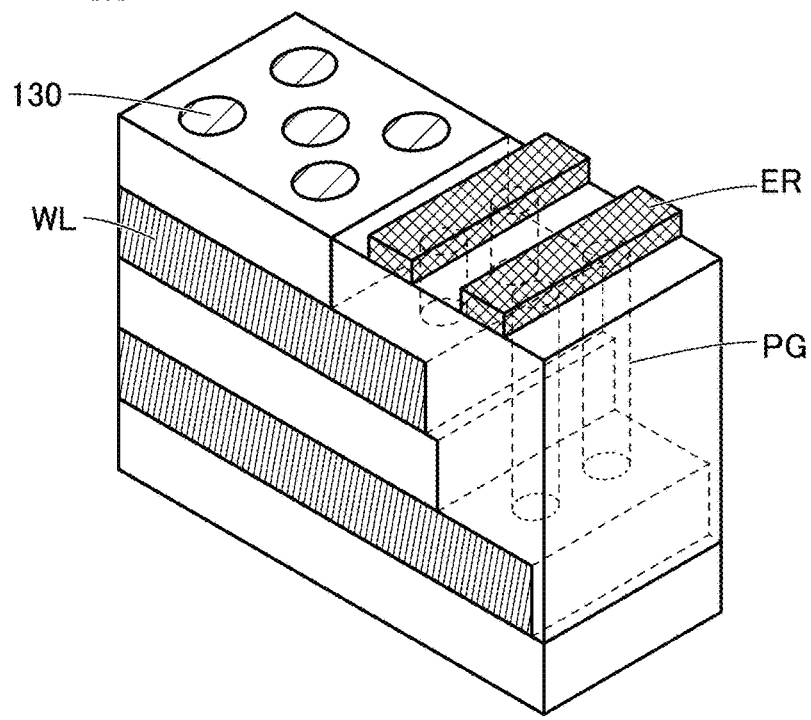
FIG. 27A is a perspective view illustrating a structure example of a semiconductor device.
Figure 27B:
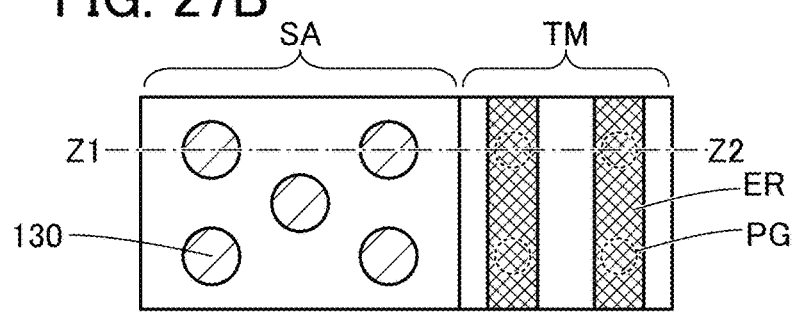
FIG. 27B is a top view illustrating a structure example of the semiconductor device.
Figure 27C:
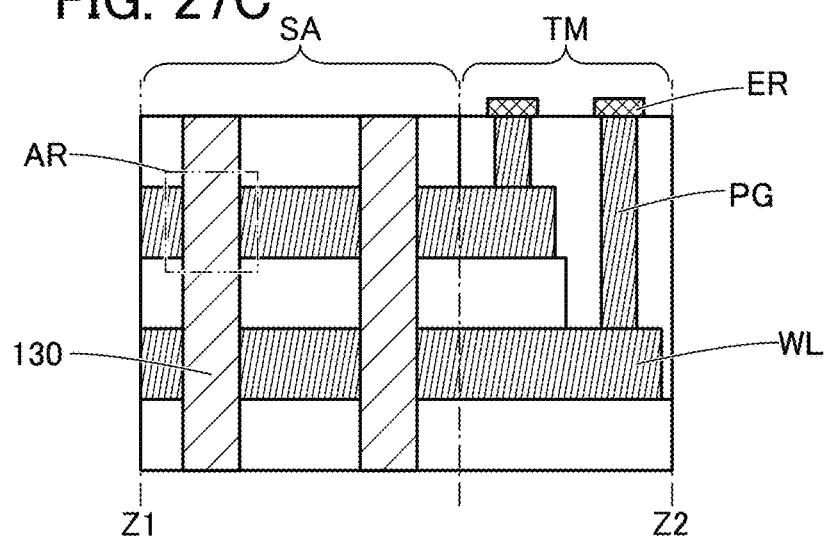
FIG. 27C is a cross-sectional view illustrating a structure example of the semiconductor device.

FIG. 27A is a perspective view of part of the semiconductor device, and FIG. 27B is a top view of part of the semiconductor device. FIG. 27C is a cross-sectional view along the dashed-dotted line Z1-Z2 in FIG. 27B. A wiring ER is formed over the conductor PG, whereby the wiring ER and the wiring WL are electrically connected to each other. In FIG. 27A, the conductor PG provided inside the structure body is indicated by a dashed line.

<Example of Connection with Peripheral Circuit>

Figure 28A:
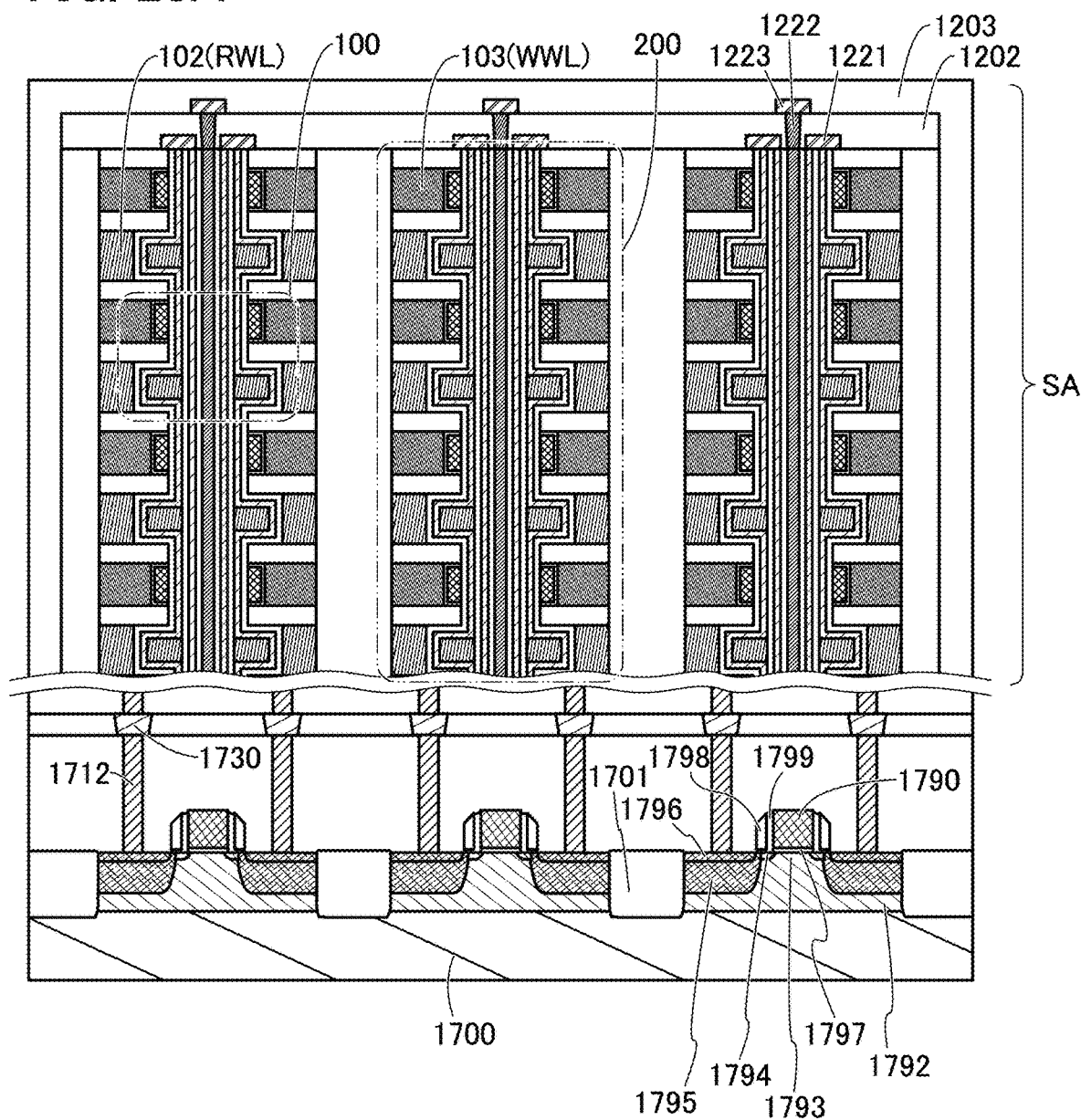
FIG. 28A and FIG. 28B are cross-sectional views illustrating a semiconductor device.
Figure 29A:
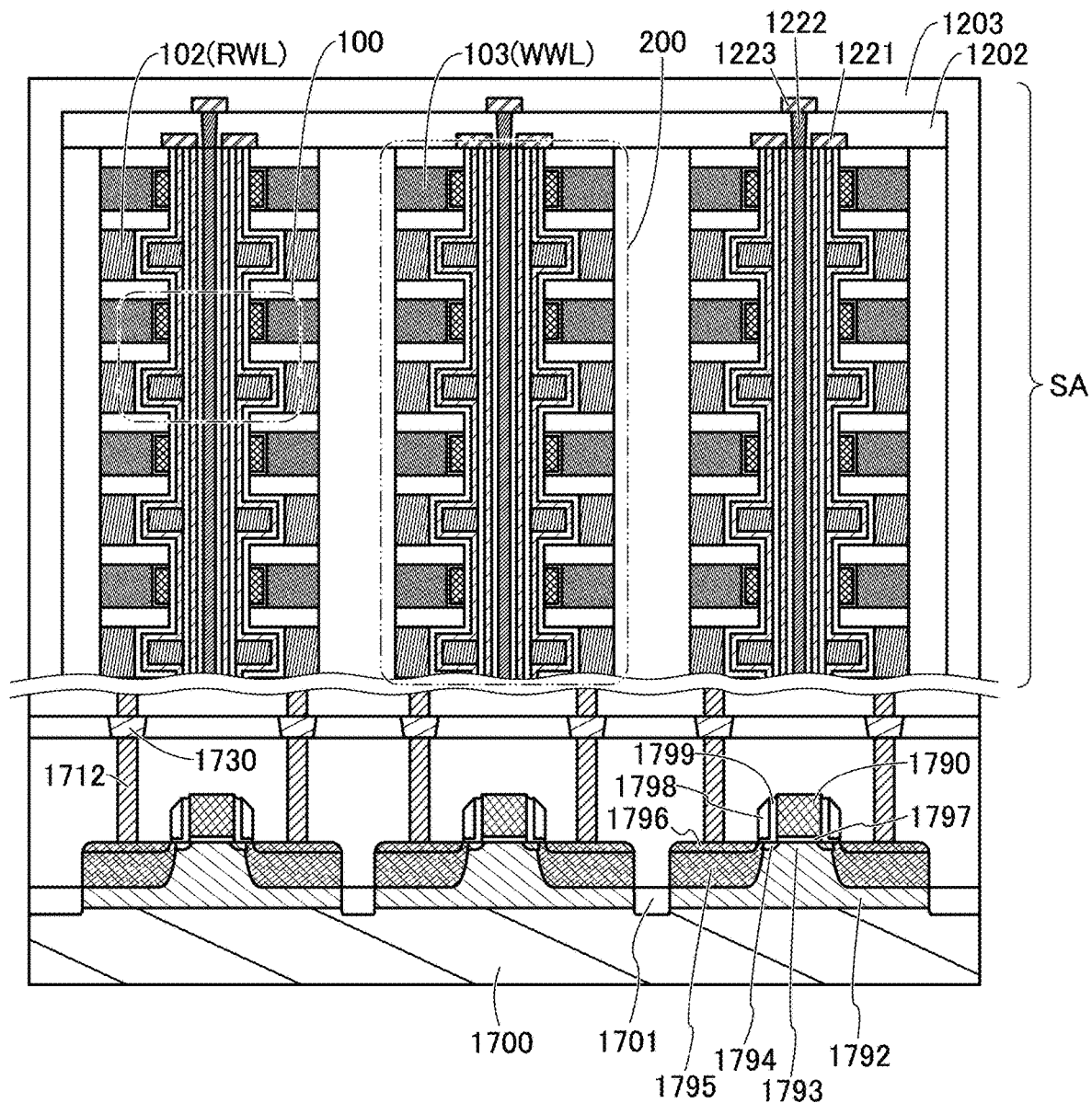
FIG. 29A and FIG. 29B are cross-sectional views illustrating a semiconductor device.

A peripheral circuit for a memory cell array, such as a read circuit or a precharge circuit, may be formed below the semiconductor device 300 of one embodiment of the present invention. In this case, Si transistors are formed on a silicon substrate or the like to configure the peripheral circuit, and then the semiconductor device 300 of one embodiment of the present invention is formed over the peripheral circuit. FIG. 28A is a cross-sectional view in which the peripheral circuit is composed of planar Si transistors and the semiconductor device 300 of one embodiment of the present invention is formed thereover. FIG. 29A is a cross-sectional view in which the peripheral circuit is composed of FIN-type Si transistors and the semiconductor device 300 of one embodiment of the present invention is formed thereover.

In FIG. 28A and FIG. 29A, the Si transistors configuring the peripheral circuit are formed on a substrate 1700. An element separation layer 1701 is provided between a plurality of Si transistors. Conductors 1712 are formed as a source and a drain of the Si transistor. A conductor 1730 extends in the channel width direction to be connected to another Si transistor or the conductor 1712 (not illustrated).

As the substrate 1700, any of the substrates described in the above embodiment can be used. For example, a single crystal semiconductor substrate or a polycrystalline semiconductor substrate of silicon or silicon carbide, a compound semiconductor substrate of silicon germanium, an SOI substrate, or the like can be used.

Alternatively, a glass substrate, a quartz substrate, a plastic substrate, a metal substrate, a flexible substrate, an attachment film, paper including a fibrous material, or a base film, for example, may be used as the substrate 1700. A semiconductor element may be formed using one substrate and then the semiconductor element may be transferred to another substrate. FIG. 28A and FIG. 29A illustrate examples in which a single crystal silicon wafer is used as the substrate 1700.

FIG. 28A and FIG. 29A illustrate a conductor 1221, a conductor 1222, a conductor 1223, and an insulator 1202 provided over the memory string 200 in the region SA. The conductor 1221 is electrically connected to, for example, the source or the drain of the transistor RTr that is positioned at an end portion of the memory string 200.

The insulator 1202 is provided to cover the conductor 1221. The conductor 1222 is provided to be embedded in the insulator 1202 in a region overlapping with the conductor 119. The conductor 1223 is provided above the insulator 1202 and is electrically connected to the conductor 119 through the conductor 1222.

In FIG. 28A and FIG. 29A, an insulator 1203 is formed to cover the conductor 1223, the insulator 1202, the memory string 200, and the like. As the insulator 1203, an insulator having a function of inhibiting passage of oxygen and impurities such as hydrogen is preferably used. When an insulator having a function of inhibiting passage of oxygen and impurities such as hydrogen is used as the insulator 1203, it is possible to inhibit diffusion of impurities from the outside (e.g., a water molecule, a hydrogen atom, a hydrogen molecule, an oxygen atom, an oxygen molecule, a nitrogen atom, a nitrogen molecule, and a nitrogen oxide molecule (such as $N_2O$, NO, and $NO_2$)) into the memory string 200.

Figure 28B:
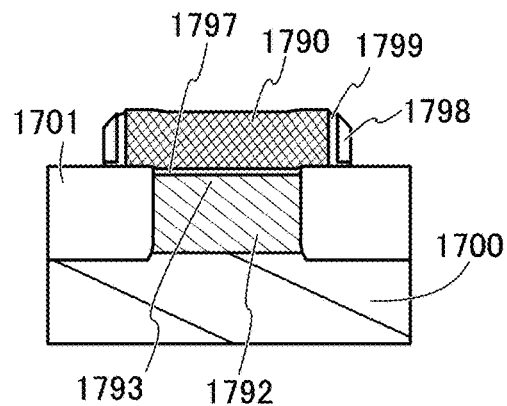

Here, the details of the Si transistor are described. FIG. 28A is a cross-sectional view of the planar Si transistor in the channel length direction, and FIG. 28B is a cross-sectional view of the planar Si transistor in the channel width direction. The Si transistor includes a channel formation region 1793 provided in a well 1792, low-concentration impurity regions 1794 and high-concentration impurity regions 1795 (also collectively referred to simply as impurity regions), conductive regions 1796 provided in contact with the impurity regions, a gate insulating film 1797 provided over the channel formation region 1793, a gate electrode 1790 provided over the gate insulating film 1797, and a sidewall insulating layer 1798 and a sidewall insulating layer 1799 provided on side surfaces of the gate electrode 1790. Note that the conductive regions 1796 may be formed using metal silicide or the like.

Figure 29B:
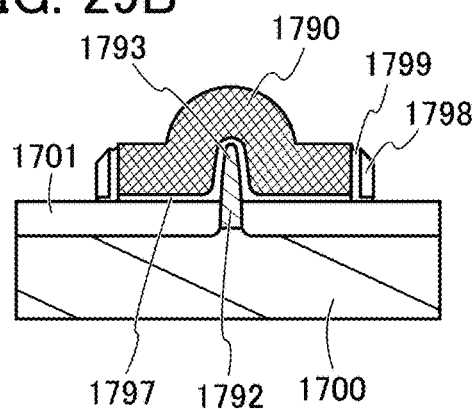

FIG. 29A is a cross-sectional view of the FIN-type Si transistor in the channel length direction, and FIG. 29B is a cross-sectional view of the FIN-type Si transistor in the channel width direction. In the Si transistor illustrated in FIG. 29A and FIG. 29B, the channel formation region 1793 has a projecting portion, and the gate insulating film 1797 and the gate electrode 1790 are provided along its side surface and top surface. Although the projecting portion is formed by processing of part of the semiconductor substrate in this embodiment, a semiconductor layer having a projecting shape may be formed by processing of an SOI substrate. Note that the reference numerals in FIG. 29A and FIG. 29B are the same as the reference numerals in FIG. 28A and FIG. 28B.

This embodiment can be implemented in an appropriate combination with the structures described in the other embodiments and the like.

Embodiment 3

In this embodiment, a semiconductor device 400 including a memory device or semiconductor device of one embodiment of the present invention will be described.

Figure 30:
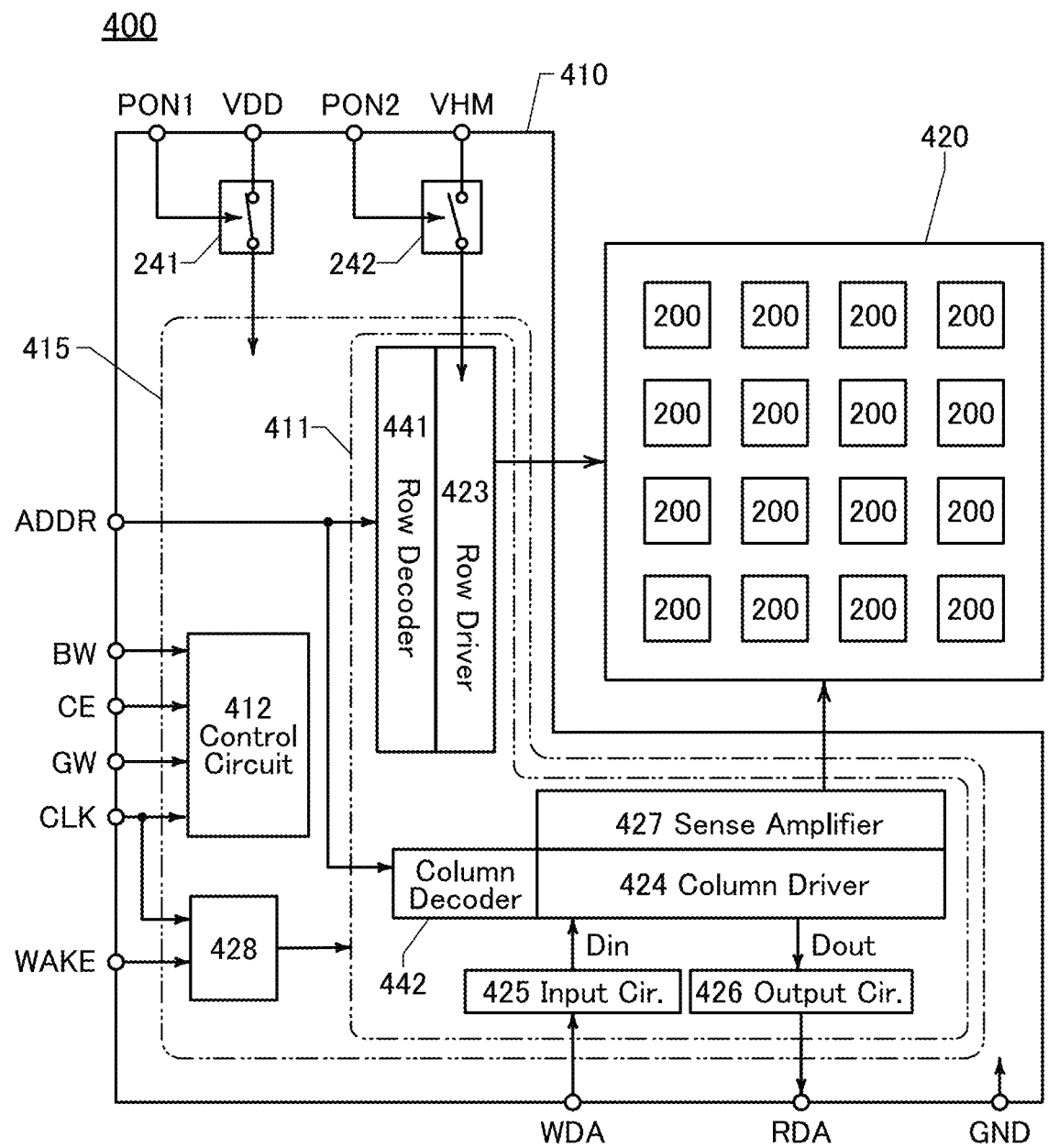
FIG. 30 is a block diagram illustrating a structure example of a semiconductor device.

FIG. 30 is a block diagram illustrating a structure example of the semiconductor device 400. The semiconductor device 400 illustrated in FIG. 30 includes a driver circuit 410 and a memory array 420. The memory array 420 includes one or more memory strings 200. FIG. 30 illustrates an example in which the memory array 420 includes a plurality of memory strings 200 arranged in a matrix.

The driver circuit 410 includes a PSW 241 (power switch), a PSW 242, and a peripheral circuit 415. The peripheral circuit 415 includes a peripheral circuit 411 (Row Decoder), a control circuit 412, and a voltage generation circuit 428.

In the semiconductor device 400, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signals BW and CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 412.

The control circuit 412 is a logic circuit having a function of controlling the overall operation of the semiconductor device 400. For example, the control circuit performs logic operation on the signal CE, the signal GW, and the signal BW to determine an operation mode of the semiconductor device 400 (e.g., writing operation or reading operation). Alternatively, the control circuit 412 generates a control signal for the peripheral circuit 411 so that the operation mode is executed.

The voltage generation circuit 428 has a function of generating a negative voltage. The signal WAKE has a function of controlling the input of the signal CLK to the voltage generation circuit 428. For example, when an H-level signal is applied as the signal WAKE, the signal CLK is input to the voltage generation circuit 428, and the voltage generation circuit 428 generates a negative voltage.

The peripheral circuit 411 is a circuit for writing and reading data to/from the memory string 200. The peripheral circuit 411 includes a row decoder 441, a column decoder 442, a row driver 423, a column driver 424, an input circuit 425 (Input Cir.), an output circuit 426 (Output Cir.), and a sense amplifier 427.

The row decoder 441 and the column decoder 442 have a function of decoding the signal ADDR. The row decoder 441 is a circuit for specifying a row to be accessed, and the column decoder 442 is a circuit for specifying a column to be accessed. The row driver 423 has a function of selecting the wiring WL specified by the row decoder 441. The column driver 424 has a function of writing data to the memory string 200, reading data from the memory string 200, and retaining the read data, for example.

The input circuit 425 has a function of retaining the signal WDA. Data retained in the input circuit 425 is output to the column driver 424. Data output from the input circuit 425 is data (Din) written to the memory string 200. Data (Dout) read from the memory string 200 by the column driver 424 is output to the output circuit 426. The output circuit 426 has a function of retaining Dout. Moreover, the output circuit 426 has a function of outputting Dout to the outside of the semiconductor device 400. The data output from the output circuit 426 is the signal RDA.

The PSW 241 has a function of controlling the supply of VDD to the peripheral circuit 415. The PSW 242 has a function of controlling the supply of VHM to the row driver 423. Here, in the semiconductor device 400, a high power supply voltage is VDD and a low power supply voltage is GND (ground potential). In addition, VHM is a high power supply voltage used for setting a word line to high level, and is higher than VDD. The on/off of the PSW 241 is controlled by the signal PON1, and the on/off of the PSW 242 is controlled by the signal PON2. The number of power domains to which VDD is supplied is one in the peripheral circuit 415 in FIG. 30 but can be more than one. In that case, a power switch is provided for each power domain.

Figure 31:
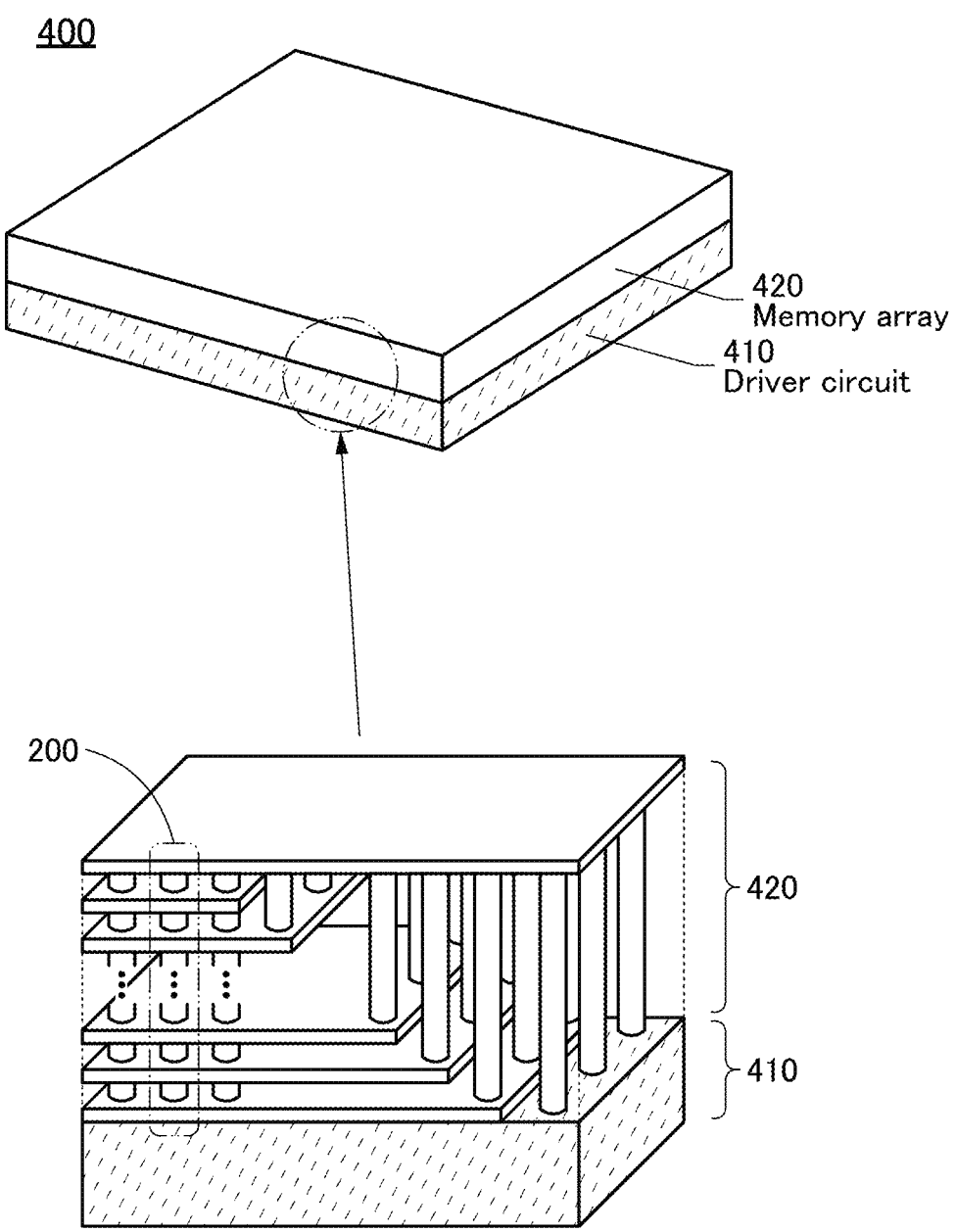
FIG. 31 is a diagram illustrating a structure example of a semiconductor device.

The driver circuit 410 and the memory array 420 included in the semiconductor device 400 may be provided on the same plane. As illustrated in FIG. 31, the driver circuit 410 and the memory array 420 may be provided to overlap with each other. When the driver circuit 410 and the memory array 420 are provided to overlap with each other, the signal propagation distance can be shortened. An enlarged perspective view of part of the semiconductor device 400 is also shown in FIG. 31.

In the semiconductor device 400, an arithmetic processing device such as a CPU (Central Processing Unit) or a GPU (Graphics Processing Unit) may be used as the control circuit 412 included in the driver circuit 410. With the use of a CPU and/or a GPU, for example, the semiconductor device 400 can have an arithmetic processing function.

As described above, the memory string 200 can function as a RAM. Thus, part of the memory array 420 can function as a main memory or a cache memory. Furthermore, as described above, the memory string 200 can function as a flash memory. Thus, part of the memory array 420 can function as a flash memory. The semiconductor device 400 of one embodiment of the present invention can function as a universal memory.

According to one embodiment of the present invention, the functions of a CPU, a NAND flash memory, and a cache memory can be implemented on the same chip.

The semiconductor device 400 illustrated in FIG. 31 includes the driver circuit 410 including a CPU and the memory array 420 including the 3D OS NAND memory device of one embodiment of the present invention. The 3D OS NAND memory device of one embodiment of the present invention has a function of a cache memory and a function of a flash memory.

Figure 32:
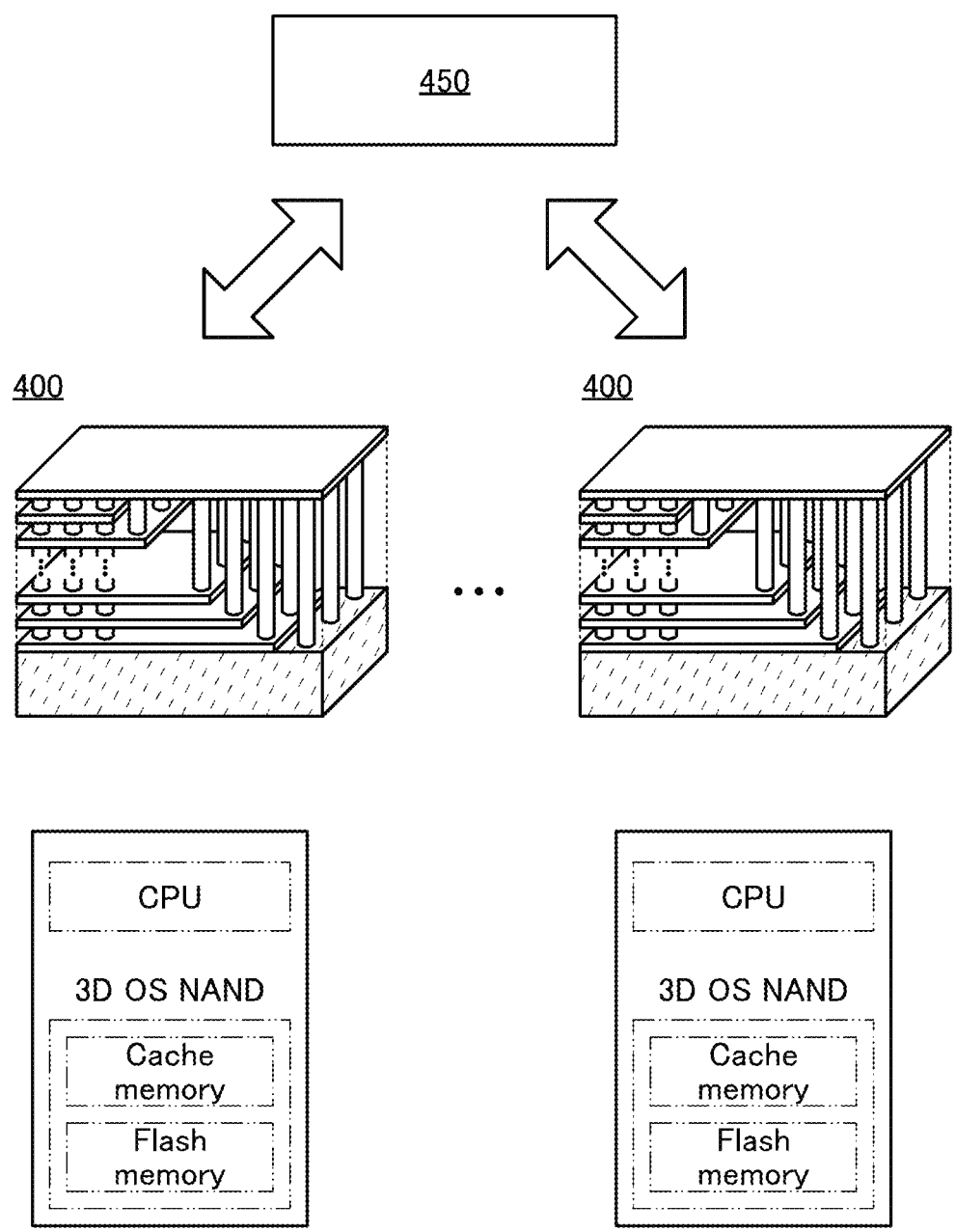
FIG. 32 is a diagram illustrating an example of a data processing system constructed using a plurality of memory devices.

FIG. 32 illustrates a state where a host 450 controls a plurality of semiconductor devices 400. Each of the semiconductor devices 400 has an arithmetic processing function, and writing to and reading from a flash memory and a cache memory can be parallelized. Control of the plurality of semiconductor devices 400 by the host 450 enables a data processing system that achieves non-von Neumann computing to be constructed.

This embodiment can be implemented in an appropriate combination with the structures described in the other embodiments and the like.

Embodiment 4

This embodiment will describe an example of an arithmetic processing device that can include the semiconductor device, such as the memory device described in any of the above embodiments.

Figure 33:
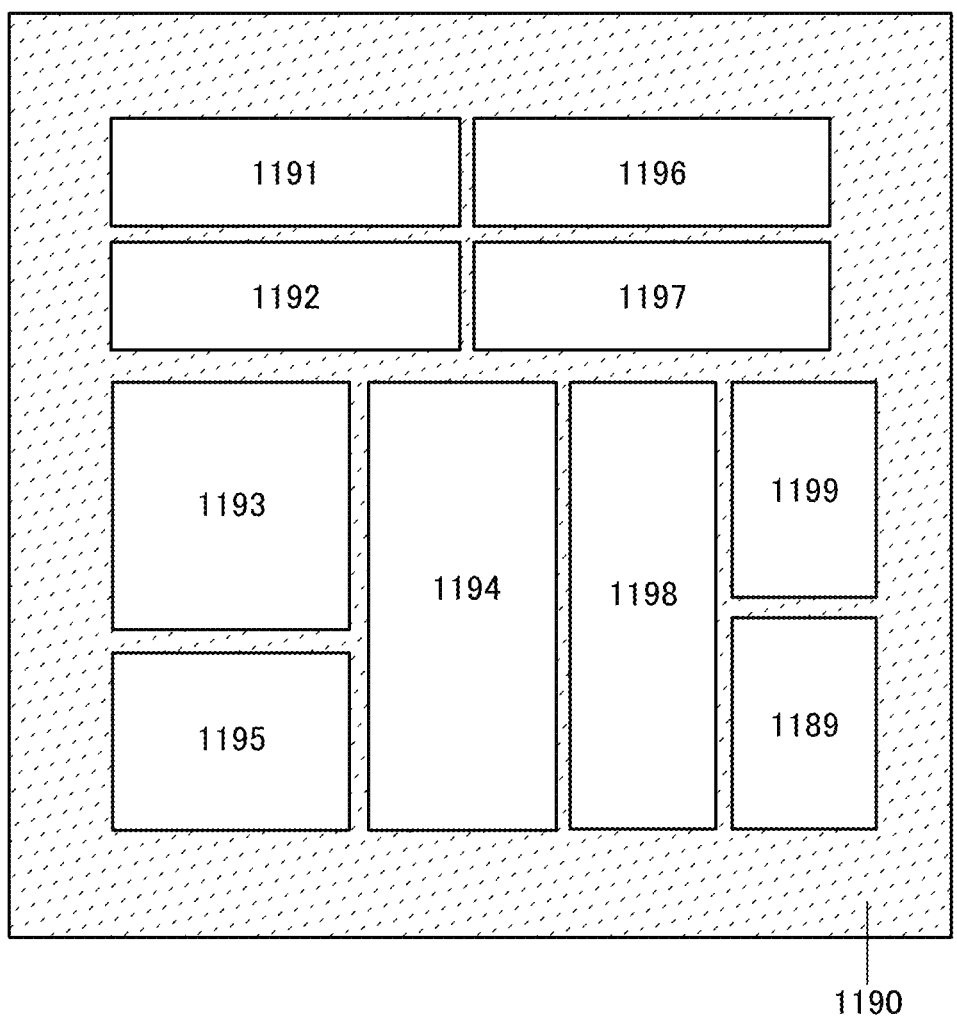
FIG. 33 is a block diagram illustrating a CPU.

FIG. 33 is a block diagram of a central processing unit 1100. FIG. 33 illustrates a structure example of a CPU as a structure example applicable to the central processing unit 1100.

The central processing unit 1100 illustrated in FIG. 33 includes, over a substrate 1190, an ALU (Arithmetic logic unit) 1191, an ALU controller 1192, an instruction decoder 1193, an interrupt controller 1194, a timing controller 1195, a register 1196, a register controller 1197, a bus interface 1198), a cache 1199, and a cache interface 1189. A semiconductor substrate, an SOI substrate, a glass substrate, or the like is used as the substrate 1190. A rewritable ROM and a ROM interface may be included. The cache 1199 and the cache interface 1189 may be provided in a separate chip.

The cache 1199 is connected via the cache interface 1189 to a main memory provided in another chip. The cache interface 1189 has a function of supplying part of data retained in the main memory to the cache 1199. The cache 1199 has a function of retaining the data.

The central processing unit 1100 illustrated in FIG. 33 is only an example with a simplified structure, and the actual central processing unit 1100 has a variety of structures depending on the application. For example, the central processing unit may have a structure in which a plurality of cores each of which is a structure including the central processing unit 1100 illustrated in FIG. 33 or an arithmetic circuit operate in parallel, i.e., a GPU-like structure. The number of bits that the central processing unit 1100 can handle with an internal arithmetic circuit or a data bus can be 8, 16, 32, or 64, for example.

An instruction input to the central processing unit 1100 through the bus interface 1198 is input to the instruction decoder 1193 and decoded, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. The interrupt controller 1194 judges and processes an interrupt request from an external input/output device or a peripheral circuit on the basis of its priority or a mask state while the central processing unit 1100 is executing a program. The register controller 1197 generates the address of the register 1196, and reads/writes data from/to the register 1196 in accordance with the state of the central processing unit 1100.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the central processing unit 1100 illustrated in FIG. 33, a memory device is provided in the register 1196 and the cache 1199. As the memory device, the memory device described in any of the above embodiments can be used, for example.

In the central processing unit 1100 illustrated in FIG. 33, the register controller 1197 selects retention operation in the register 1196 in accordance with an instruction from the ALU 1191. That is, the register controller 1197 selects whether data is retained by a flip-flop or data is retained by a capacitor in a memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Figure 34A:
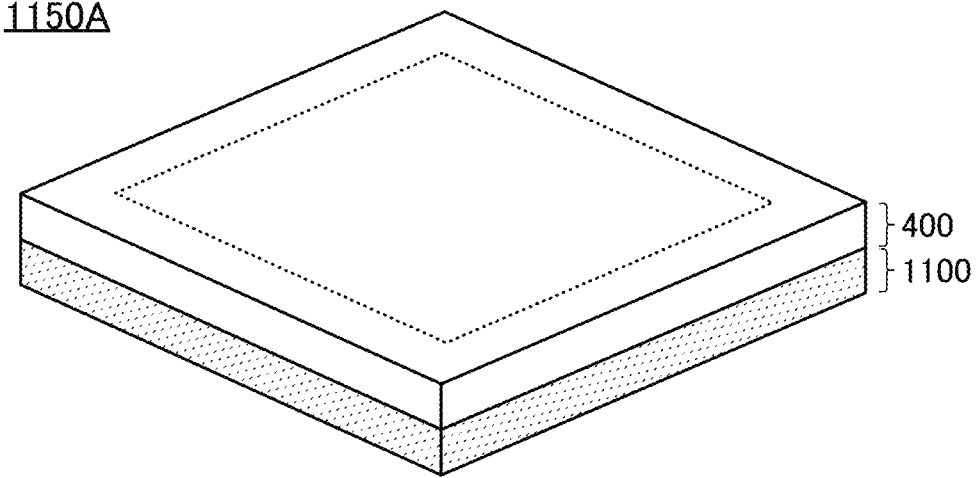
FIG. 34A and FIG. 34B are perspective views of a semiconductor device.
Figure 34B:
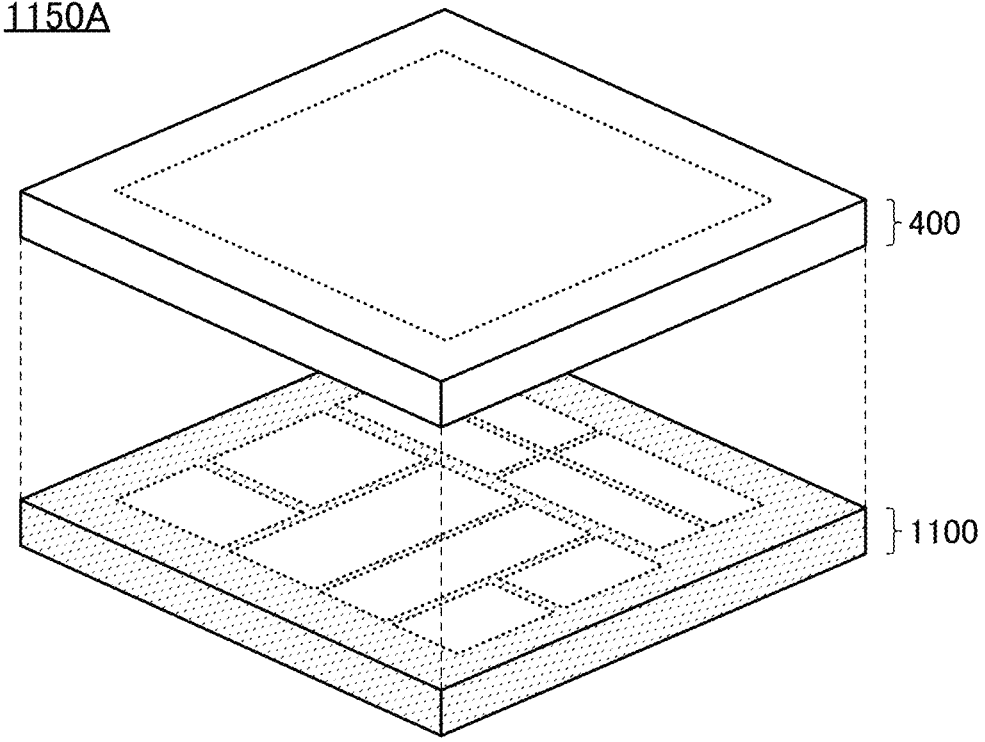

The semiconductor device 400 described in the above embodiment and the central processing unit 1100 can be provided to overlap with each other. FIG. 34A and FIG. 34B are perspective views of a semiconductor device 1150A. The semiconductor device 1150A includes the semiconductor device 400 functioning as a memory device over the central processing unit 1100. The central processing unit 1100 and the semiconductor device 400 have an overlap region. For easy understanding of the structure of the semiconductor device 1150A, the central processing unit 1100 and the semiconductor device 400 are separated from each other in FIG. 34B.

Providing the semiconductor device 400 and the central processing unit 1100 to overlap with each other can shorten the connection distance therebetween. Accordingly, the communication speed therebetween can be increased. Moreover, a short connection distance leads to lower power consumption.

As described in the above embodiment, when an OS NAND memory device is used as the semiconductor device 400, some or all of the memory strings 200 among the plurality of memory strings 200 included in the semiconductor device 400 can function as RAM. Thus, the semiconductor device 400 can function as a main memory. The semiconductor device 400 functioning as the main memory is connected to the cache 1199 through the cache interface 1189.

Whether the semiconductor device 400 functions as the main memory (RAM) or storage is controlled by the control circuit 412 illustrated in FIG. 30. The control circuit 412 can make some or all of the plurality of memory strings 200 included in the semiconductor device 400 function as RAM in accordance with a signal supplied from the central processing unit 1100.

The semiconductor device 400 can make some of the memory strings 200 among the plurality of memory strings 200 function as a RAM and can make the other memory strings 200 function as a storage. When an OS NAND memory device is used as the semiconductor device 400, the semiconductor device 400 can have the function of the cache, the function of the main memory, and the function of the storage. The semiconductor device 400 of one embodiment of the present invention can function as a universal memory, for example.

In the case where the semiconductor device 400 is used as the main memory, the memory capacity can be increased or decreased as needed. In the case where the semiconductor device 400 is used as a cache, the memory capacity can be increased or decreased as needed.

The control circuit 412 illustrated in FIG. 30 may have a function of performing error check and correct (ECC) when data is transferred or duplicated between the region functioning as the storage and the region functioning as the main memory in the semiconductor device 400. The control circuit 412 may have a function of performing ECC when data is transferred or duplicated between the cache 1199 and the region of the semiconductor device 400 functioning as the main memory.

Figure 35A:
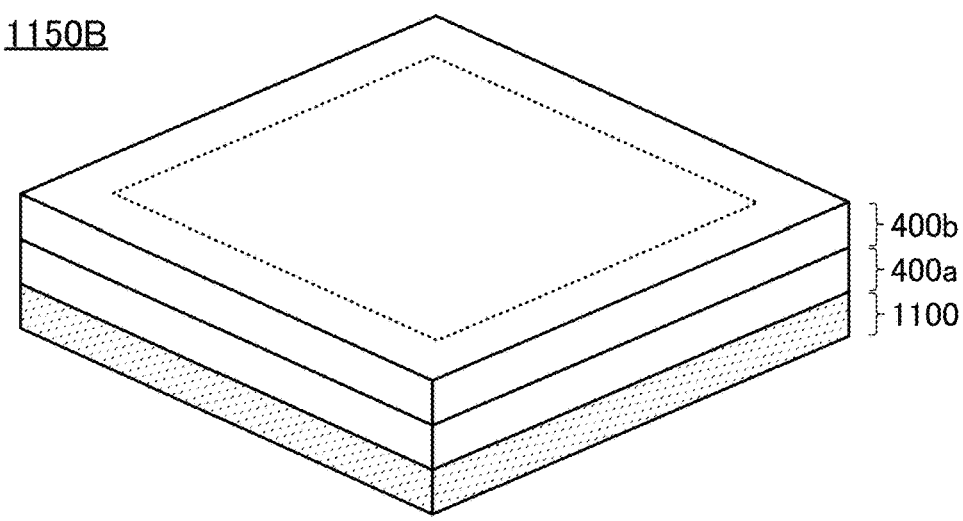
FIG. 35A and FIG. 35B are perspective views of a semiconductor device.
Figure 35B:
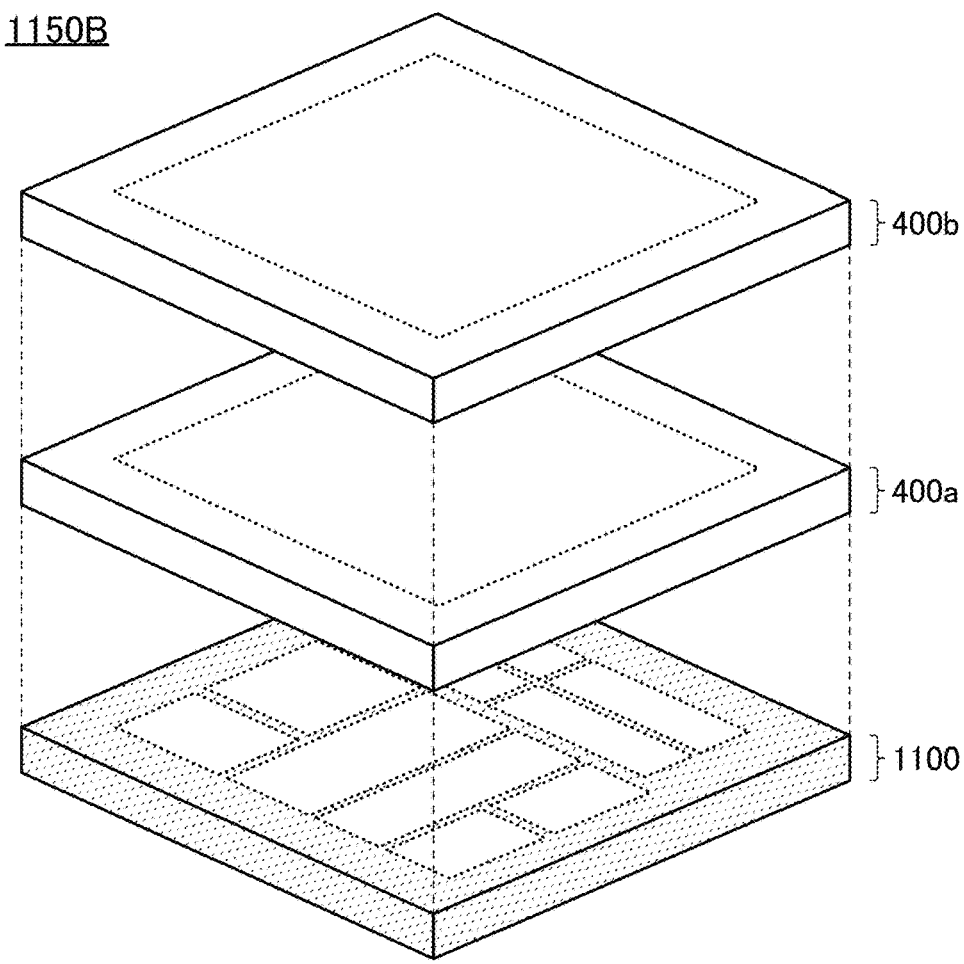

A plurality of semiconductor devices 400 may be provided to overlap with the central processing unit 1100. FIG. 35A and FIG. 35B are perspective views of a semiconductor device 1150B. The semiconductor device 1150B includes a semiconductor device 400a and a semiconductor device 400b over the central processing unit 1100. The central processing unit 1100, the semiconductor device 400a, and the semiconductor device 400b have an overlap region. For easy understanding of the structure of the semiconductor device 1150B, the central processing unit 1100, the semiconductor device 400a, and the semiconductor device 400b are separated from each other in FIG. 35B.

The semiconductor device 400a and the semiconductor device 400b function as memory devices. For example, a NOR memory device may be used as the semiconductor device 400a. A NAND memory device may be used as the semiconductor device 400b. Both the semiconductor device 400a and the semiconductor device 400b may be a NAND memory device. A NOR memory device can operate at higher speed than a NAND memory device; hence, for example, part of the semiconductor device 400a can be used as the main memory and/or the cache 1199. Note that the stacking order of the semiconductor device 400a and the semiconductor device 400b may be reverse.

Figure 36A:
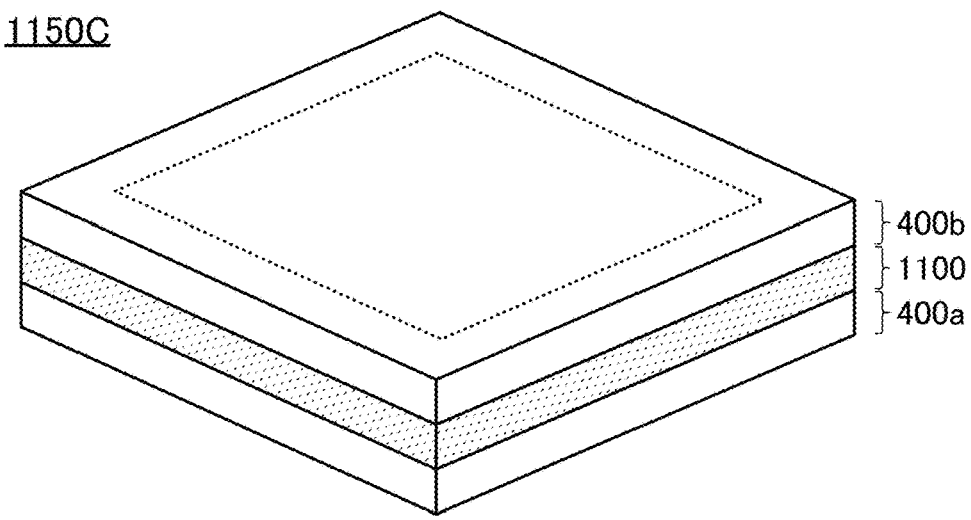
FIG. 36A and FIG. 36B are perspective views of a semiconductor device.
Figure 36B:
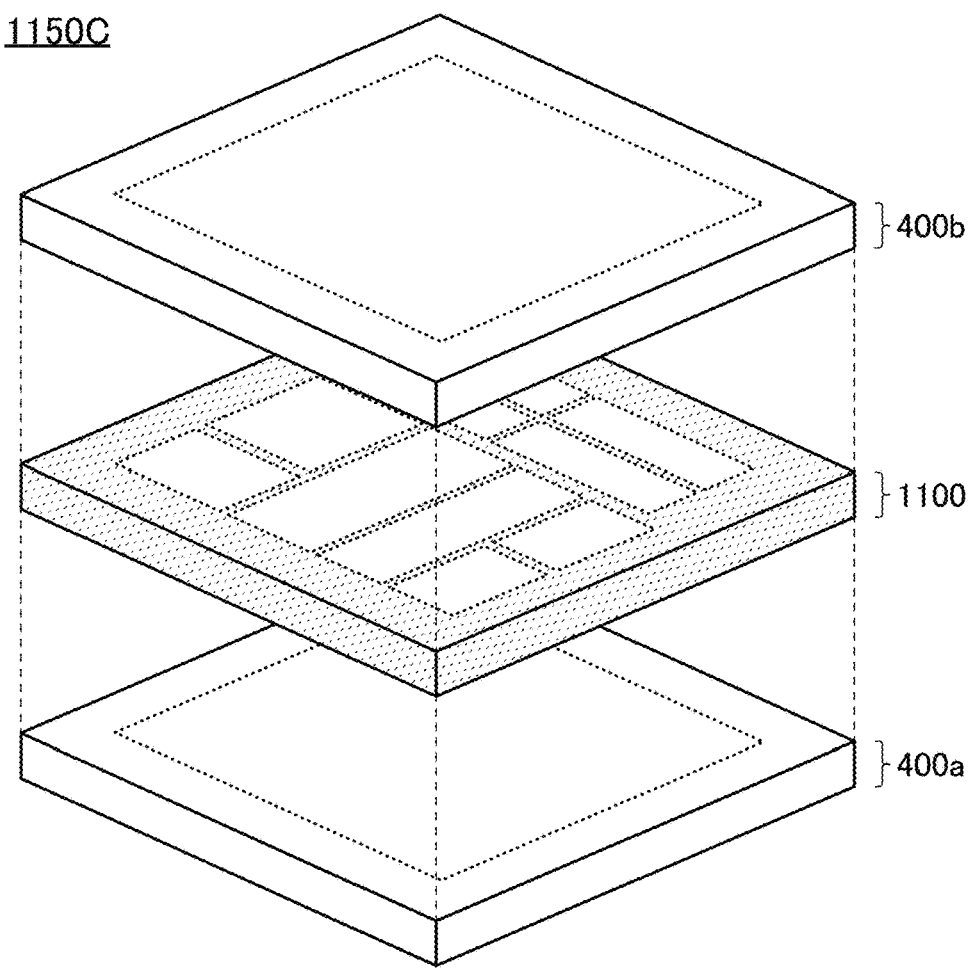

FIG. 36A and FIG. 36B are perspective views of a semiconductor device 1150C. The semiconductor device 1150C has a structure in which the central processing unit 1100 is provided between the semiconductor device 400a and the semiconductor device 400b. Thus, the central processing unit 1100, the semiconductor device 400a, and the semiconductor device 400b have an overlap region. For easy understanding of the structure of the semiconductor device 1150C, the central processing unit 1100, the semiconductor device 400a, and the semiconductor device 400b are separated from each other in FIG. 36B.

With the structure of the semiconductor device 1150C, the communication speed between the semiconductor device 400a and the central processing unit 1100 and the communication speed between the semiconductor device 400b and the central processing unit 1100 can be both increased. Moreover, power consumption can be reduced, compared to the semiconductor device 1150B.

This embodiment can be implemented in an appropriate combination with the structures described in the other embodiments and the like.

Embodiment 5

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 37A.

Figure 37A:
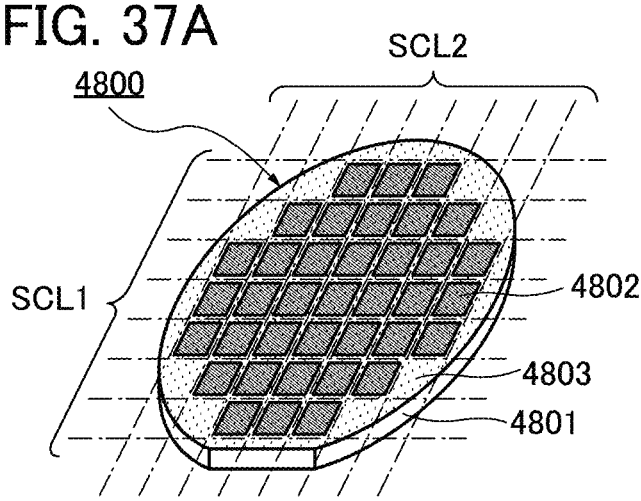
FIG. 37A is a perspective view illustrating an example of a semiconductor wafer.

A semiconductor wafer 4800 illustrated in FIG. 37A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 37B:
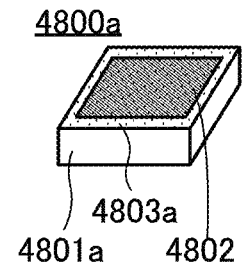
FIG. 37B is a perspective view illustrating an example of a chip.

With the dicing step, a chip 4800a as illustrated in FIG. 37B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 37A. The element substrate may be a rectangular semiconductor wafer, for example. The shape of the element substrate can be changed as appropriate, depending on a manufacturing process of an element and an apparatus for manufacturing the element.

<Electronic Component>

Figure 37C:
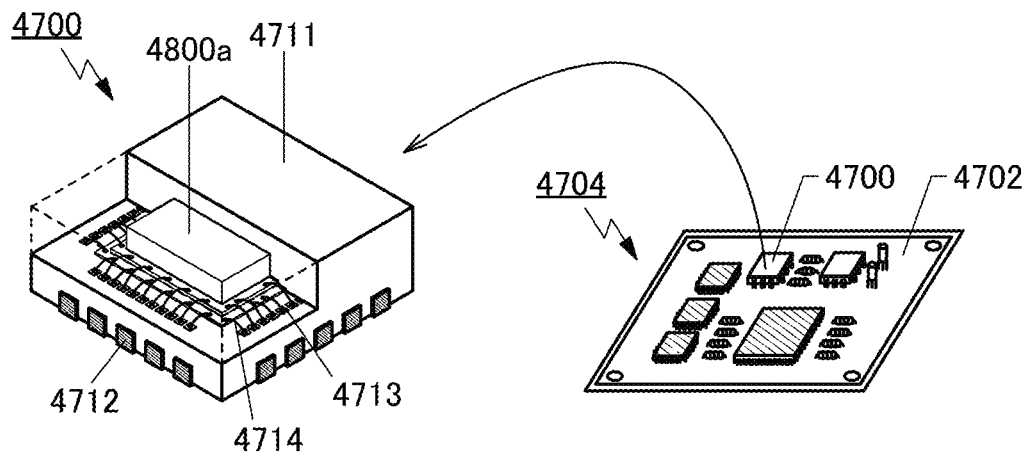
FIG. 37C and FIG. 37D are perspective views illustrating examples of electronic components.

FIG. 37C is a perspective view of an electronic component 4700 and a substrate (a mounting board 4704) on which the electronic component 4700 is mounted. The electronic component 4700 illustrated in FIG. 37C includes the chip 4800a in a mold 4711. As the chip 4800a, the memory device of one embodiment of the present invention can be used, for example.

To illustrate the inside of the electronic component 4700, some portions are omitted in FIG. 37C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 37D:
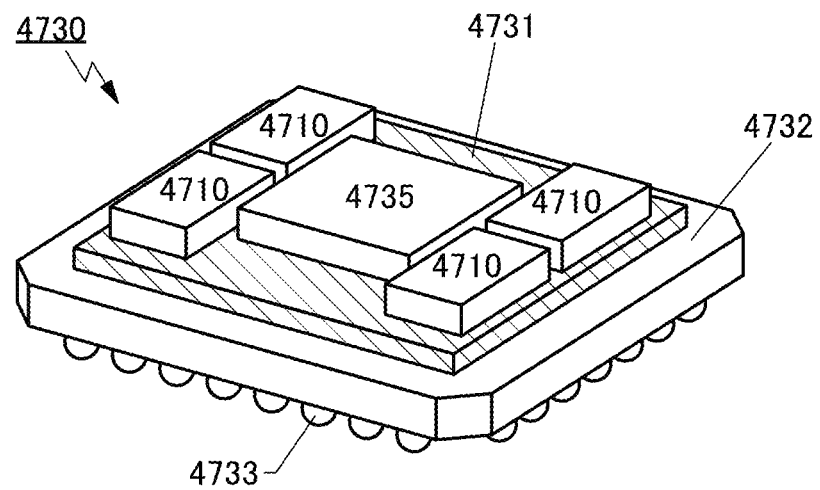

FIG. 37D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor devices 4710 include the chip 4800a, the semiconductor device described in the above embodiment, and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 37D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments and the like.

Embodiment 6

In this embodiment, application examples of the memory device of one embodiment of the present invention will be described.

Figure 38A:
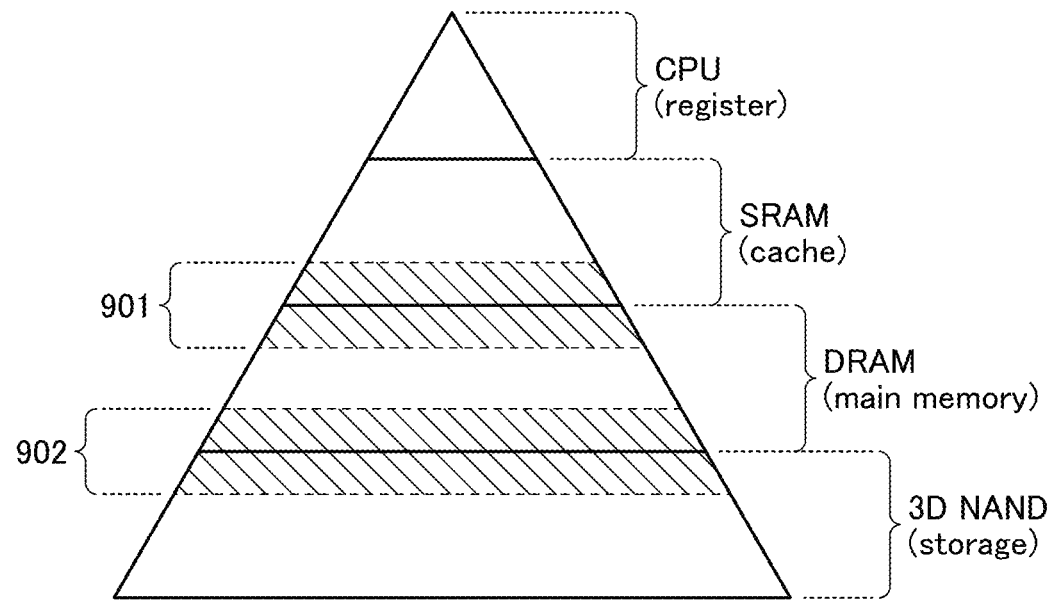
FIG. 38A and FIG. 38B are diagrams each showing a hierarchy of a variety of memory devices.

In general, a variety of memory devices are used in semiconductor devices such as computers in accordance with the intended use. FIG. 38A shows the hierarchy of various memory devices used in a semiconductor device. The memory devices at the upper levels require a higher operating speed, whereas the memory devices at the lower levels require a larger memory capacity and a higher record density. FIG. 38A shows, sequentially from the top level, a memory included as a register in an arithmetic processing device such as a CPU, an SRAM (Static Random Access Memory), a DRAM (Dynamic Random Access Memory), and a 3D NAND memory.

A memory included as a register in an arithmetic processing device such as a CPU is used for temporary storage of arithmetic operation results, for example, and thus is very frequently accessed by the arithmetic processing device. Accordingly, a high operating speed is required rather than the memory capacity. The register also has a function of retaining settings of the arithmetic processing device, for example.

An SRAM is used for a cache, for example. The cache has a function of duplicating and retaining part of data retained in a main memory. Duplicating frequently used data and retaining the duplicated data in the cache can increase the speed of access to data. The cache requires a smaller memory capacity than the main memory but a higher operating speed than the main memory. Data that is rewritten in the cache is duplicated, and the duplicated data is supplied to the main memory.

A DRAM is used for the main memory, for example. The main memory has a function of retaining a program and data that are read from the storage. The record density of a DRAM is approximately 0.1 Gbit/mm$^2$ to 0.3 Gbit/mm$^2$.

A 3D NAND memory is used for the storage, for example. The storage has a function of retaining data that needs to be stored for a long time and programs used in an arithmetic processing device, for example. Therefore, the storage needs to have a high memory capacity and a high record density rather than operating speed. The record density of the memory device used as the storage is approximately 0.6 Gbit/mm$^2$ to 6.0 Gbit/mm$^2$.

The memory device of one embodiment of the present invention operates fast and can retain data for a long time. The memory device of one embodiment of the present invention can be suitably used as a memory device positioned in a boundary region 901 that includes both the level where the cache is positioned and the level where the main memory is positioned. The memory device of one embodiment of the present invention can be suitably used as a memory device positioned in a boundary region 902 that includes both the level where the main memory is positioned and the level where the storage is positioned.

Figure 38B:
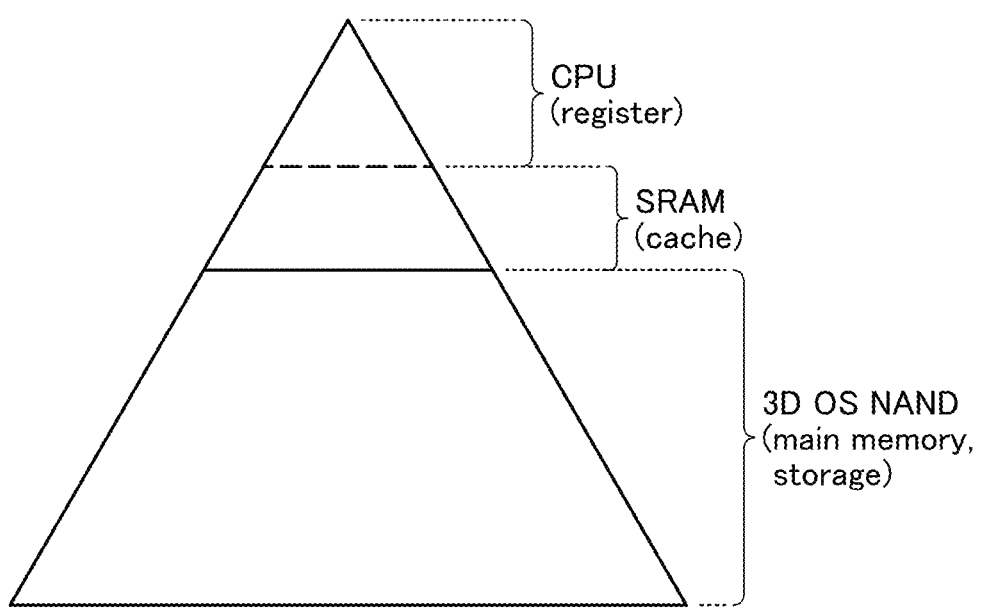

The memory device of one embodiment of the present invention can be suitably used at both the level where the main memory is positioned and the level where the storage is positioned. The memory device of one embodiment of the present invention can be suitably used at the level where the cache is positioned. FIG. 38B shows the hierarchy of various memory devices different from that in FIG. 38A.

FIG. 38B shows, sequentially from the top level, a memory included as a register in an arithmetic processing device such as a CPU, an SRAM used as a cache, and a 3D OS NAND memory. The memory device of one embodiment of the present invention can be used for the cache, main memory, and storage. When a high-speed memory of 1 GHz or higher is required as the cache, the cache is included in an arithmetic processing device such as a CPU.

The memory device of one embodiment of the present invention can be used, for example, as memory devices of a variety of electronic devices (e.g., information terminals, computers, smartphones, e-book readers, digital still cameras, video cameras, video recording/reproducing devices, navigation systems, and game machines). The memory device can also be used for image sensors, IoT (Internet of Things), healthcare, and the like. Here, the computers refer not only to tablet computers, notebook computers, and desktop computers, but also to large computers such as server systems.

Examples of an electronic device including the memory device of one embodiment of the present invention will be described. FIG. 39A to FIG. 39J and FIG. 40A to FIG. 40E each illustrate the state where the electronic component 4700 or the electronic component 4730, each of which includes the memory device, is included in an electronic device.

[Mobile Phone]

Figure 39A:
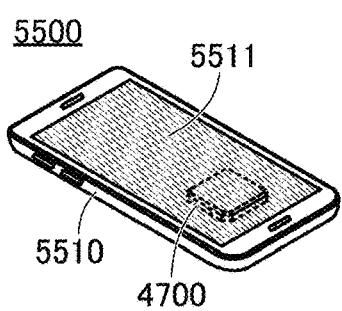
FIG. 39A to FIG. 39J are perspective views and schematic views illustrating examples of electronic devices.

An information terminal 5500 illustrated in FIG. 39A is a mobile phone (a smartphone), which is a type of information terminal. The information terminal 5500 includes a housing 5510 and a display portion 5511, and as input interfaces, a touch panel is provided in the display portion 5511 and a button is provided in the housing 5510.

By using the memory device of one embodiment of the present invention, the information terminal 5500 can retain a temporary file generated at the time of executing an application (e.g., a web browser's cache).

[Wearable Terminal]

Figure 39B:
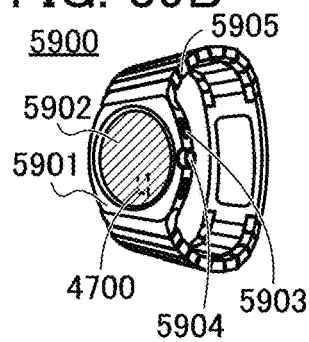

FIG. 39B illustrates an information terminal 5900 as an example of a wearable terminal. The information terminal 5900 includes a housing 5901, a display portion 5902, an operation switch 5903, an operation switch 5904, a band 5905, and the like.

Like the above-described information terminal 5500, the wearable terminal can retain a temporary file generated at the time of executing an application, by using the memory device of one embodiment of the present invention.

[Information Terminal]

Figure 39C:
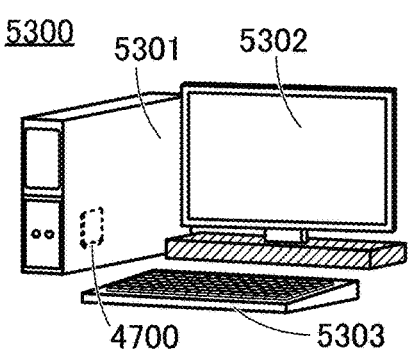

FIG. 39C illustrates a desktop information terminal 5300. The desktop information terminal 5300 includes a main body 5301 of the information terminal, a display portion 5302, and a keyboard 5303.

Like the above-described information terminal 5500, the desktop information terminal 5300 can retain a temporary file generated at the time of executing an application, by using the memory device of one embodiment of the present invention.

Note that although FIG. 39A to FIG. 39C illustrate the smartphone, the wearable terminal, and the desktop information terminal as examples of an electronic device, one embodiment of the present invention can also be applied to an information terminal other than a smartphone, a wearable terminal, and a desktop information terminal. Examples of information terminals other than a smartphone, a wearable terminal, and a desktop information terminal include a PDA (Personal Digital Assistant), a notebook information terminal, and a workstation.

[Household Appliance]

Figure 39D:
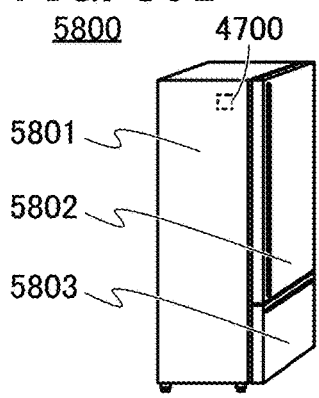

FIG. 39D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is compatible with the IoT (Internet of Things).

The memory device of one embodiment of the present invention can be used in the electric refrigerator-freezer 5800. The electric refrigerator-freezer 5800 can transmit and receive data on food stored in the electric refrigerator-freezer 5800 and food expiration dates, for example, to/from an information terminal and the like via the Internet or the like. In the electric refrigerator-freezer 5800, the memory device can retain a temporary file generated at the time of transmitting the data.

An electric refrigerator-freezer is described in this example as a household appliance; other examples of household appliances include a vacuum, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 39E:
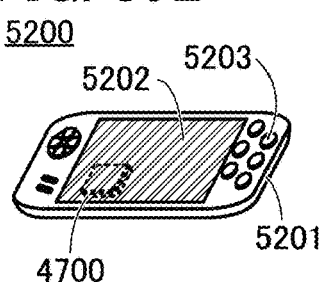

FIG. 39E illustrates a portable game machine 5200 as an example of a game machine. The portable game machine 5200 includes a housing 5201, a display portion 5202, a button 5203, and the like.

Figure 39F:
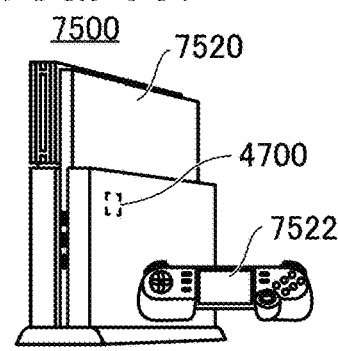

FIG. 39F illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 39F, the controller 7522 can include a display portion that displays a game image, and an input interface besides a button, such as a touch panel, a stick, a rotating knob, and a sliding knob, for example. The shape of the controller 7522 is not limited to that illustrated in FIG. 39F and the shape of the controller 7522 may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

By using the memory device described in the above embodiment in the portable game machine 5200 or the stationary game machine 7500, the portable game machine 5200 with low power consumption or the stationary game machine 7500 with low power consumption can be obtained. Moreover, heat generation from a circuit can be reduced owing to low power consumption; thus, the influence of heat generation on the circuit, the peripheral circuit, and the module can be reduced.

Moreover, with the use of the memory device described in the above embodiment, the portable game machine 5200 or the stationary game machine 7500 can retain a temporary file or the like necessary for arithmetic operation that occurs during game play.

As examples of game machines, FIG. 39E illustrates a portable game machine and FIG. 39F illustrates a home-use stationary game machine. However, the electronic device of one embodiment of the present invention is not limited thereto. Examples of the electronic device of one embodiment of the present invention include an arcade game machine installed in an entertainment facility (e.g., a game center and an amusement park) and a throwing machine for batting practice, installed in sports facilities.

[Moving Vehicle]

The memory device described in the above embodiment can be used in an automobile, which is a moving vehicle, and around the driver's seat in an automobile.

Figure 39G:
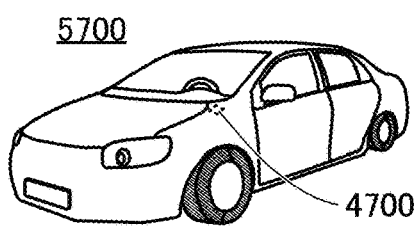

FIG. 39G illustrates an automobile 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, which improves safety. That is, displaying an image taken by the imaging device provided on the exterior of the automobile 5700 can compensate for blind areas and enhance safety.

The memory device described in the above embodiments can temporarily retain data; thus, the memory device can be used to retain temporary data necessary in an automatic driving system for the automobile 5700 and a system for navigation and risk prediction, for example. The display device may be configured to display temporary information for navigation, risk prediction, and the like. Moreover, the memory device may be configured to retain a video taken by a driving recorder provided on the automobile 5700.

Although an automobile is described above as an example of a moving vehicle, the moving vehicle is not limited to an automobile. Examples of a moving vehicle include a train, a monorail train, a ship, and a flying object (a helicopter, an unmanned aircraft (a drone), an airplane, and a rocket).

[Camera]

The memory device described in the above embodiment can be used in a camera.

Figure 39H:
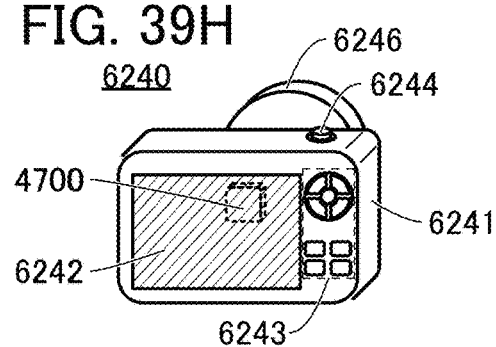

FIG. 39H illustrates a digital camera 6240 as an example of an imaging device. The digital camera 6240 includes a housing 6241, a display portion 6242, operation switches 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 may be configured to be equipped with a stroboscope, a viewfinder, or the like.

When the memory device described in the above embodiment is used for the digital camera 6240, the digital camera 6240 can have low power consumption. Moreover, heat generation from a circuit can be reduced owing to low power consumption; thus, the influence of heat generation on the circuit, the peripheral circuit, and the module can be reduced.

[Video Camera]

The memory device described in the above embodiment can be used in a video camera.

Figure 39I:
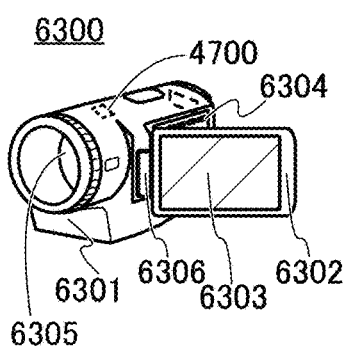

FIG. 39I illustrates a video camera 6300 as an example of an imaging device. The video camera 6300 includes a first housing 6301, a second housing 6302, a display portion 6303, an operation switch 6304, a lens 6305, a joint 6306, and the like. The operation switch 6304 and the lens 6305 are provided for the first housing 6301, and the display portion 6303 is provided for the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded in accordance with a data recording format. With the use of the above memory device, the video camera 6300 can retain a temporary file generated in encoding.

[ICD]

The memory device described in the above embodiment can be used in an implantable cardioverter-defibrillator (ICD).

Figure 39J:
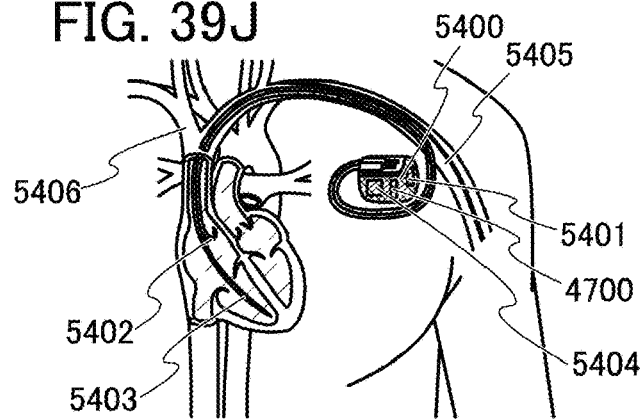

FIG. 39J is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the electric power is charged into the battery 5401. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 that can receive electric power, an antenna that can transmit a physiological signal may be included to construct, for example, a system that monitors the cardiac activity and is capable of monitoring physiological signals such as pulses, respiratory rate, heart rate, and body temperature with an external monitoring device.

[Expansion Device for PC]

The memory device described in the above embodiment can be used in a calculator such as a PC (Personal Computer) and an expansion device for an information terminal.

Figure 40A:
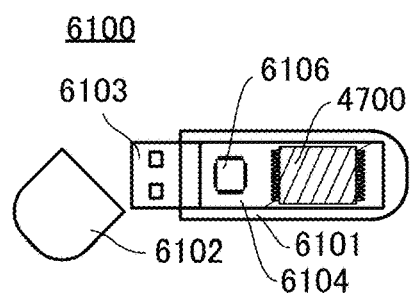
FIG. 40A to FIG. 40E are perspective views and schematic views illustrating examples of electronic devices.

FIG. 40A illustrates, as an example of the expansion device, a portable expansion device 6100 that is externally attached to a PC and includes a chip capable of storing data. The extension device 6100 can store data using the chip when connected to a PC with a USB (Universal Serial Bus), for example. FIG. 40A illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

[SD Card]

The memory device described in the above embodiment can be used in an SD card that can be attached to electronic devices such as an information terminal and a digital camera.

Figure 40B:
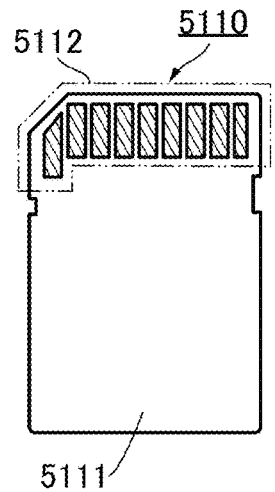
Figure 40C:
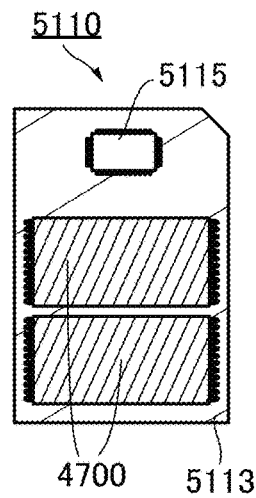

FIG. 40B is a schematic external view of an SD card, and FIG. 40C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with the electronic component 4700 and a controller chip 5115. Note that the circuit structures of the electronic component 4700 and the controller chip 5115 are not limited to those described above, and the circuit structures may be changed as appropriate depending on circumstances. For example, a write circuit, a row driver, a read circuit, and the like that are provided in an electronic component may be incorporated into the controller chip 5115 instead of the electronic component 4700.

When the electronic component 4700 is also provided on the back surface side of the substrate 5113, the capacity of the SD card 5110 can be increased. In addition, a wireless chip with a wireless communication function may be provided on the substrate 5113. This enables wireless communication between an external device and the SD card 5110, making it possible to write/read data to/from the electronic component 4700.

[SSD]

The memory device described in the above embodiment can be used in an SSD (Solid State Drive) that can be attached to electronic devices such as information terminals.

Figure 40D:
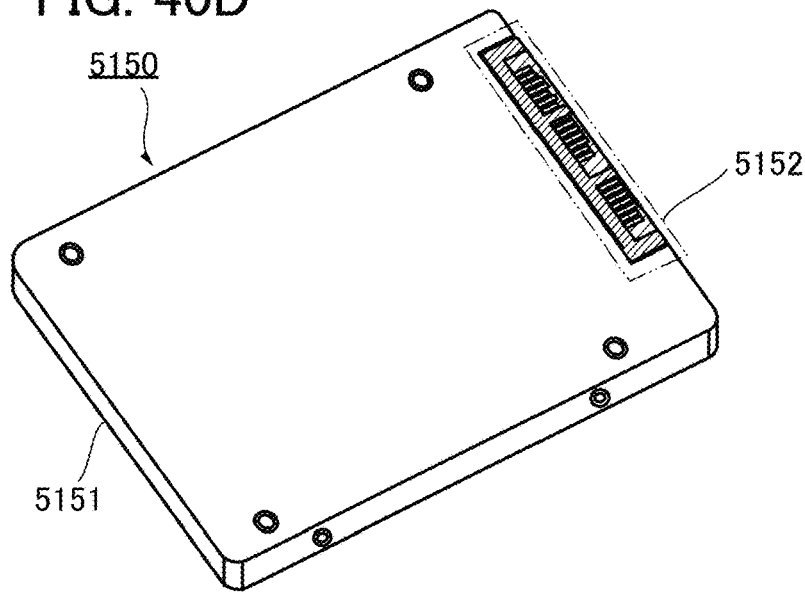
Figure 40E:
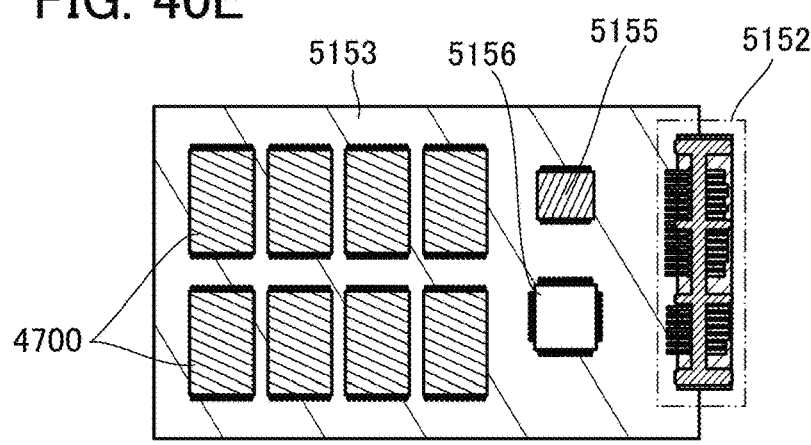

FIG. 40D is a schematic external view of an SSD, and FIG. 40E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with the electronic component 4700, a memory chip 5155, and a controller chip 5156. When the electronic component 4700 is also provided on the back surface side of the substrate 5153, the capacity of the SSD 5150 can be increased. A work memory is incorporated into the memory chip 5155. For example, a DRAM chip can be used as the memory chip 5155. A processor, an ECC circuit, and the like are incorporated into the controller chip 5156. Note that the circuit structures of the electronic component 4700, the memory chip 5155, and the controller chip 5156 are not limited to those described above, and the circuit structures may be changed as appropriate depending on circumstances. For example, a memory functioning as a work memory may also be provided in the controller chip 5156.

[Computer]

Figure 41A:
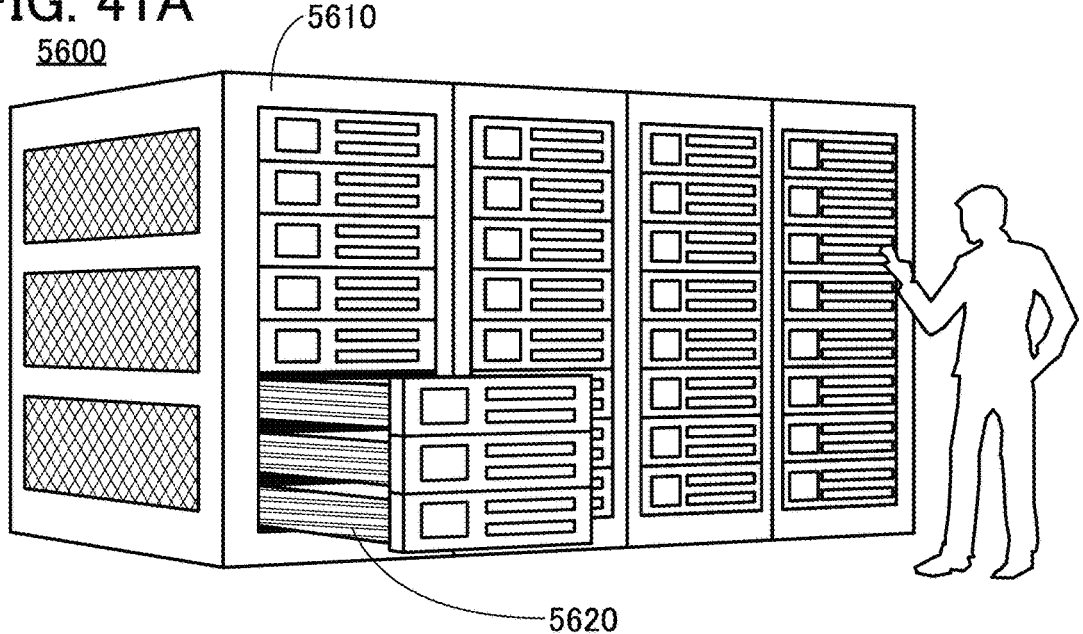
FIG. 41A to FIG. 41C are diagrams illustrating examples of electronic devices.

A computer 5600 illustrated in FIG. 41A is an example of a large computer. In the computer 5600, a plurality of rack mount computers 5620 are stored in a rack 5610.

Figure 41B:
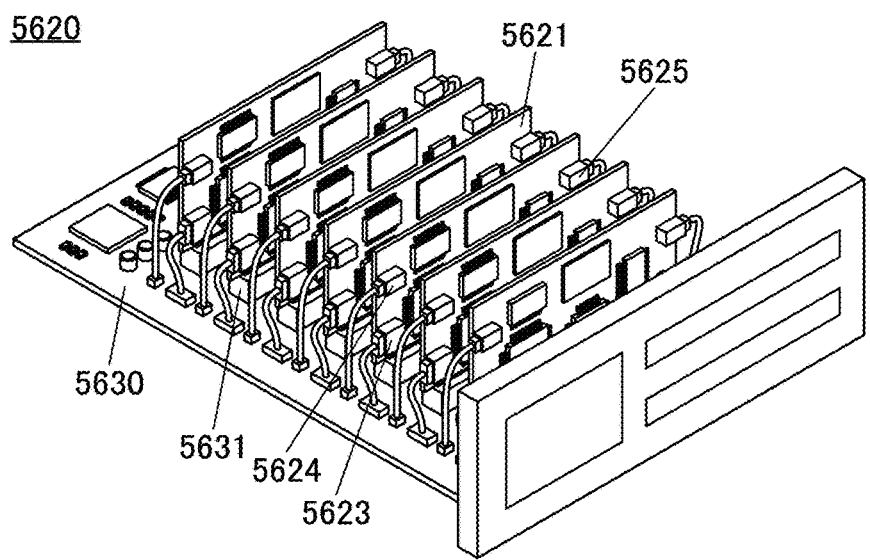

The computer 5620 can have a structure in a perspective view of FIG. 41B, for example. In FIG. 41B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 41C:
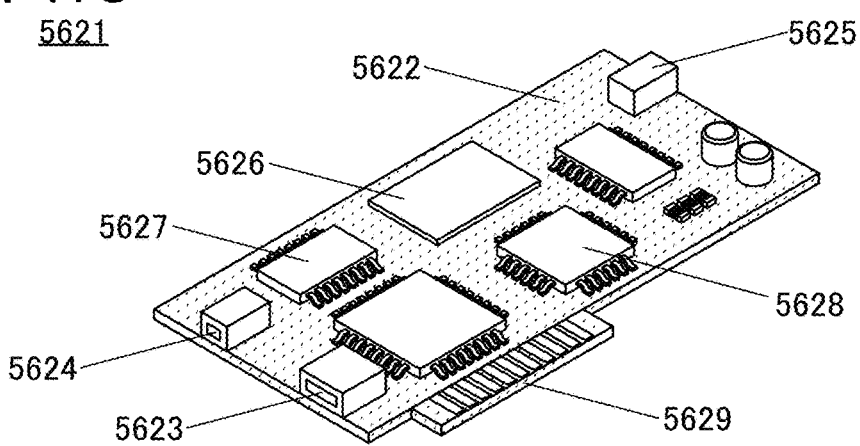

The PC card 5621 illustrated in FIG. 41C is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. FIG. 41C also illustrates semiconductor devices other than the semiconductor device 5626, the semiconductor device 5627, and the semiconductor device 5628; the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve, for example, as an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices described above, whereby a smaller size, higher speed, or lower power consumption of the electronic devices can be achieved. In addition, since the semiconductor device of one embodiment of the present invention has low power consumption, heat generation from a circuit can be reduced. Accordingly, it is possible to reduce adverse effects of the heat generation on the circuit itself, the peripheral circuit, and the module. Furthermore, the use of the semiconductor device of one embodiment of the present invention can achieve an electronic device that operates stably even in a high temperature environment. Thus, the reliability of the electronic device can be improved.

Figure 42:
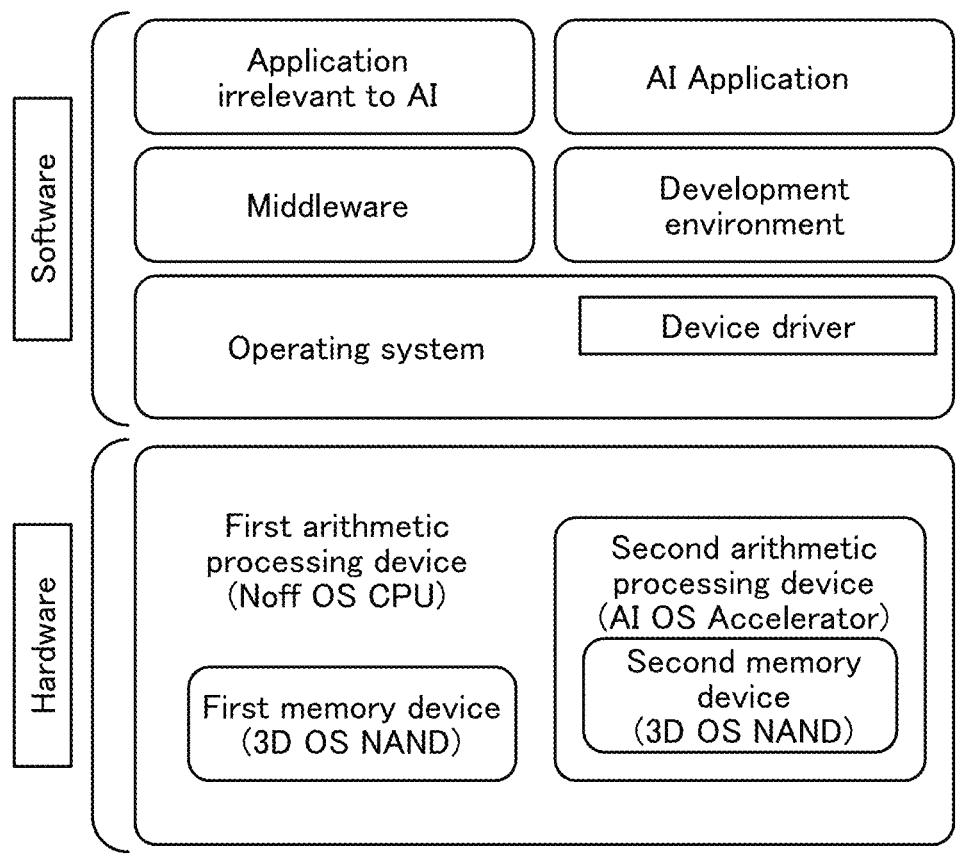
FIG. 42 is a diagram illustrating a structure example of a computer system.

Next, a structure example of a computer system that can be used in the computer 5600 is described. FIG. 42 is a diagram showing a structure example of a computer system 700. The computer system 700 is made of software and hardware. Note that the hardware included in the computer system is sometimes referred to as a data processing device.

Examples of the software included in the computer system 700 include operating systems including device drivers, middleware, a variety of development environments, application programs related to AI (AI Application), and application programs irrelevant to AI (Application).

The device drivers include, for example, application programs for controlling externally connected devices such as an auxiliary memory device, a display device, and a printer.

The hardware included in the computer system 700 includes a first arithmetic processing device, a second arithmetic processing device, a first memory device, and the like. The second arithmetic processing device includes a second memory device.

As the first arithmetic processing device, a central processing unit such as an Noff OS CPU is preferably used, for example. The Noff OS CPU includes a memory unit using OS transistors (e.g., a nonvolatile memory), and has a function of storing necessary data into the memory unit and stopping power supply to the central processing unit when it does not need to operate. The use of the Noff OS CPU as the first arithmetic processing device can reduce the power consumption of the computer system 700.

As the second arithmetic processing device, a GPU or an FPGA can be used, for example. Note that as the second arithmetic processing device, an AI OS Accelerator is preferably used. The AI OS Accelerator is composed of OS transistors and includes an arithmetic unit such as a product-sum operation circuit. The power consumption of the AI OS Accelerator is lower than that of a common GPU and the like. The use of the AI OS Accelerator as the second arithmetic processing device can reduce the power consumption of the computer system 700.

As the first memory device and the second memory device, the memory device of one embodiment of the present invention is preferably used. For example, the 3D OS NAND memory device is preferably used. The 3D OS NAND memory device can function as a cache, a main memory, and storage. The use of the 3D OS NAND memory device facilitates fabrication of a non-von Neumann computer system.

The power consumption of the 3D OS NAND memory device is lower than that of a 3D NAND memory device using Si transistors. The use of the 3D OS NAND memory device as the memory devices can reduce the power consumption of the computer system 700. In addition, the 3D OS NAND memory device can function as a universal memory, thereby reducing the number of components included in the computer system 700.

When the semiconductor device constituting the hardware is configured with the semiconductor device including OS transistors, the hardware including the central processing unit, the arithmetic processing device, and the memory device can be easily monolithic. Making the hardware monolithic facilitates a further reduction in power consumption as well as a reduction in size, weight, and thickness.

This embodiment can be implemented in an appropriate combination with the structures described in the other embodiments and the like.

Embodiment 7

The use of the OS memory described in this specification and the like enables a normally-off CPU (also referred to as "Noff-CPU") to be obtained. Note that the Noff-CPU is an integrated circuit including a normally-off transistor, which is in a non-conduction state (also referred to as off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operating speed.

The Noff-CPU can be suitably used for a small-scale system such as an IoT (Internet of Things) end device (also referred to as endpoint microcomputer) 803 in the IoT field, for example.

Figure 43:
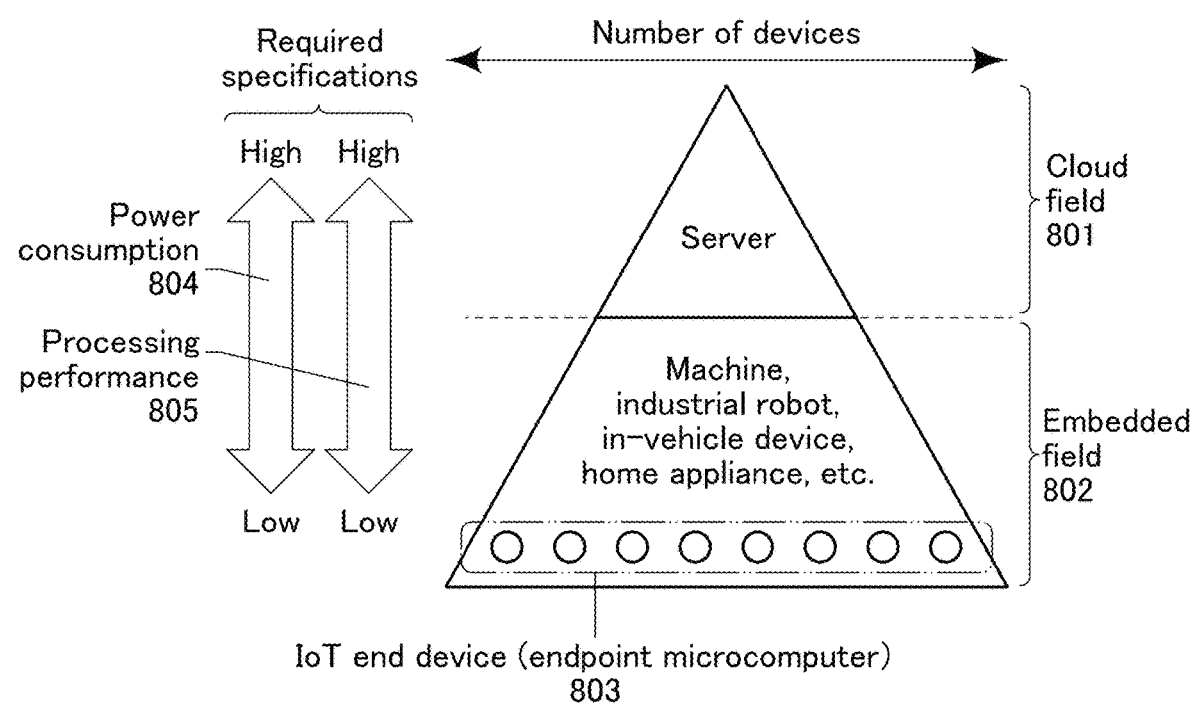
FIG. 43 is a diagram showing a hierarchical structure of an IoT network and tendencies of required specifications.

FIG. 43 shows a hierarchical structure of an IoT network and tendencies of required specifications. FIG. 43 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

At the upper level, higher processing performance is required rather than lower power consumption. Thus, a high-performance CPU, a high-performance GPU, a large-scale SoC (System on a Chip), and the like are used in the cloud field 801. Furthermore, at the lower level, lower power consumption is required rather than higher processing performance, and the number of devices is explosively increased. The semiconductor device of one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 44:
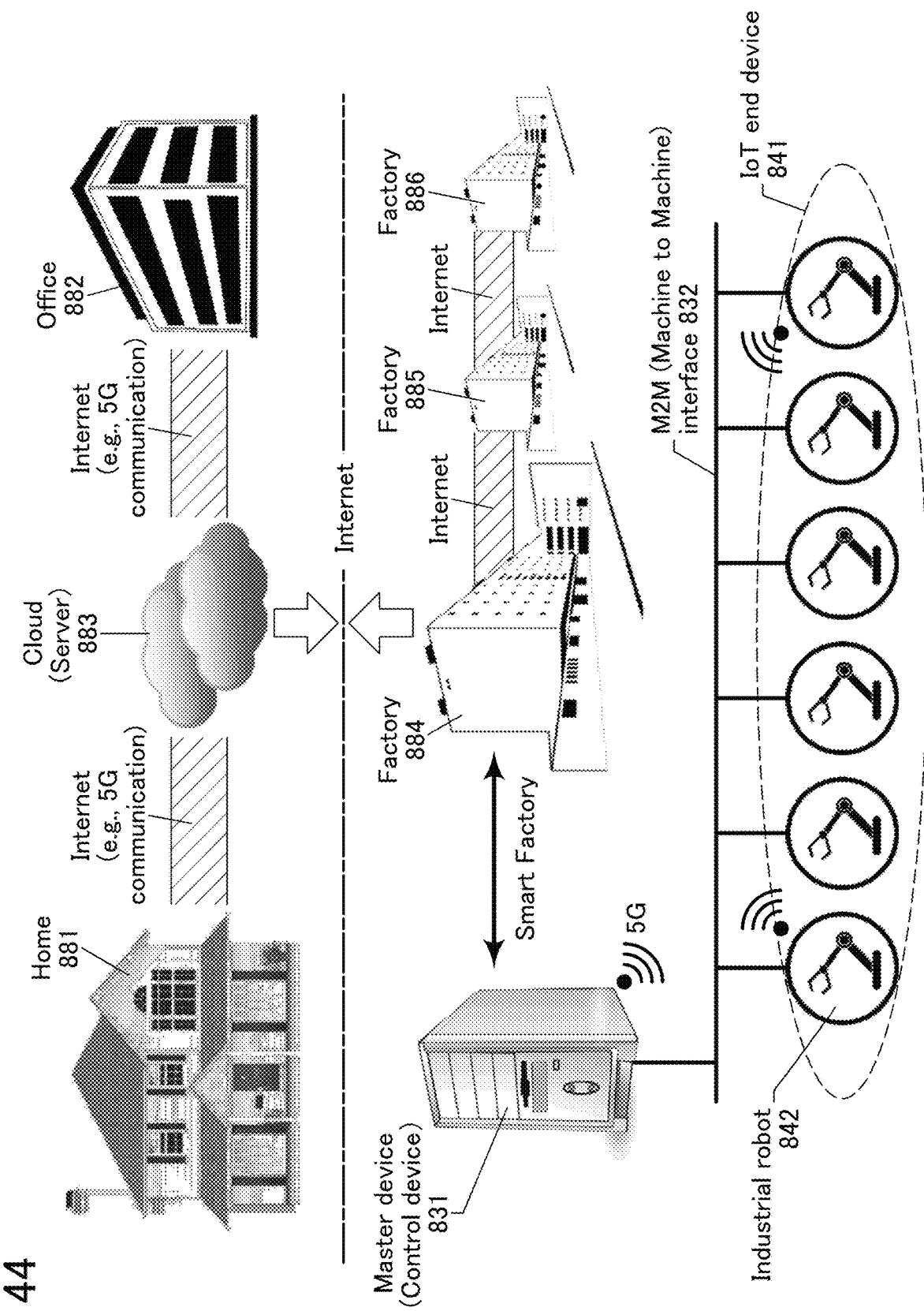
FIG. 44 is a conceptual diagram of factory automation.

FIG. 44 is a conceptual diagram of factory automation as an application example of the endpoint microcomputer. A factory 884 is connected to a cloud (server) 883 through Internet connection (Internet). The cloud 883 is connected to a home 881 and an office 882 through Internet connection. The Internet connection may be wired communication or wireless communication. In the case of wireless communication, for example, wireless communication based on a communication standard such as the fourth-generation mobile communication system (4G) or the fifth-generation mobile communication system (5G) can be performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through a M2M (Machine to Machine) interface 832. As the M2M interface 832, for example, industrial Ethernet ("Ethernet" is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small; thus, the proportion of the power consumption of the CPU tends to be large. For that reason, for a small-scale system such as an endpoint microcomputer, the power reduction effect due to the standby operation by the Noff-CPU is significant. Although the embedded field of IoT sometimes requires quick response, the use of the Noff-CPU allows high-speed return from a standby state.

This embodiment can be implemented in an appropriate combination with the structures described in the other embodiments and the like.

[Example]

The rewrite endurance of a NAND memory string using the OS memory of one embodiment of the present invention was evaluated using device simulation software. This example describes the evaluation results. The rewrite endurance was evaluated using device simulation software TCAD sentaurus produced by Synopsys Inc.

Figure 45A:
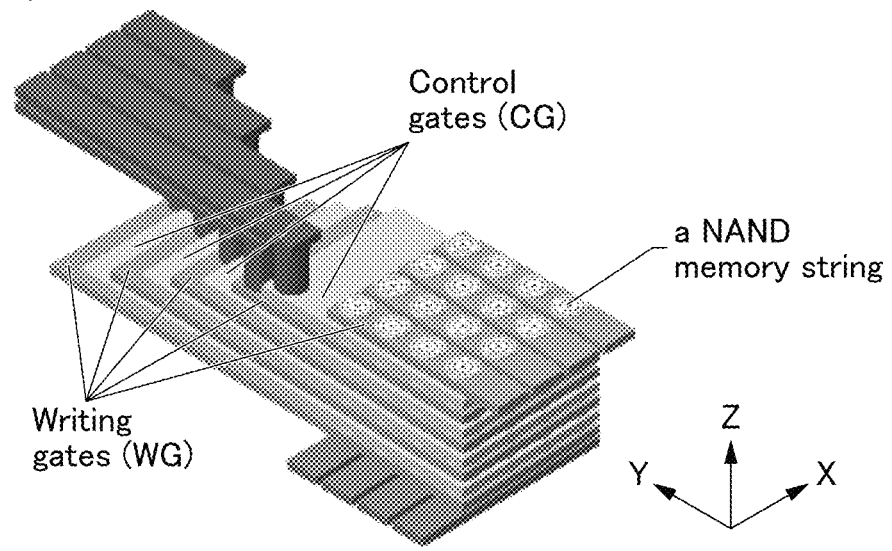
FIG. 45A is a perspective schematic view of a semiconductor device.

FIG. 45A is a schematic perspective view of a semiconductor device including a plurality of NAND memory strings (also referred to as "3D OS NAND strings") using OS memories. The semiconductor device illustrated in FIG. 45A is the 3D OS NAND memory device described in the above embodiment. FIG. 45A illustrates NAND memory strings, control gates CG, writing gates WG, and the like.

Figure 45B:
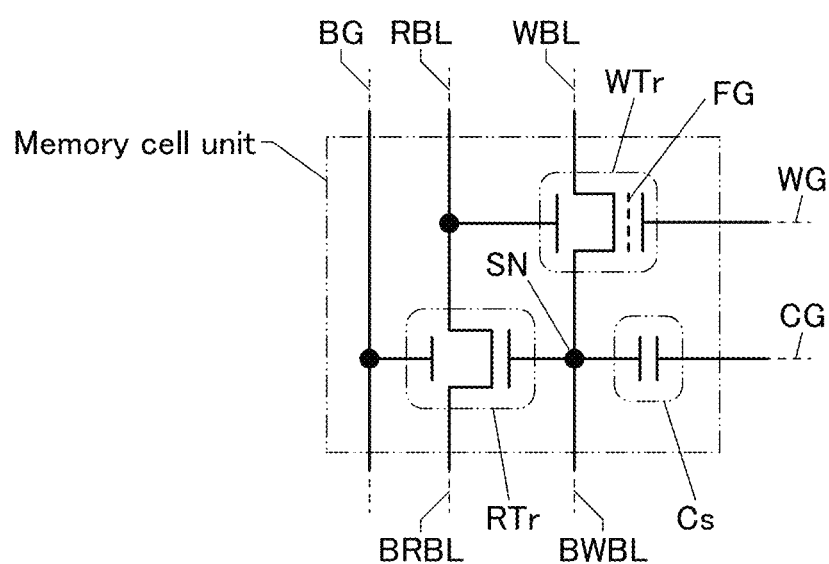
FIG. 45B is an equivalent circuit diagram of a memory cell.

The structure of the memory cells (OS memories) included in the memory strings was assumed to be the structure of the memory cell 100A (see FIG. 12A) described in the above embodiment. FIG. 45B is an equivalent circuit diagram of the memory cell. The memory cell illustrated in FIG. 45B is a 2T-1C memory cell including two transistors (the transistor WTr and the transistor RTr) and one capacitor Cs. Note that FIG. 45B is equivalent to the circuit diagram of FIG. 5A described in the above embodiment.

The transistor WTr and the transistor RTr illustrated in FIG. 45B are OS transistors. In addition, the transistor WTr is a transistor including a floating gate (FG). In this example, the FG was assumed to be formed using polycrystalline silicon containing boron.

The gate of the transistor WTr is electrically connected to the writing gate WG, and one of the source and the drain is electrically connected to the writing bit line WBL. The other of the source and the drain of the transistor WTr is electrically connected to one electrode of the capacitor Cs and the gate of the transistor RTr. A node where the other of the source and the drain of the transistor WTr, the one electrode of the capacitor Cs, and the gate of the transistor RTr are electrically connected to each other functions as a retention node SN. The retention node SN is electrically connected to a wiring BWBL. The other electrode of the capacitor Cs is electrically connected to the control gate CG. One of the source and the drain of the transistor RTr is electrically connected to the reading bit line RBL and the back gate of the transistor WTr. The back gate of the transistor RTr is electrically connected to a back gate line BG. The other of the source and the drain of the transistor RTr is electrically connected to a wiring BRBL.

Figure 46:
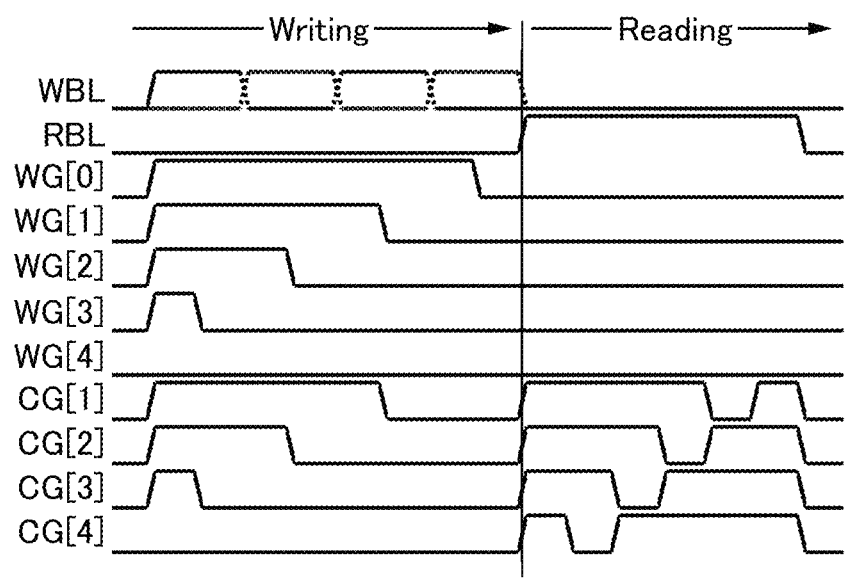
FIG. 46 is a timing chart showing operation of a 3D OS NAND string.

FIG. 46 shows a timing chart for writing and reading operations of the 3D OS NAND string. FIG. 46 shows the case where four memory cells are connected as the 3D OS NAND string. In the writing operation, the potential of the reading bit line RBL is written to all the cells positioned closer to a drain terminal (reading bit line RBL) side than the writing-target memory cell is. Thus, the writing operation needs to be performed sequentially from the cell farther from the reading bit line RBL. Note that the reading operation can be performed in a manner similar to that of the reading operation of a NAND flash memory.

Table 2 shows setting parameters of the oxide semiconductor used in the simulation.

TABLE 2

| | parameter | value | unit |
|---|---|---|---|
| condition band | Electron affinity | 4.6 | eV |
| | Effective DOS | $5 \times 10^{18}$ | $cm^{-3}$ |
| | Band-tail | Not defined. | |
| | Electron mobility | 8 | $cm^2/Vs$ |
| valence band | Band gap | 3 | eV |
| | Effective DOS | $5 \times 10^{18}$ | $cm^{-3}$ |
| | Band-tail | Not defined. | |
| | Hole mobility | 0.01 | $cm^2/Vs$ |
| trap band | — | Not defined. | |
| | Relative permittivity | 15 | |

Table 3 shows the power supply voltage used in writing operation and reading operation (Writing/Reading), and the like in the simulation.

TABLE 3

| Electrode | operation | voltage [V] |
|---|---|---|
| WG[n] | Pre-charge (OTP) | 0-15 |
| CG[n] | Writing/Reading | 0-4 |
| | Writing/Reading | 0-4 |
| WBL | Writing/Reading | 0-4 |
| RBL | Writing/Reading | 0-1.2 |
| BG, BWBL, BRBL | Writing/Reading | 0 |

Although charge injection into the FG is performed only once at 15 V to adjust the threshold voltage of the transistor WTr, the power supply voltage used in the other operations is set to 4 V. That is, power supply voltage as high as that required in a NAND flash memory is not used in the writing operation.

Figure 47A:
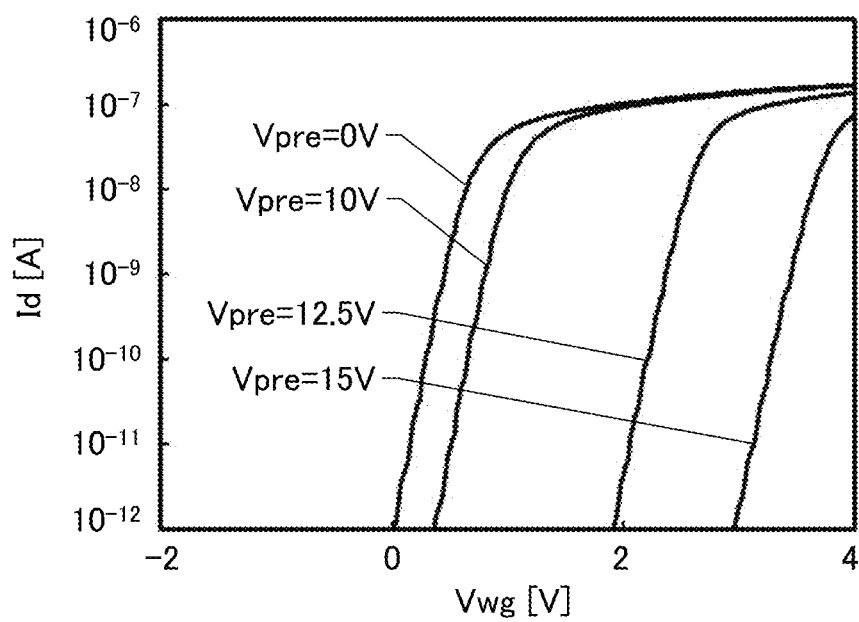
FIG. 47A is a graph showing Id-Vwg characteristics of a transistor WTr.
Figure 47B:
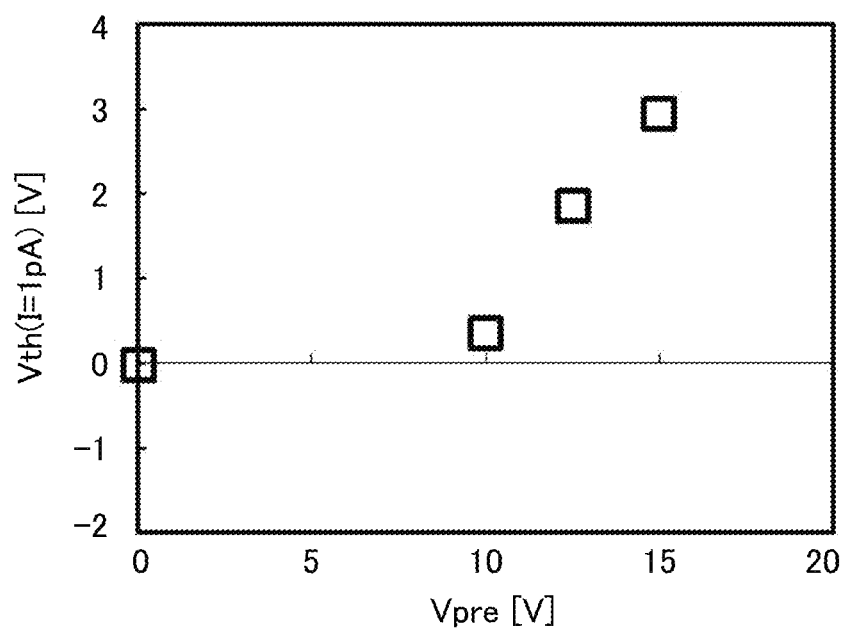
FIG. 47B is a graph showing a relationship between threshold voltage of the transistor WTr and Vpre.

FIG. 47A shows the Id-Vwg characteristics of the transistor WTr. FIG. 47A shows the Id-Vwg characteristics at voltages (Vpre: pre-charge voltage) when charge is injected into the FG of the transistor WTr. FIG. 47B shows a relationship between the threshold voltage (Vth) of the transistor WTr and Vpre. As Vpre increases, Vth shifts in the positive direction more.

Retention characteristics are important in a memory device. The retention characteristics of the 3D OS NAND memory device depend on the values of Vth of the transistor WTr and current (off-state current) flowing between the source and the drain of the transistor WTr when voltage lower than Vth is applied to its gate. An OS transistor is suitable as the transistor WTr because of its extremely low off-state current.

Figure 48A:
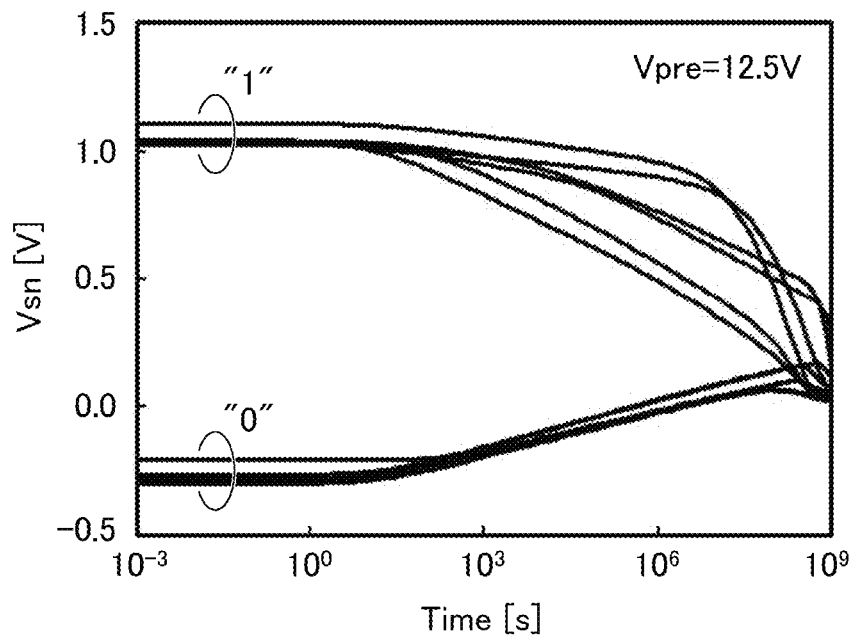
FIG. 48A and FIG. 48B are graphs showing retention characteristics of a 3D OS NAND string.
Figure 48B:
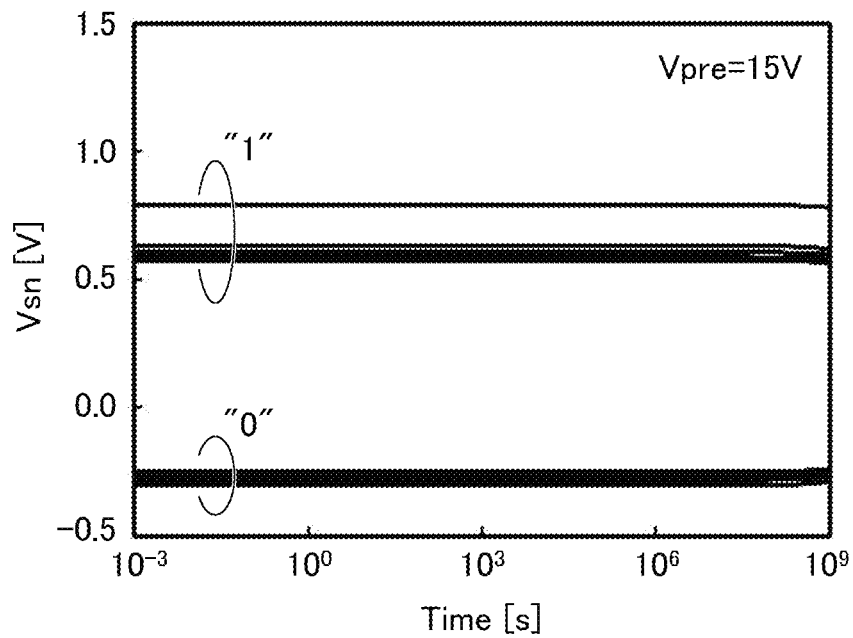

The simulation in this example was performed on the assumption of a 3D OS NAND memory string in which eight memory cells are connected in series. FIG. 48 shows the retention characteristics of the 3D OS NAND memory string. FIG. 48 shows the retention characteristics of the six memory cells except for the two central memory cells of the eight memory cells connected in series. FIG. 48A shows the retention characteristics at Vpre=12.5 V, and FIG. 48B shows the retention characteristics at Vpre=15 V. Note that as data patterns written at the time of the retention characteristics evaluation, two kinds of patterns, a checker pattern ("1" is written to the odd-numbered memory cells and "0" is written to the even-numbered memory cells) and an inverted checker pattern ("0" is written to the odd-numbered memory cells and "1" is written to the even-numbered memory cells), were used.

In each of FIG. 48A and FIG. 48B, the horizontal axis represents elapsed time (Time), and the vertical axis represents the voltage Vsn of the retention node SN. As can be seen from FIG. 48A and FIG. 48B, in order to achieve 10-year ($3.2\times10^8$ s) retention with the device structure used in the simulation, a Vpre of 15 V is needed to cause the Vth of the transistor WTr to be approximately 2 V. The simulation results of the case where Vpre is set to 15 V will be described below in this example.

Figure 49A:
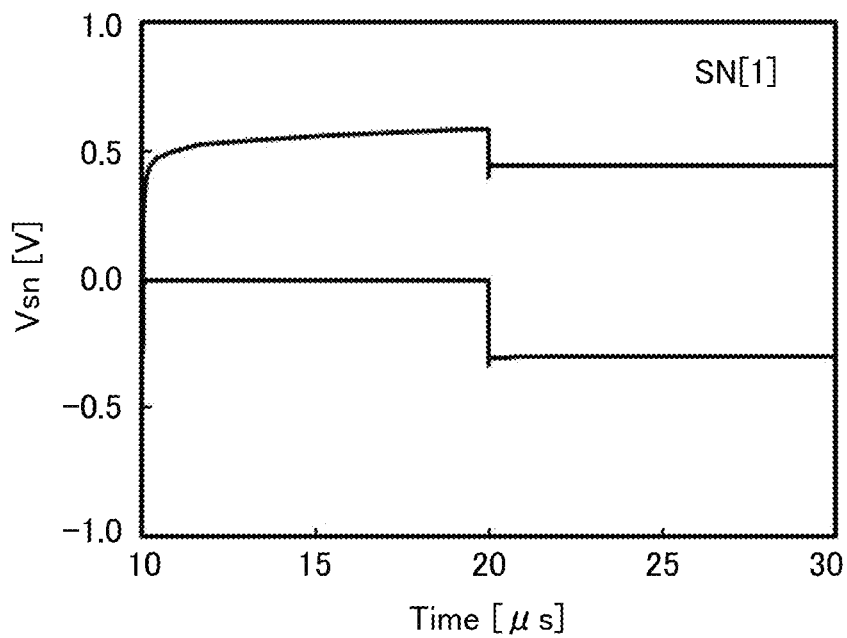
FIG. 49A and FIG. 49B are graphs showing simulation results of retention characteristics of memory cells.
Figure 49B:
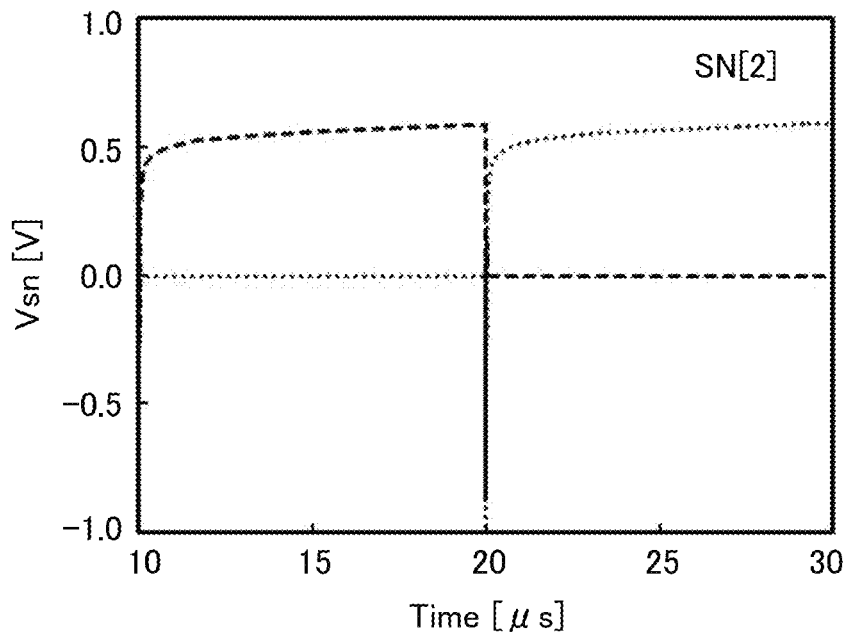

FIG. 49A and FIG. 49B show the simulation results of the retention characteristics of the memory cells in the case where the checker pattern and the inverted checker pattern are alternately written to the memory string. Here, the expression "the checker pattern and the inverted checker pattern are alternately written to the memory string" means repeating the operation in which after a certain period of time elapses since "1" has been written to one memory cell, "0" is written to the same memory cell. In that case, the states of data written to the adjacent memory cells are always different from each other.

In the writing operation, the memory cell farther from the writing bit line WBL probably requires longer time for writing. Thus, examining the retention characteristics of the memory cells close to the wiring BWBL enables the worst case of the retention characteristics to be predicted.

In each of FIG. 49A and FIG. 49B, the horizontal axis represents elapsed time (Time), and the vertical axis represents the voltage Vsn of the retention node SN. FIG. 49A shows the retention characteristics of the retention node SN (retention node SN[1]) of the memory cell closest to the wiring BWBL. FIG. 49B shows the retention characteristics of the retention node SN (retention node SN[2]) of the memory cell second closest to the wiring BWBL.

FIG. 49A and FIG. 49B each show a change in the voltage Vsn of the node SN in the case where "0" is written after 10 μs elapses since "1" has been written and a change in the voltage Vsn of the node SN in the case where "1" is written after 10 μs elapses since "0" has been written. It is found that the potential difference between "1" and "0" in the retention node SN[1] is smaller than that in the retention node SN[2].

Figure 50:
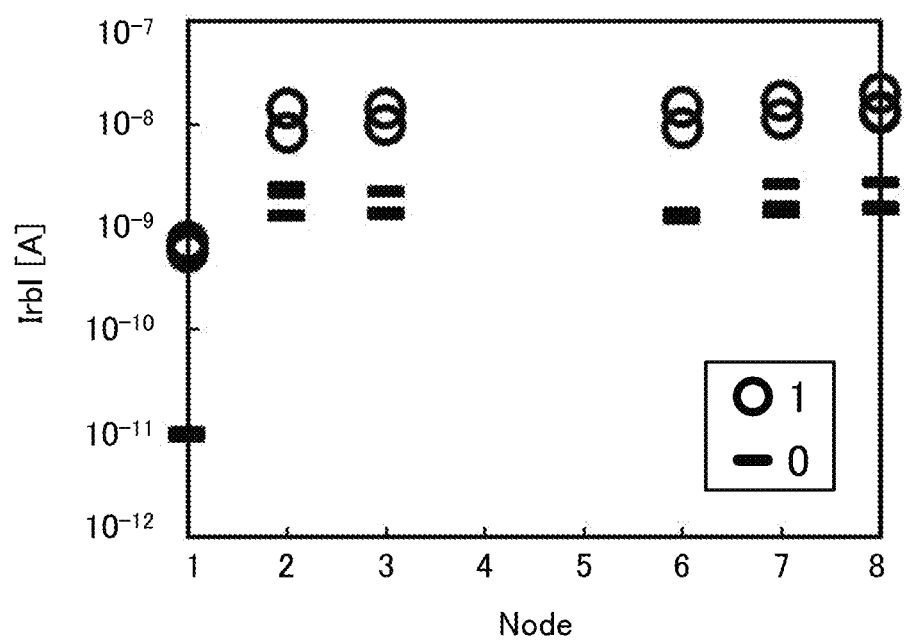
FIG. 50 is a graph showing simulation results of retention data of memory cells and reading current Irb1.

FIG. 50 shows the simulation results of reading current Irb1 (the amount of current flowing through the reading bit line RBL in the reading operation) in the case where "0" is retained in the retention node SN[1] to a retention node SN[8] and the reading current Irb1 in the case where "1" is retained in the retention nodes. Note that the retention node SN[8] is the retention node SN included in the memory cell closest to the writing bit line WBL in this example.

FIG. 50 reveals that substantially the same reading currents Irb1 are obtained in the memory cells including the retention node SN[2] to the retention node SN[8]. Meanwhile, in the memory cell including the retention node SN[1], the difference is found in the reading current Irb1 between "1" and "0", and the value of the reading current Irb1 is an outlier from those in the other memory cells. Thus, the memory cell closest to the wiring BWBL is preferably treated as a dummy cell without being used in the actual operation.

Table 4 compares a general DRAM, a general NAND flash memory, and the 3D OS NAND memory device.

TABLE 4

| Evaluation | DRAM | NAND Flash | 3D OS NAND |
|---|---|---|---|
| Power supply | 3.3 V | 12 V | 4 V |
| Endurance | ∞ | 104 | ∞ |
| Density | low | High | High |
| Retention | 60 ms | 10 years | 10 years |
| Selector/peripheral | Complex | Simple | Simple |

The simulation results demonstrate that the power supply voltage of the 3D OS NAND memory device should be reduced while the 10-year retention characteristics thereof are ensured. In addition, the 3D OS NAND memory device retains data in the retention node through the transistor; thus, its rewrite endurance will be approximately the same as that of a DRAM. As described above, the 3D OS NAND memory device has both the advantage of a NAND flash memory and the advantage of a DRAM. Thus, the 3D OS NAND memory device can be used as a universal memory.

REFERENCE NUMERALS

100: memory cell, 101: insulator, 102: conductor, 103: conductor, 108: central axis, 111: insulator, 112: functional body, 113: insulator, 114: semiconductor, 115: conductor, 116: insulator, 117: semiconductor, 118: insulator, 119: conductor, 120: hollow, 121: insulator, 130: structure body, 131: opening, 132: region, 140: stack, 200: memory string

The invention claimed is:

1. A semiconductor device comprising:
   a structure body extending in a first direction;
   a first conductor extending in a second direction; and
   a second conductor extending in the second direction,
   wherein the structure body comprises:
      a third conductor extending in the first direction;
      a first insulator adjacent to the third conductor;
      a first semiconductor adjacent to the first insulator; and
      a second insulator adjacent to the first semiconductor,
   wherein, in a first intersection portion where the structure body and the first conductor intersect with each other, the structure body comprises:
      a second semiconductor adjacent to the second insulator;
      a third insulator adjacent to the second semiconductor;
      a functional body adjacent to the third insulator; and
      a fourth insulator adjacent to the functional body,
   wherein, in a second intersection portion where the structure body and the second conductor intersect with each other, the structure body comprises:
      a fourth conductor adjacent to the second insulator;
      the second semiconductor adjacent to the fourth conductor; and
      the third insulator adjacent to the second semiconductor,
   wherein the first insulator, the first semiconductor, the second insulator, the second semiconductor, the third insulator, the functional body, and the fourth insulator in the first intersection portion are provided concentrically around the third conductor when seen from the first direction, and
   wherein the first insulator, the first semiconductor, the second insulator, the fourth conductor, the second semiconductor, and the third insulator in the second intersection portion are provided concentrically around the third conductor when seen from the first direction.

2. The semiconductor device according to claim 1, wherein the first direction is orthogonal to the second direction.

3. The semiconductor device according to claim 1, wherein the functional body is an insulator.

4. The semiconductor device according to claim 1, wherein the functional body is a semiconductor.

5. The semiconductor device according to claim 1, wherein the functional body comprises silicon.

6. The semiconductor device according to claim 1, wherein the functional body comprises nitrogen and silicon.

7. The semiconductor device according to claim 1, wherein the first intersection portion functions as a first transistor, and
wherein the second intersection portion functions as a second transistor and a capacitor.

8. The semiconductor device according to claim 7, wherein the first transistor is of a normally-off type.

9. The semiconductor device according to claim 7, wherein the second transistor is of a normally-on type.

10. The semiconductor device according to claim 1, wherein the first semiconductor comprises silicon.

11. The semiconductor device according to claim 1, wherein the second semiconductor comprises an oxide semiconductor.

12. The semiconductor device according to claim 11, wherein the oxide semiconductor comprises at least one of indium and zinc.

13. The semiconductor device according to claim 1, functioning as a NAND memory device.

14. An electronic device comprising:
    the semiconductor device according to claim 1; and
    at least one of an operation switch, a battery, and a display portion.

* * * * *